United States Patent
Duescher et al.

(10) Patent No.: US 9,199,354 B2
(45) Date of Patent: Dec. 1, 2015

(54) FLEXIBLE DIAPHRAGM POST-TYPE FLOATING AND RIGID ABRADING WORKHOLDER

(71) Applicants: Wayne O. Duescher, Roseville, MN (US); Cameron M. Duescher, Maplewood, MN (US)

(72) Inventors: Wayne O. Duescher, Roseville, MN (US); Cameron M. Duescher, Maplewood, MN (US)

( * ) Notice: Subject to any disclaimer, the term of this patent is extended or adjusted under 35 U.S.C. 154(b) by 24 days.

(21) Appl. No.: 14/329,967

(22) Filed: Jul. 13, 2014

(65) Prior Publication Data
US 2015/0024662 A1    Jan. 22, 2015

Related U.S. Application Data

(63) Continuation-in-part of application No. 14/185,882, filed on Feb. 20, 2014, now Pat. No. 9,011,207, and a continuation-in-part of application No. 14/154,133, filed on Jan. 13, 2014, now Pat. No. 9,039,488, which
(Continued)

(51) Int. Cl.
| | |
|---|---|
| B24B 37/30 | (2012.01) |
| B24B 37/04 | (2012.01) |
| B24B 37/10 | (2012.01) |
| H01L 21/304 | (2006.01) |

(52) U.S. Cl.
CPC ............... B24B 37/30 (2013.01); B24B 37/042 (2013.01); B24B 37/10 (2013.01); B24B 37/105 (2013.01); H01L 21/304 (2013.01)

(58) Field of Classification Search
CPC ........ B24B 37/30; B24B 37/32; B24B 49/16; B24B 49/061; B24B 41/061; B24B 7/04; B24B 7/228; B24B 37/042; B24B 37/26; B24B 37/04; B24B 37/24

USPC ............................ 451/285–290, 41, 397–398
See application file for complete search history.

(56) References Cited

U.S. PATENT DOCUMENTS 3,705,751 A * 12/1972 Dee ..................... F16C 32/0625
                                                            384/108
4,593,495 A    6/1986 Kawakami et al.
(Continued)

OTHER PUBLICATIONS

Wayne O. Duescher, Three-point spindle-supported floating abrasive platen, U.S. Appl. No. 12/661,212, filed Mar. 12, 2010. Earliest Publication No. US 20110223835 A1 Earliest Publication Date: Sep. 15, 2011.
(Continued)

*Primary Examiner* — George Nguyen
(74) *Attorney, Agent, or Firm* — Mark A. Litman & Associates P.A.

(57) ABSTRACT

Hard-material, flat-surfaced workpieces such as semiconductor wafers or sapphire disks are quickly attached with vacuum to a rotatable floating workpiece carrier. Fluid pressure in a sealed chamber applies uniform abrading pressure over the full abraded surface of the workpieces. A flexible diaphragm is used to form the sealed chamber and the carrier is rotationally driven by a lug-pin device. The floating carrier is horizontally restrained by a center-post device that provides rigid lateral support against abrading forces. Tilting of the floating carrier is provided by a spherical bearing. The abrading system can be operated at the very high abrading speeds used in high speed flat lapping with raised-island abrasive disks. Vacuum can also be applied to the sealed chamber to quickly move the workpiece away from the abrading surface. A mode of providing rigid parallel-surface abrading of a workpiece can be activated by simply applying vacuum to the sealed chamber.

23 Claims, 11 Drawing Sheets

Related U.S. Application Data is a continuation-in-part of application No. 14/148,729, filed on Jan. 7, 2014, now Pat. No. 8,998,678, which is a continuation-in-part of application No. 13/869,198, filed on Apr. 24, 2013, now Pat. No. 8,998,677, which is a continuation-in-part of application No. 13/662,863, filed on Oct. 29, 2012, now Pat. No. 8,845,394.

(56) References Cited

U.S. PATENT DOCUMENTS

| | | | |
|---|---|---|---|
| 4,653,234 A * | 3/1987 | Lombard | B24B 13/02 |
| | | | 451/390 |
| 4,918,870 A | 4/1990 | Torbert et al. | |
| 5,205,082 A | 4/1993 | Shendon et al. | |
| 5,329,732 A | 7/1994 | Karlsrud et al. | |
| 5,335,453 A | 8/1994 | Baldy et al. | |
| 5,364,655 A | 11/1994 | Nakamura et al. | |
| 5,421,768 A | 6/1995 | Fujiwara et al. | |
| 5,423,716 A | 6/1995 | Strasbaugh | |
| 5,443,416 A | 8/1995 | Volodarsky et al. | |
| 5,449,316 A | 9/1995 | Strasbaugh | |
| 5,569,062 A | 10/1996 | Karlsrud | |
| 5,597,346 A | 1/1997 | Hempel, Jr. | |
| 5,643,053 A | 7/1997 | Shendon | |
| 5,643,067 A | 7/1997 | Katsuoka et al. | |
| 5,651,724 A * | 7/1997 | Kimura | B24B 37/30 |
| | | | 451/285 |
| 5,683,289 A | 11/1997 | Hemple, Jr. | |
| 5,738,574 A | 4/1998 | Tolles et al. | |
| 5,769,697 A | 6/1998 | Nishio | |
| 5,800,254 A | 9/1998 | Motley et al. | |
| 5,874,318 A | 2/1999 | Baker et al. | |
| 5,910,041 A | 6/1999 | Duescher | |
| 5,916,009 A | 6/1999 | Izumi et al. | |
| 5,944,583 A | 8/1999 | Cruz et al. | |
| 5,961,169 A | 10/1999 | Kalenian et al. | |
| 5,964,651 A | 10/1999 | Hose | |
| 5,964,653 A | 10/1999 | Pertlov et al. | |
| 5,967,882 A | 10/1999 | Duescher | |
| 5,975,997 A | 11/1999 | Minami | |
| 5,985,093 A | 11/1999 | Chen | |
| 5,989,104 A | 11/1999 | Kim et al. | |
| 5,993,298 A | 11/1999 | Duescher | |
| 5,993,302 A | 11/1999 | Chen et al. | |
| 6,024,630 A | 2/2000 | Shendon et al. | |
| 6,027,398 A | 2/2000 | Numoto et al. | |
| 6,048,254 A | 4/2000 | Duescher | |
| 6,050,882 A | 4/2000 | Chen | |
| 6,056,632 A | 5/2000 | Mitchel et al. | |
| 6,074,277 A | 6/2000 | Arai | |
| 6,080,050 A | 6/2000 | Chen et al. | |
| 6,089,959 A | 7/2000 | Nagahashi | |
| 6,102,777 A | 8/2000 | Duescher et al. | |
| 6,116,993 A | 9/2000 | Tanaka | |
| 6,120,352 A | 9/2000 | Duescher | |
| 6,126,993 A | 10/2000 | Orcel et al. | |
| 6,132,298 A | 10/2000 | Zuniga et al. | |
| 6,146,259 A | 11/2000 | Zuniga et al. | |
| 6,149,506 A | 11/2000 | Duescher | |
| 6,159,073 A | 12/2000 | Wiswesser et al. | |
| 6,162,116 A | 12/2000 | Zuniga et al. | |
| 6,165,056 A | 12/2000 | Hayashi et al. | |
| 6,168,506 B1 | 1/2001 | McJunken | |
| 6,179,956 B1 | 1/2001 | Nagahara et al. | |
| 6,183,354 B1 | 2/2001 | Zuniga et al. | |
| 6,217,433 B1 | 4/2001 | Herrman et al. | |
| 6,224,472 B1 | 5/2001 | Lai et al. | |
| 6,251,215 B1 | 6/2001 | Zuniga et al. | |
| 6,270,392 B1 | 8/2001 | Hayashi et al. | |
| 6,299,741 B1 | 10/2001 | Sun et al. | |
| 6,361,420 B1 | 3/2002 | Zuniga et al. | |
| 6,371,838 B1 | 4/2002 | Holzapfel | |
| 6,390,901 B1 | 5/2002 | Hiyama et al. | |
| 6,390,905 B1 | 5/2002 | Korovin et al. | |
| 6,394,882 B1 | 5/2002 | Chen | |
| 6,398,906 B1 | 6/2002 | Kobayashi et al. | |
| 6,425,809 B1 | 7/2002 | Ichimura et al. | |
| 6,436,828 B1 | 8/2002 | Chen et al. | |
| 6,439,965 B1 | 8/2002 | Ichino | |
| 6,439,978 B1 | 8/2002 | Jones et al. | |
| 6,443,821 B1 | 9/2002 | Kimura et al. | |
| 6,447,368 B1 | 9/2002 | Fruitman et al. | |
| 6,491,570 B1 | 12/2002 | Sommer et al. | |
| 6,506,105 B1 | 1/2003 | Kajiwara et al. | |
| 6,514,129 B1 * | 2/2003 | Halley | B24B 9/065 |
| | | | 451/270 |
| 6,558,232 B1 | 5/2003 | Kajiwara et al. | |
| 6,585,567 B1 | 7/2003 | Black et al. | |
| 6,592,434 B1 | 7/2003 | Vanell et al. | |
| 6,592,439 B1 | 7/2003 | Li et al. | |
| 6,607,157 B1 | 8/2003 | Duescher | |
| 6,634,924 B1 * | 10/2003 | Ono | B24B 37/0053 |
| | | | 451/287 |
| 6,659,850 B2 | 12/2003 | Korovin et al. | |
| 6,663,466 B2 | 12/2003 | Chen et al. | |
| 6,672,949 B2 | 1/2004 | Chopra et al. | |
| 6,692,339 B1 * | 2/2004 | Halley | B24B 37/042 |
| | | | 451/41 |
| 6,729,944 B2 | 5/2004 | Birang et al. | |
| 6,752,700 B2 | 6/2004 | Duescher | |
| 6,769,969 B1 | 8/2004 | Duescher | |
| 6,837,779 B2 | 1/2005 | Smith et al. | |
| 6,893,332 B2 | 5/2005 | Castor | |
| 6,896,584 B2 | 5/2005 | Perlov et al. | |
| 6,899,603 B2 | 5/2005 | Homma et al. | |
| 6,899,607 B2 | 5/2005 | Brown | |
| 6,899,609 B2 | 5/2005 | Hong | |
| 6,908,366 B2 | 6/2005 | Gagliardi | |
| 6,935,013 B1 | 8/2005 | Markevitch et al. | |
| 7,001,251 B2 | 2/2006 | Doan et al. | |
| 7,001,257 B2 | 2/2006 | Chen et al. | |
| 7,008,295 B2 | 3/2006 | Wiswesser et al. | |
| 7,008,303 B2 | 3/2006 | White et al. | |
| 7,014,535 B2 | 3/2006 | Custer et al. | |
| 7,018,275 B2 | 3/2006 | Zuniga et al. | |
| 7,018,906 B2 | 3/2006 | Chen et al. | |
| 7,029,380 B2 | 4/2006 | Horiguchi et al. | |
| 7,033,251 B2 | 4/2006 | Elledge | |
| 7,044,838 B2 | 5/2006 | Maloney et al. | |
| 7,081,042 B2 | 7/2006 | Chen et al. | |
| 7,086,929 B2 | 8/2006 | Wiswesser et al. | |
| 7,101,272 B2 | 9/2006 | Chen et al. | |
| 7,101,273 B2 | 9/2006 | Tseng et al. | |
| 7,125,313 B2 | 10/2006 | Zelenski et al. | |
| 7,137,874 B1 * | 11/2006 | Bovio | B24B 37/30 |
| | | | 451/285 |
| 7,144,304 B2 | 12/2006 | Moore | |
| 7,147,541 B2 | 12/2006 | Nagayama et al. | |
| 7,166,016 B1 | 1/2007 | Chen | |
| 7,250,368 B2 | 7/2007 | Kida et al. | |
| 7,276,446 B2 | 10/2007 | Robinson et al. | |
| 7,292,427 B1 | 11/2007 | Murdoch et al. | |
| 7,357,699 B2 | 4/2008 | Togawa et al. | |
| 7,367,867 B2 | 5/2008 | Boller | |
| 7,393,790 B2 | 7/2008 | Britt et al. | |
| 7,419,910 B2 | 9/2008 | Minamihaba et al. | |
| 7,422,634 B2 | 9/2008 | Powell et al. | |
| 7,445,543 B2 * | 11/2008 | Torii | B24B 37/345 |
| | | | 451/289 |
| 7,445,847 B2 | 11/2008 | Kulp | |
| 7,446,018 B2 | 11/2008 | Brogan et al. | |
| 7,452,817 B2 | 11/2008 | Yoon et al. | |
| 7,456,106 B2 | 11/2008 | Koyata et al. | |
| 7,456,107 B2 | 11/2008 | Keleher et al. | |
| 7,470,169 B2 | 12/2008 | Taniguchi et al. | |
| 7,485,028 B2 | 2/2009 | Wilkinson et al. | |
| 7,485,241 B2 | 2/2009 | Schroeder et al. | |
| 7,488,235 B2 | 2/2009 | Park et al. | |
| 7,488,236 B2 | 2/2009 | Shimomura et al. | |
| 7,488,240 B2 | 2/2009 | Saito | |
| 7,491,116 B2 | 2/2009 | Sung | |
| 7,491,342 B2 | 2/2009 | Kamiyama et al. | |

(56) References Cited

U.S. PATENT DOCUMENTS

| | | |
|---|---|---|
| 7,507,148 B2 | 3/2009 | Kitahashi et al. |
| 7,510,974 B2 | 3/2009 | Li et al. |
| 7,520,798 B2 | 4/2009 | Muldowney et al. |
| 7,520,800 B2 | 4/2009 | Duescher |
| 7,527,271 B2 | 5/2009 | Oh et al. |
| 7,527,722 B2 | 5/2009 | Sharan |
| 7,553,214 B2 | 6/2009 | Menk et al. |
| 7,568,970 B2 | 8/2009 | Wang |
| 7,572,172 B2 | 8/2009 | Aoyama et al. |
| 7,579,071 B2 | 8/2009 | Huh et al. |
| 7,582,221 B2 | 9/2009 | Netsu et al. |
| 7,601,050 B2 | 10/2009 | Zuniga et al. |
| 7,614,939 B2 | 11/2009 | Tolles et al. |
| 7,618,529 B2 | 11/2009 | Ameen et al. |
| 7,632,434 B2 | 12/2009 | Duescher |
| 7,648,410 B2 | 1/2010 | Choi |
| 7,699,684 B2 | 4/2010 | Prasad |
| 7,708,621 B2 | 5/2010 | Saito |
| 7,731,568 B2 | 6/2010 | Shimomura et al. |
| 7,741,656 B2 | 6/2010 | Nakayama et al. |
| 7,753,761 B2 | 7/2010 | Fujita |
| 7,754,611 B2 | 7/2010 | Chen et al. |
| 7,762,870 B2 | 7/2010 | Ono et al. |
| 7,807,252 B2 | 10/2010 | Hendron et al. |
| 7,822,500 B2 | 10/2010 | Kobayashi et al. |
| 7,833,907 B2 | 11/2010 | Anderson et al. |
| 7,837,800 B2 | 11/2010 | Fukasawa et al. |
| 7,838,482 B2 | 11/2010 | Fukasawa et al. |
| 7,840,305 B2 | 11/2010 | Behr et al. |
| 7,883,397 B2 | 2/2011 | Zuniga et al. |
| 7,884,020 B2 | 2/2011 | Hirabayashi et al. |
| 7,897,250 B2 | 3/2011 | Iwase et al. |
| 7,922,783 B2 | 4/2011 | Sakurai et al. |
| 7,947,190 B2 | 5/2011 | Brown |
| 7,950,985 B2 | 5/2011 | Zuniga et al. |
| 7,955,964 B2 | 6/2011 | Wu et al. |
| 7,972,396 B2 | 7/2011 | Feng et al. |
| 8,002,860 B2 | 8/2011 | Koyama et al. |
| 8,021,215 B2 | 9/2011 | Zuniga et al. |
| 8,025,813 B2 | 9/2011 | Liu et al. |
| 8,029,640 B2 | 10/2011 | Zuniga et al. |
| 8,043,140 B2 | 10/2011 | Fujita |
| 8,047,899 B2 | 11/2011 | Chen et al. |
| 8,062,096 B2 | 11/2011 | Brusic et al. |
| 8,062,098 B2 | 11/2011 | Duescher |
| 8,066,551 B2 | 11/2011 | Chen et al. |
| 8,070,909 B2 | 12/2011 | Shanmugasundram et al. |
| 8,071,479 B2 | 12/2011 | Liu |
| 8,088,299 B2 | 1/2012 | Chen et al. |
| 8,101,060 B2 | 1/2012 | Lee |
| 8,101,093 B2 | 1/2012 | De Rege Thesauro et al. |
| 8,256,091 B2 | 9/2012 | Duescher |
| 8,545,583 B2 | 10/2013 | Duescher |
| 9,011,207 B2 * | 4/2015 | Duescher ............. B24B 37/042 451/285 |
| 2005/0107015 A1 * | 5/2005 | Togawa ................. B24B 37/30 451/285 |
| 2005/0118939 A1 | 6/2005 | Duescher |
| 2008/0299875 A1 | 12/2008 | Duescher |
| 2010/0003904 A1 | 1/2010 | Duescher |
| 2010/0190417 A1 * | 7/2010 | Watanabe ............. B24B 53/017 451/56 |
| 2011/0223835 A1 | 9/2011 | Duescher |
| 2011/0223836 A1 | 9/2011 | Duescher |
| 2011/0223838 A1 | 9/2011 | Duescher |
| 2013/0324012 A1 * | 12/2013 | Fukushima ........... B24B 37/005 451/1 |
| 2014/0120806 A1 | 5/2014 | Duescher |
| 2014/0127976 A1 | 5/2014 | Duescher |

OTHER PUBLICATIONS

Wayne O. Duescher, Three-point fixed-spindle floating-platen abrasive system, U.S. Appl. No. 12/799,841, filed May 3, 2010. Earliest Publication No. US 20110223836 A1 Earliest Publication Date: Sep. 15, 2011.

Wayne O. Duescher, Fixed-spindle and floating-platen abrasive system using spherical mounts, U.S. Appl. No. 12/807,802, filed Sep. 14, 2010. Earliest Publication No. US 20110223838 A1 Earliest Publication Date: Sep. 15, 2011.

* cited by examiner

FLEXIBLE DIAPHRAGM POST-TYPE FLOATING AND RIGID ABRADING WORKHOLDER

CROSS REFERENCE TO RELATED APPLICATIONS

This invention is a continuation-in-part of U.S. patent application Ser. No. 14/185,882 filed Feb. 20, 2014 that is a continuation-in-part of U.S. patent application Ser. No. 14/154,133 filed Jan. 13, 2014 that is a continuation-in-part of U.S. patent application Ser. No. 14/148,729 filed Jan. 7, 2014 that is a continuation-in-part of U.S. patent application Ser. No. 13/869,198 filed Apr. 24, 2013 that is a continuation-in-part of U.S. patent application Ser. No. 13/662,863 filed Oct. 29, 2012. These are each incorporated herein by reference in their entirety.

BACKGROUND OF THE INVENTION

Field of the Invention

The present invention relates to the field of abrasive treatment of surfaces such as grinding, polishing and lapping. In particular, the present invention relates to a high speed abrasive lapping or polishing workholder system for use with rotary, abrasive-coated flat-surfaced platens. The abrasive technology provides flat-surfaced and smooth-polished surfaces for semiconductor wafers and for other hard-material workpieces such as rotary seals. The lapping and polishing production speeds of this system are many times faster than with conventional lapping systems.

The workpieces are attached to a free-floating carrier that allows one surface of the workpiece to be in conformal abrading contact with a moving flat-surfaced abrasive. To provide uniform material removal across the full surface of the workpiece, the carrier is rotated in the same direction as the platen at the same desired high rotation speeds as the platen. Often these rotating platens and workholder carriers have abrading speeds of over 10,000 surface feet per minute (SFPM). Here, a 12 inch diameter abrasive coated platen, and a workpiece carrier, can operate at 3,000 rpm to obtain these desired high abrading speeds. Diamond abrasive particles are often used as they provide unexcelled material removal rates at these high abrading speeds.

The carrier device is a combination-type workpiece carrier head abrading system that can be used in two different abrading modes. In the first mode of operation, the rotating workpiece carrier that is attached to a rotating spindle "floats" the workpiece as it is held in controlled abrading-pressure contact with the moving abrasive. In the second mode of operation, the rotating workpiece carrier is attached rigidly to the rotating workpiece spindle. Here, the whole rotatable workpiece spindle assembly is lowered until the rigidly attached workpiece is in "non-floating" rigid abrading contact with the flat rotating platen moving abrasive surface. This rigid abrading system can be used to create parallel opposed surfaces of a workpiece by simply abrading one workpiece surface, flipping the workpiece over and abrading the second opposed workpiece surface.

High speed flat lapping is typically performed using flexible abrasive disks that have an annular band of abrasive-coated raised islands. These raised-island disks are attached to flat-surfaced platens that rotate at high abrading speeds. Coolant water is applied to the abrading surface to remove heat generated by the abrading action, and also, to remove abrading debris. The use of the raised island disks prevent hydroplaning of the lapped workpieces when they are lapped at high speeds with the presence of coolant water. Hydroplaning causes the workpieces to tilt which results in non-flat lapped workpiece surfaces. Excess water is routed from contact with the workpiece flat surfaces into the recessed passageways that surround the abrasive coated raised island structures. The coolant water also continuously flushes the abrading debris from the top abrasive surface of the raised-island into the recessed channels.

Also, by using wafers that extend out slightly over both the inner and outer annular edges of the fixed abrasive, the abrasive is worn down uniformly across the annular-band surface of the raised islands. Uniform wear of the abrasive coated raised islands across the radial width of the annular band of abrasive continually provides a precision-flat abrasive surface that contacts the abraded surface of the wafers. If desired, a conditioning tool can periodically be used to refine the flat surface of the raised island abrasive.

To operate successfully at high abrading speeds, the flexible abrasive disks are conformally attached to the flat surfaces of precision-flat rotary platens. Also, the abrasive disks must be precisely uniform in thickness across their full annular abrading surface to provide full utilization of all the abrasive and to provide smooth abrading contact with the workpiece. Abrasive disks having circumferential thickness variations will provide undesirable "bumpy" abrasive contact with a wafer when the disks are rotated at high speeds. The flexible disks are quickly attached to the platens with the use of vacuum. A range of sizes of abrasive particles are typically used to optimize an abrading operation. Diamond particles, having a size of 30 microns encapsulated in ceramic beads that are coated on the top surfaces of the raised islands are used for coarse abrading. An abrasive disk having medium sized diamond particles of 10 or 3 microns is then used. The final polish is then done by sub-micron sized diamond particles.

In many applications it is necessary or critical that the opposed surfaces of an abraded or polished workpiece are precisely parallel. For example, it is necessary for semiconductor wafers to have parallel surfaces to enable focusing of photolithographic light beams uniformly across the full exposed surface of the wafer as the backside of the wafer is attached to a precision-flat platen surface. Likewise, it is very desirable that flattened and polished hardened steel or hard ceramic rotary seals have parallel opposed surfaces to allow the seals to be rotated at high speeds.

To provide abraded workpiece surfaces that are parallel, the workpiece rotating spindle axis is aligned to be precisely perpendicular to the rotating flat abrasive surface. When the workpiece spindle is rotated while the workpiece is abraded, the flatness of the abraded workpiece is directly related to the accuracy of the precision perpendicular alignment of the workpiece spindle to the abrasive disk rotational platen surface. To create this precision perpendicular alignment, the abrading machine can be configured with a workpiece spindle having a long axial length with wide-spaced spindle shaft bearings that provides structural stiffness to resist abrading forces that are imposed on the workpiece results in minimal deflection of the spindle device.

A second aspect of providing the precision perpendicular alignment of the spindle axis to the platen surface is to mount a precision-flat abrasive disk platen on a spherical-action platen mounting device. This spherical-action mount can be rotated until the platen surface is precisely perpendicular to the workpiece spindle axis. The spherical-action mount device is then locked in this established alignment position.

Conventional wafer-polishing workholders are typically very limited to slow speeds and can not attain the high rotational speeds that are required for high speed lapping and polishing. Even very thin and ultra-hard disks such as sapphire can be easily abraded and polished at very high production rates with this high speed abrading system especially when using diamond abrasives. Extremely hard tungsten carbide (used as cutting tool bits for machine tools) can be "cut like butter" using diamond abrasives at high speeds>

The slide-pin arm-driven workholders having flexible annular diaphragm devices provide that a wide range of uniform abrading pressures can be applied across the full abraded surfaces of the workpieces such as semiconductor wafers. These slide-pin devices also allow the workholder carrier device to have a spherical-action rotation which provides flat-surfaced contact of workpieces that are attached to the workholder device with a flat-surfaced abrasive coating on a rotating abrading platen. Also, one or more of the workholders can be used simultaneously with a rotary abrading platen.

Flat lapping of workpiece surfaces used to produce precision-flat and mirror smooth polished surfaces is required for many high-value parts such as semiconductor wafers and rotary seals. The accuracy of the lapping or abrading process is constantly increased as the workpiece performance, or process requirements, become more demanding. Required workpiece feature tolerances for flatness accuracy, the amount of material removed, the part thickness and the smoothness of the polish become more progressively more difficult to achieve with existing abrading machines and abrading processes. In addition, it is necessary to reduce the processing costs without sacrificing performance.

The chemical mechanical planarization (CMP) liquid-slurry abrading system has been the system-of-choice for polishing newly-deposited surface-layers on semiconductor wafers that are already exceedingly flat. During CMP polishing, a very small amount of material is removed from the surface of the wafer. Typically the amount of material removed by polishing is measured in angstroms where the overall global flatness of the wafer is not affected much. It is critical that the global flatness of the wafer surface is maintained in a precision-flat condition to allow new patterned layers of metals and insulating oxides to be deposited on the wafer surfaces with the use of photolithography techniques. Global flatness is a measure of the flatness across the full surface of the wafer. Site or localized flatness of a wafer refers to the flatness of a localized portion of the wafer surface where the photolithography deposition patterns are made.

The semiconductor industry has used wafer carrier heads having flexible polymer membranes for many years to polish the semiconductor-side surface of wafers after the deposition of layers of materials that form new semiconductor devices and electrical conductors. These membrane-type carrier heads are mostly used with flexible CMP pads that are saturated with a liquid abrasive slurry. However, the same type of membrane carrier head is also used to polish wafers with fixed-abrasive-island types of web-sheets of abrasive. The CMP pads are resilient and the carrier head thrusts the wafers down into the surface-depths of the rotating pads as the wafers are rotated. The fixed-abrasive web-sheets are quite rigid and they are supported by a stationary polymer platen which is also quite rigid so the wafers "ride" on the surface of the fixed-abrasive. Both the resilient CMP pads and the rigid fixed-abrasive sheets provide acceptable polishing of the semiconductor wafers.

Deformation of the CMP pads allows the pads to provide somewhat uniform abrading pressures across the full inner diameter of the wafer. However, distortion of the CMP pads occurs at the periphery of the wafer as the rotating pad moves against the stationary-positioned but rotating wafer. This wafer-edge pad distortion causes excessive wafer deposition material removal at the outer annular portion of the wafer. As a result, the polished wafer is not precisely flat across the full surface of the wafer. In order to compensate for the uneven material removal across the surface of the wafer due to the wafer-periphery CMP pad distortion, multiple annular abrading pressure chambers are used with these membrane-type wafer carrier heads.

The abrading pressure is independently controlled in each annular membrane chamber to attempt uniform material removal at different annular portions of the wafer. However, these independent pressure chambers are at fixed locations within the carrier head where each pressure zone is adjacent to another zone. Here, the abrading rate of each annular pressure fixed-position zone is completely different than that in a directly adjacent zone as the pressure in each zone is different. From an abrading standpoint here, there is no logical reason that the non-uniform abrading of a wafer by a CMP pad has step variations that occur exactly at the annular demarcation lines that exist at the locations of the independent flexible membrane pressure zones. Rather, it is expected that the material removal rate will have a smooth (non-step) variation radially across the surface of the rotating wafer. The use of more independent annular pressure chambers improves the performance somewhat.

When flexible membranes having one or more independent abrading pressure chambers are used where wafers are attached by suction-bonding the wafers to the bottom nominally-flat membrane surface, rigid wafer-retaining rings are commonly used with these carrier heads. The flexible membrane has little stiffness in a lateral direction along the surface of the wafer so the stiff circular wafer disk is forced against the rigid wafer-retaining rings that surround the wafer perimeter. As the wafer rotates, the substantial abrading forces imposed on the wafer abraded surface urges the wafer edge to be in rolling contact with the outer retaining ring. The relatively thin silicon wafers are brittle and fragile so damage to the wafer can easily occur as the wafer if polished. Slow rotational speeds of the wafer are required with this operation because of the continual lateral movement of the elastomer membrane and the attached wafer. If the retainer rings are not used, the wafer would not be contained within the confines of the wafer carrier head.

It is well known that the rate of material removal at localized portions of the wafer are directly proportional to both the abrading speed and the abrading pressure that exist at these localized portions. For CMP polishing, a resilient CMP pad is attached to a rotatable platen and the wafer is attached to a rotatable carrier. The wafer carrier and the pad can be rotated in the same direction at the same rotation speeds to provide a uniform localized abrading speed over the full surface of the wafer. Often the rotational speed of the wafer is half, or less, than the rotational speed of the CMP pad which can be well below the optimal speed of the wafer. However, it is quite difficult to provide a uniform localized abrading pressure over the full surface of the wafer because of the distortions of the resilient pad when the wafer is thrust down into the surface-depths of the moving pad. Because these localized abrading pressures are not uniform, the material removal rates from the surface of the wafer are not uniform.

Wear patterns on the surface of the CMP pad itself can be a cause of non-uniform material removal on wafers. Because of the travel path of the wafer relative to the larger-sized CMP pad, the inner annular portion of the pad can become more worn than the inner and outer annular portions of the pad. This non-level pad surface results in non-uniform surface shapes of the wafer. Also, when a pad is used for some time, the pad tends to accumulate abrading debris and worn abrasive particles, often in the central annular region of the pad. This contaminated central area of the pad can result in above-average aggressive material removal of portions of the wafer surface. Wafers tend to have "domed" or "dished" central portions, depending on the conditions of the pad and the relative rotational speeds of both the pad and the wafer. CMP pads are typically continuously "dressed" with sharp-edged diamond tools to break-up the debris caused hardened surfaces of the pad. More surface debris is generated by these pad dressing tools.

Liquid abrasive slurry is continually supplied to the surface of the pads but there is little movement of the spent slurry, containing dull abrasive particles, pad particles and wafer debris from the surface of the large flat pads to a region off the surface of the pads. The wafers are in constant abrading contact with this debris. CMP pads are changed as their effective use life is quite limited.

The individual fibers of a resilient CMP pad are considered to protrude upward from the nominal surface of the pad where the free ends of these individual fibers are in abrading contact with the surface of a polished wafer. When a high-spot of a rotating wafer contacts the protruding ends of these fibers, the pad fiber free ends are pushed down by this high spot as it moves past the individual fibers. Due to the nature of the construction of the resilient pads and also due to the liquid abrasive slurry that coats the pads, it takes some time for the "pushed-down" individual fibers to recover their full original protruded heights after the wafer moving high spot has passed. This motion-damping effect of the pad body and its protruding fiber ends is enhanced by the presence of the liquid slurry. Here, the low-spot areas of the rotating wafer that directly follow the high-spot areas are not contacted effectively with the depressed fiber ends that do not have enough time to "spring-back" to their original protruded heights. The result is less amounts of material are removed from the deposition layer on the low-spot areas of the wafer than was preferentially removed from the high-spot areas of the wafer.

The whole object of removing a uniform depth of the deposited semiconductor material across the full surface of the wafer can not be achieved unless the wafer is rotated slow enough that the damped individual fiber ends of the CMP pads have time to "spring back" enough to provide uniform abrading pressures. By comparison, when a fixed-abrasive raised-island, rigid-thickness abrasive disk is used for abrading at high speeds, there is no abrasive surface "spring-back" issue because the abrasive surface is rigid.

Another cause of non-uniform material removal from a wafer surface is the deformation of the wafer into a free-standing non-flat condition by the high temperature furnace processing of the wafers. Uneven heating of the wafer by radiation typically causes the outer periphery of the wafer to heat up more rapidly than the inner central portion of the wafer. This uneven temperature causes thermal stresses in the wafer which distort the wafer. Non-uniform heating of the wafer can cause saddle-shaped wafers. Non-uniform cooling of the wafer can cause cone-shaped wafers. Each wafer has different semiconductor die patterns, different semiconductor materials and different thermal processing which results in different amounts of deformation and different patterns of deformation for individual wafers. These wafer non-flat deformations are present prior to the individual wafers being abrasively polished.

For the use of the stationary-position fixed abrasive web-sheets, the membrane type carrier head rotates at same time it pivots on an eccentric crank-shaft swing-arm to provide uniform localized abrading speeds across the full surface of the wafer. The flexibility of the carrier head membrane can provide near-uniform abrading pressure at the localized areas of the wafer during the polishing action. The rigid-thickness raised-island abrasive web does not provide a precision-flat abrasive surface as it is supported by a large flat platen surface made of a polymer that is not precisely flat. Also, the wafer is swept in a path that tends to leave a worn recessed annular central area having raised abrasive walls that are encountered by the wafer as the abrasive web is periodically incremented forward. These raised annular walls primarily contact the outer periphery of the wafers which results in a non-uniform polishing of the wafer surface.

Wafers range in size from 4 to 12 inches (300 mm) diameter, are typically 0.027 inches (680 microns) thick and have unpolished deposited semiconductor coatings that are about 2 microns (about 0.1 thousands of an inch) thick. These deposited coatings are then abraded and polished to have a resultant thickness of approximately 0.8 microns (about 0.03 thousands of an inch) where the variation of the polished coating deposition layer is only about 0.02 microns. This very small variation is about 1 millionth of an inch or about 0.1 light-bands. A 12 inch diameter wafer that is only 0.027 inches thick is nominally quite flexible perpendicular to its planar surface even though it is made from silicon, which is quite stiff. These wafers have this substantial thickness to allow them to be repetitively handled during the multiple manufacturing steps required to produce the individual semiconductor chips. After the wafer has been completed, the back side of the wafer is ground off to produce a very thin wafer that is scribed and cut into individual chips. Also, the circular wafers need to be relatively thick because their outer periphery edges contact a rigid retainer ring to contain the wafer in a carrier head when large lateral abrading friction forces are applied to the wafer surface in a polishing operation as the flexible membranes can not provide this support.

When a wafer is loosely attached to a carrier head by pressing the wafer into intimate contact with the flexible nominally-flat membrane, the wafer becomes attached to the membrane by "suction" forces. Here, neither the wafer or the flexible membrane assumes a flat-surfaced shape. The relatively thin wafer tends to flex with the flexed membrane to create controlled localized abrading forces as pressure is applied to the carrier pressure chamber that is part of the membrane. The nominally non-flat but thin wafers are pressed into a relatively more-flat condition against the abrasive slurry CMP pad (or fixed-abrasive web sheet) by the carrier head flexible membrane which has an abrading pressure applied to it by the internal pressure chamber. Because the flexible wafer is held in pressurized contact with the abrasive CPM pad (or abrasive island web) by the flexible membrane, material is removed quite uniformly across most of the abraded surface of the wafer, completely independent of reference to the back side of the wafer.

However, when a photolithographic device is used to create a material deposition pattern on a semiconductor device, the wafer is backside-mounted on a precision-flat platen with vacuum. Thus, the critical focusing of the photolithographic device across the full selected pattern area on the front side of a wafer is indirectly referenced to the back side of the wafer. The whole localized patterned area of the wafer being exposed to the light source is laterally positioned under the photolithographic device by a stepper device that moves the platen-attached wafer horizontally in two independent and perpendicular directions. Even though the stepper platen can be rotated spherically, it is important that the front polished surface of the wafer is precisely flat relative to the flat backside surface of the wafer to minimize the localized spherical adjustment of the wafer as the different selected areas of the wafer are sequentially exposed.

Free-standing wafers are often non-flat as they assume curled shapes when not attached to a flat surface. When a wafer is conformally attached to a flat rigid platen, the exposed surface of the wafer assumes the shape of the platen if the two opposed surfaces of the wafer are perfectly parallel to each other. If a platen is not precisely flat, the exposed surface of the wafer will not be precisely flat. For a rigid abrading system, any variation in the flatness of the abraded surface of the wafer that exceeds the desired uniformity of 0.02 microns can prevent uniform material removal on a wafer surface.

It is difficult to construct a lapping or polishing machine that has a rigid carrier attached to a rotating spindle where the spindle axis is maintained in precisely perpendicular alignment with a precision-flat surfaced rotating abrasive coated platen. Here, it is critical this alignment exists to provide precision-flat workpieces and wafers. However, the lack of precision perpendicular alignment of a rigid wafer carrier head spindle axis with the top surface of a platen abrasive can be overcome by floating the carrier head where the wafer abraded surface assumes conformal contact with the platen abrasive surface.

This invention references commonly assigned U.S. Pat. Nos. 5,910,041; 5,967,882; 5,993,298; 6,048,254; 6,102,777; 6,120,352; 6,149,506; 6,607,157; 6,752,700; 6,769,969; 7,632,434; 7,520,800; 8,062,098; 8,256,091; 8,328,600; and 8,545,583; 8,647,171; 8,647,172 and U.S. patent application Ser. Nos. 12/661,212; 12/799,841; 13/665,759; 13/869,198; 14/148,729 and 14/154,133 and all contents of which are incorporated herein by reference.

U.S. Pat. No. 7,614,939 (Tolles et al) describes a CMP polishing machine that uses flexible pads where a conditioner device is used to maintain the abrading characteristic of the pad. Multiple CMP pad stations are used where each station has different sized abrasive particles. U.S. Pat. No. 4,593,495 (Kawakami et al) describes an abrading apparatus that uses planetary workholders. U.S. Pat. No. 4,918,870 (Torbert et al) describes a CMP wafer polishing apparatus where wafers are attached to wafer carriers using vacuum, wax and surface tension using wafer. U.S. Pat. No. 5,205,082 (Shendon et al) describes a CMP wafer polishing apparatus that uses a floating retainer ring. U.S. Pat. No. 6,506,105 (Kajiwara et al) describes a CMP wafer polishing apparatus that uses a CMP with a separate retaining ring and wafer pressure control to minimize over-polishing of wafer peripheral edges. U.S. Pat. No. 6,371,838 (Holzapfel) describes a CMP wafer polishing apparatus that has multiple wafer heads and pad conditioners where the wafers contact a pad attached to a rotating platen. U.S. Pat. No. 6,398,906 (Kobayashi et al) describes a wafer transfer and wafer polishing apparatus. U.S. Pat. No. 7,357,699 (Togawa et al) describes a wafer holding and polishing apparatus and where excessive rounding and polishing of the peripheral edge of wafers occurs. U.S. Pat. No. 7,276,446 (Robinson et al) describes a web-type fixed-abrasive CMP wafer polishing apparatus.

U.S. Pat. No. 6,425,809 (Ichimura et al) describes a semiconductor wafer polishing machine where a polishing pad is attached to a rigid rotary platen. The polishing pad is in abrading contact with flat-surfaced wafer-type workpieces that are attached to rotary workpiece holders. These workpiece holders have a spherical-action universal joint. The universal joint allows the workpieces to conform to the surface of the platen-mounted abrasive polishing pad as the platen rotates. However, the spherical-action device is the workpiece holder and is not the rotary platen that holds the fixed abrasive disk.

U.S. Pat. No. 6,769,969 (Duescher) describes flexible abrasive disks that have annular bands of abrasive coated raised islands. These disks use fixed-abrasive particles for high speed flat lapping as compared with other lapping systems that use loose-abrasive liquid slurries. The flexible raised island abrasive disks are attached to the surface of a rotary platen to abrasively lap the surfaces of workpieces.

U.S. Pat. No. 8,062,098 (Duescher) describes the use of a spherical-action workpiece carrier that has an off-set center of rotation that coincides with the abraded surface of the workpiece. This device prevents tilting of the workpiece caused by abrading forces that are applied on the workpiece abraded surface. A spherical bearing is incorporated in the carrier to provide this spherical action motion as the workpiece is rotated by the carrier.

U.S. Pat. No. 8,328,600 (Duescher) describes the use of spherical-action mounts for air bearing and conventional flat-surfaced abrasive-covered spindles used for abrading where the spindle flat surface can be easily aligned to be perpendicular to another device. Here, in the present invention, this type of air bearing and conventional flat-surfaced abrasive-covered spindles can be used where the spindle flat abrasive surface can be easily aligned to be perpendicular with the rotational axis of a floating bellows-type workholder device.

Various abrading machines and abrading processes are described in U.S. Pat. No. 5,364,655 (Nakamura et al). U.S. Pat. No. 5,569,062 (Karlsrud), U.S. Pat. No. 5,643,067 (Katsuoka et al), U.S. Pat. No. 5,769,697 (Nisho), U.S. Pat. No. 5,800,254 (Motley et al), U.S. Pat. No. 5,916,009 (Izumi et al), U.S. Pat. No. 5,964,651 (Hose), U.S. Pat. No. 5,975,997 (Minami, U.S. Pat. No. 5,989,104 (Kim et al), U.S. Pat. No. 6,089,959 (Nagahashi, U.S. Pat. No. 6,165,056 (Hayashi et al), U.S. Pat. No. 6,168,506 (McJunken), U.S. Pat. No. 6,217,433 (Herrman et al), U.S. Pat. No. 6,439,965 (Ichino), U.S. Pat. No. 6,893,332 (Castor), U.S. Pat. No. 6,896,584 (Perlov et al), U.S. Pat. No. 6,899,603 (Homma et al), U.S. Pat. No. 6,935,013 (Markevitch et al), U.S. Pat. No. 7,001,251 (Doan et al), U.S. Pat. No. 7,008,303 (White et al), U.S. Pat. No. 7,014,535 (Custer et al), U.S. Pat. No. 7,029,380 (Horiguchi et al), U.S. Pat. No. 7,033,251 (Elledge), U.S. Pat. No. 7,044,838 (Maloney et al), U.S. Pat. No. 7,125,313 (Zelenski et al), U.S. Pat. No. 7,144,304 (Moore), U.S. Pat. No. 7,147,541 (Nagayama et al), U.S. Pat. No. 7,166,016 (Chen), U.S. Pat. No. 7,250,368 (Kida et al), U.S. Pat. No. 7,367,867 (Boller), U.S. Pat. No. 7,393,790 (Britt et al), U.S. Pat. No. 7,422,634 (Powell et al), U.S. Pat. No. 7,446,018 (Brogan et al), U.S. Pat. No. 7,456,106 (Koyata et al), U.S. Pat. No. 7,470,169 (Taniguchi et al), U.S. Pat. No. 7,491,342 (Kamiyama et al), U.S. Pat. No. 7,507,148 (Kitahashi et al), U.S. Pat. No. 7,527,722 (Sharan) and U.S. Pat. No. 7,582,221 (Netsu et al).

Also, various CMP machines, resilient pads, materials and processes are described in U.S. Pat. No. 8,101,093 (de Rege Thesauro et al.), U.S. Pat. No. 8,101,060 (Lee), U.S. Pat. No. 8,071,479 (Liu), U.S. Pat. No. 8,062,096 (Brusic et al.), U.S. Pat. No. 8,047,899 (Chen et al.), U.S. Pat. No. 8,043,140 (Fujita), U.S. Pat. No. 8,025,813 (Liu et al.), U.S. Pat. No. 8,002,860 (Koyama et al.), U.S. Pat. No. 7,972,396 (Feng et al.), U.S. Pat. No. 7,955,964 (Wu et al.), U.S. Pat. No. 7,922,783 (Sakurai et al.), U.S. Pat. No. 7,897,250 (Iwase et al.), U.S. Pat. No. 7,884,020 (Hirabayashi et al.), U.S. Pat. No. 7,840,305 (Behr et al.), U.S. Pat. No. 7,838,482 (Fukasawa et al.), U.S. Pat. No. 7,837,800 (Fukasawa et al.), U.S. Pat. No.

7,833,907 (Anderson et al.), U.S. Pat. No. 7,822,500 (Kobayashi et al.), U.S. Pat. No. 7,807,252 (Hendron et al.), U.S. Pat. No. 7,762,870 (Ono et al.), U.S. Pat. No. 7,754,611 (Chen et al.), U.S. Pat. No. 7,753,761 (Fujita), U.S. Pat. No. 7,741,656 (Nakayama et al.), U.S. Pat. No. 7,731,568 (Shimomura et al.), U.S. Pat. No. 7,708,621 (Saito), U.S. Pat. No. 7,699,684 (Prasad), U.S. Pat. No. 7,648,410 (Choi), U.S. Pat. No. 7,618,529 (Ameen et al.), U.S. Pat. No. 7,579,071 (Huh et al.), U.S. Pat. No. 7,572,172 (Aoyama et al.), U.S. Pat. No. 7,568,970 (Wang), U.S. Pat. No. 7,553,214 (Menk et al.), U.S. Pat. No. 7,520,798 (Muldowney), U.S. Pat. No. 7,510,974 (Li et al.), U.S. Pat. No. 7,491,116 (Sung), U.S. Pat. No. 7,488,236 (Shimomura et al.), U.S. Pat. No. 7,488,240 (Saito), U.S. Pat. No. 7,488,235 (Park et al.), U.S. Pat. No. 7,485,241 (Schroeder et al.), U.S. Pat. No. 7,485,028 (Wilkinson et al), U.S. Pat. No. 7,456,107 (Keleher et al.), U.S. Pat. No. 7,452,817 (Yoon et al.), U.S. Pat. No. 7,445,847 (Kulp), U.S. Pat. No. 7,419,910 (Minamihaba et al.), U.S. Pat. No. 7,018,906 (Chen et al.), U.S. Pat. No. 6,899,609 (Hong), U.S. Pat. No. 6,729,944 (Birang et al.), U.S. Pat. No. 6,672,949 (Chopra et al.), U.S. Pat. No. 6,585,567 (Black et al.), U.S. Pat. No. 6,270,392 (Hayashi et al.), U.S. Pat. No. 6,165,056 (Hayashi et al.), U.S. Pat. No. 6,116,993 (Tanaka), U.S. Pat. No. 6,074,277 (Arai), U.S. Pat. No. 6,027,398 (Numoto et al.), U.S. Pat. No. 5,985,093 (Chen), U.S. Pat. No. 5,944,583 (Cruz et al.), U.S. Pat. No. 5,874,318 (Baker et al.), U.S. Pat. No. 5,683,289 (Hempel Jr.), U.S. Pat. No. 5,643,053 (Shendon), U.S. Pat. No. 5,597,346 (Hempel Jr.).

Other wafer carrier heads are described in U.S. Pat. No. 5,421,768 (Fujiwara et al.), U.S. Pat. No. 5,443,416 (Volodarsky et al.), U.S. Pat. No. 5,738,574 (Tolles et al.), U.S. Pat. No. 5,993,302 (Chen et al.), U.S. Pat. No. 6,050,882 (Chen), U.S. Pat. No. 6,056,632 (Mitchel et al.), U.S. Pat. No. 6,080,050 (Chen et al.), U.S. Pat. No. 6,126,116 (Zuniga et al.), U.S. Pat. No. 6,132,298 (Zuniga et al.), U.S. Pat. No. 6,146,259 (Zuniga et al.), U.S. Pat. No. 6,179,956 (Nagahara et al.), U.S. Pat. No. 6,183,354 (Zuniga et al.), U.S. Pat. No. 6,251,215 (Zuniga et al.), U.S. Pat. No. 6,299,741 (Sun et al.), U.S. Pat. No. 6,361,420 (Zuniga et al.), U.S. Pat. No. 6,390,901 (Hiyama et al.), U.S. Pat. No. 6,390,905 (Korovin et al.), U.S. Pat. No. 6,394,882 (Chen), U.S. Pat. No. 6,436,828 (Chen et al.), U.S. Pat. No. 6,443,821 (Kimura et al.), U.S. Pat. No. 6,447,368 (Fruitman et al.), U.S. Pat. No. 6,491,570 (Sommer et al.), U.S. Pat. No. 6,506,105 (Kajiwara et al.), U.S. Pat. No. 6,558,232 (Kajiwara et al.), U.S. Pat. No. 6,592,434 (Vanell et al.), U.S. Pat. No. 6,659,850 (Korovin et al.), U.S. Pat. No. 6,837,779 (Smith et al.), U.S. Pat. No. 6,899,607 (Brown), U.S. Pat. No. 7,001,257 (Chen et al.), U.S. Pat. No. 7,081,042 (Chen et al.), U.S. Pat. No. 7,101,273 (Tseng et al.), U.S. Pat. No. 7,292,427 (Murdock et al.), U.S. Pat. No. 7,527,271 (Oh et al.), U.S. Pat. No. 7,601,050 (Zuniga et al.), U.S. Pat. No. 7,883,397 (Zuniga et al.), U.S. Pat. No. 7,947,190 (Brown), U.S. Pat. No. 7,950,985 (Zuniga et al.), U.S. Pat. No. 8,021,215 (Zuniga et al.), U.S. Pat. No. 8,029,640 (Zuniga et al.), and U.S. Pat. No. 8,088,299 (Chen et al.).

A number of other carrier heads are described in the following patents: U.S. Pat. No. 5,329,732 (Karlsrud et al), U.S. Pat. No. 5,449,316 (Strasbaugh), U.S. Pat. No. 5,423,716 (Strasbaugh), U.S. Pat. No. 5,335,453 (Baldy et al.), U.S. Pat. No. 5,964,653 (Perlov et al.), U.S. Pat. No. 5,961,169 (Kalenian et al.), U.S. Pat. No. 6,024,630 (Shendon et al.), U.S. Pat. No. 6,159,073 (Wiswesser et al.), U.S. Pat. No. 6,162,116 (Zuniga et al.), U.S. Pat. No. 6,224,472 (Lai et al.), U.S. Pat. No. 6,439,978 (Jones et al.), U.S. Pat. No. 6,663,466 (Chen et al.), U.S. Pat. No. 6,592,439 (Li et al.), U.S. Pat. No. 6,908,366 (Gagliardi), U.S. Pat. No. 7,008,295 (Wiswesser et al.), U.S. Pat. No. 7,018,275 (Zuniga et al.), U.S. Pat. No. 7,086,929 (Wiswesser), U.S. Pat. No. 7,101,272 (Chen et al.), U.S. Pat. No. 7,527,271 (Oh et al.), U.S. Pat. No. 8,021,215 (Zuniga et al.), U.S. Pat. No. 8,066,551 (Chen et al.), U.S. Pat. No. 8,070,909 (Shanmugasundram et al).

SUMMARY OF THE INVENTION

The present invention uses precision-thickness fixed-abrasive flexible disks having disk thickness variations of less than 0.0001 inches (3 microns) across the full annular bands of abrasive-coated raised islands to allow flat-surfaced contact with workpieces at very high abrading speeds. Use of a rotary platen vacuum flexible abrasive disk attachment system allows quick set-up changes where different sizes of abrasive particles and different types of abrasive material can be quickly attached to the flat platen surfaces.

Semiconductor wafers require extremely flat surfaces when using photolithography to deposit patterns of materials to form circuits across the full flat surface of a wafer. When theses wafers are abrasively polished between deposition steps, the surfaces of the wafers must remain precisely flat.

Water coolant is used with these raised island abrasive disks, which allows them to be used at very high abrading speeds, often in excess of 10,000 surface feet per minute (SFPM). The same types of chemicals that are used in the conventional CMP pad polishing of wafers can also be used with this fixed-abrasive lapping or polishing system to enhance material removal rates. These liquid chemicals can be applied as a mixture with the coolant water that is used to cool both the wafers and the fixed abrasive coatings on the rotating abrading platen This mixture of coolant water and chemicals continually washes the abrading debris away from the abrading surfaces of the fixed-abrasive coated raised islands which prevents unwanted abrading contact of the abrasive debris with the abraded surfaces of the wafers.

Slurry lapping with CMP pads is often done at very slow abrading speeds of about 5 mph (8 kph). By comparison, the high speed flat lapping system often operates at or above 100 mph (160 kph). This is a speed difference ratio of 20 to 1. Increasing abrading speeds increase the material removal rates. Because the abrading speeds are so high, very low abrading pressures are used. These low abrading pressures reduce the amount of subsurface damage of expensive workpieces such as semiconductor wafers. High abrading speeds result in high workpiece production rates and large cost savings.

Workpieces are often rotated at rotational speeds that are approximately equal to the rotational speeds of the platens to provide equally-localized abrading speeds across the full radial width of the platen annular abrasive when the workpiece spindles are rotated in the same rotation direction as the platens. Here, a 12 inch (300 mm) diameter abrasive disk platen and workholder can have rotational speeds of 3,000 rpm. To effectively use raised island abrasive disks at these very high abrading speeds, the disks must be precisely uniform in thickness and the rotating platen that the flexible disk is attached to must have a precision-flat surface.

The present invention provides spherical-action types of workholders that are used to provide flat-surfaced contact of workpieces with flexible flat-surfaced, raised-island, fixed-abrasive disks that are attached with vacuum to a precision-flat platen that rotates at very high speeds. An off-set spherical-action workholder can also be used where the abrading friction forces that are applied to the workpieces by the moving abrasive does not tend to tilt the workpieces that are attached to the offset workholders. Tilting can cause non-flat abraded workpiece surfaces. The workholders have a slideable center post that allows the workpiece carrier to move in a vertical direction toward and away from the workpiece abraded surface.

Slide-pin driven workholders having a flexible annular diaphragm and internal abrading pressure chambers provide that a wide range of uniform abrading pressures can be applied across the full abraded surfaces of the workpieces such as semiconductor wafers. These slide-pin devices are used with a spherical-action device which provides flat-surfaced contact of workpieces or wafers with a flat-surfaced abrasive coating on a rotating abrading platen. One or more of the workholders can be used simultaneously with a rotary abrading platen.

The abrading machine can be quickly switched between "floating" and "rigid" abrading modes by simply applying vacuum to a sealed chamber located inside the body of the workpiece carrier head. This vacuum forces the rotary workpiece carrier into rigid contact with rigid components within the workpiece carrier head. When portions of the rigid workpiece carrier are held in forced contact with the rigid components of the workpiece carrier head by the applied vacuum, the workpiece-attachment surface of the workpiece carrier is positioned to be precisely aligned perpendicular with the workpiece spindle rotation axis. Because the workpiece is rigidly attached to the rigid workpiece carrier attachment surface, the exposed surface of the workpiece can be abraded precisely parallel to the workpiece carrier workpiece attachment surface by the rotating platen moving abrasive when the abrading head is moved vertically downward.

Workpieces that have one surface abraded flat by the rigid workpiece carrier can be flipped over and the second (opposed) surface of the workpiece can also be abraded to provide that both opposed surfaces of the workpiece are precisely flat, have smoothly polished surfaces and both opposed surfaces are precisely parallel to each other. When it is desired to convert the workpiece carrier from the "rigid" mode of abrading operation to the "floating" mode of abrading operation, the applied vacuum is discontinued and the floating workpiece carrier is no longer held in rigid contact with the rotatable workpiece spindle.

With one embodiment of the present invention, the uniform removal of a thin layer from a wafer surface can be reliably achieved by attaching the wafer to a resilient pad with a low-tack adhesive. This resilient pad and the attached wafer can then be attached to a rigid or semi-rigid wafer carrier with vacuum. The nominally flexible wafer will be supported by the resilient pad where the full surface of the wafer will be pressed by the wafer carrier, with controlled uniform abrading pressure, onto the surface of the precision-flat raised-island abrasive surface. Because the abrading pressure is uniform across the full surface of the wafer due to the resiliency of the wafer attachment pad, material is uniformly removed from the wafer surface during the abrading process. Here, a wafer that is flexible in a direction normal to the wafer flat surfaces but is rigid in a direct along the wafer flat surfaces, is in uniform-pressure abrading contact with a rigid abrasive surface. The configuration of the workpiece carrier head of the present invention eliminates the non-uniform abrading pressure that occurs with the use of a CMP abrasive-slurry resilient polishing pad. After the wafer is polished, the resilient pad can be peeled from the surface of the wafer With another embodiment of the present invention, the wafer can also be attached to a carrier that has a multi-layer flexible bottom where the wafer is attached to this flexible bottom with vacuum. The flexible bottom is restrained radially at its outer periphery to a rigid annular ring. The vacuum-attached wafer is integrally attached to the flexible bottom that is restrained at its periphery and no rolling contact is made by the rigid and fragile silicon wafer outer periphery with a radial restraining device. The flexibility of the wafer and the flexible carrier bottom allows applied fluid pressure to exert a controlled abrading pressure across the surface of the wafer to provide uniform material from the full surface of the wafer. The flexible carrier bottom can be constructed from elastomeric materials or from composite laminations of polymer, metal and fiber-impregnated cloth materials.

The vacuum that is used to attach the wafer to the workpiece carrier and the fluid that is used to create a pressure in the sealed carrier head pressure chambers is supplied by tubes or fluid passageways that are connected to a rotary union that has stationary fluid ports and rotating fluid ports. Air or liquid fluids or vacuum is routed to these fluid ports to supply them to the internal components of the workpiece carrier head. The vacuum tube portions that are connected to the tilting workpiece carrier are flexible which allows the carrier to be tilted. Sliding tube-joint devices and flexible tubing can be used that allow the floating spherical-action workpiece carrier head to be moved vertically against vertical up and down stops and against spherical-rotation limit stop devices.

In another embodiment of the present invention, the amount of material that is removed from the surface of the wafer can be accurately measured during the abrading or polishing operation by optical or laser measuring devices. These optical devices project beams of light through the thickness of the optically-clear flexible polyester abrasive disk backing in the recessed areas between the individual raised abrasive coated islands. In this way, the amount of material removed from the wafer can be measured and controlled very accurately during the abrading process with this material-thickness measurement system.

DETAILED DESCRIPTION OF THE INVENTION

Figure 1:
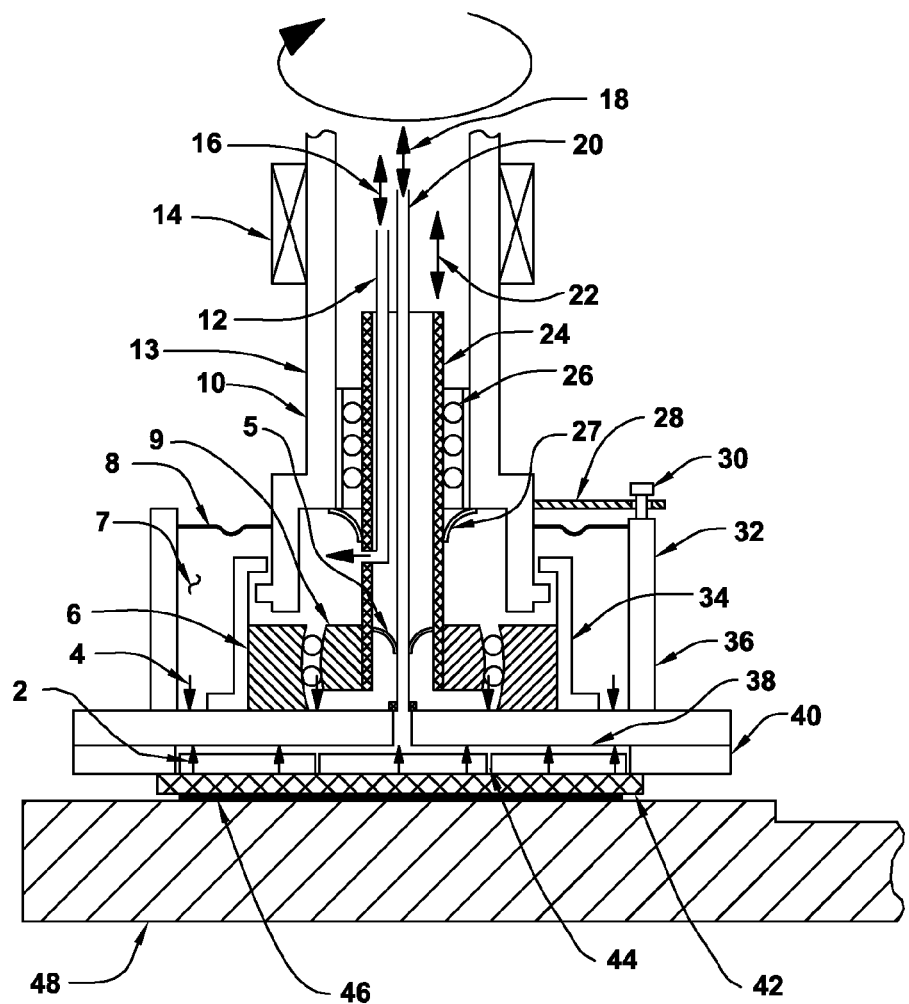
FIG. 1 is a cross section view of a floating workpiece carrier rotation abrading device.

FIG. 1 is a cross section view of a floating workpiece carrier rotation abrading device having a pin-driven flexible diaphragm workpiece carrier which is used for lapping or polishing semiconductor wafers or other workpiece substrates. A stationary workpiece carrier head 13 has a flat-surfaced workpiece 42 that is attached by vacuum to a floating workpiece carrier rotor 40 that is rotationally driven by a drive-pin device 30. A vertical hollow drive shaft 24 is supported by liner-motion bearings 26 that are supported by a stationary-positioned rotatable carrier housing 10 where the rotatable carrier housing 10 is held stationary in a vertical position by bearings 14.

A nominally-rigid rotational drive arm 28 is attached to the hollow drive shaft 24 where rotation of the hollow drive shaft 24 rotates the rotational drive arm 28. The drive-pin device 30 is attached a rigid annular member 32 that is attached to the workpiece carrier rotor 40 which allows the rotational drive arm 28 and the drive-pin device 30 to rotationally drive the workpiece carrier rotor 40. The rigid annular member 32 also can be used as a sealed annular wall 36 that is used to form a sealed pressure or vacuum chamber 7. The workpiece carrier rotor 40 has an attached spherical bearing 9 which allows the workpiece carrier rotor 40 to be tilted while the stationary-positioned carrier housing 10 rotates.

An annular flexible diaphragm device 8 that is attached to the carrier housing 10 is also attached to the rigid annular member 32 where the flexible diaphragm device 8 flexes both horizontally and vertically. The annular flexible diaphragm device 8 can have non-planar surface curvatures that extend radially and circumferentially to increase the flexibility of the annular flexible diaphragm device 8 radially and horizontally. Here, the flexible diaphragm device 8 allows the workpiece carrier rotor 40 to be translated vertically by moving the hollow drive shaft 24 vertically relative to the rotatable carrier housing 10. The flexible diaphragm device 8 also allows the workpiece carrier rotor 40 to be tilted relative to the rotatable carrier housing 10. To provide more vertical and radial flexibility to the flexible diaphragm device 8, the flexible diaphragm device 8 can have an annular non-flat pleated-type surface.

The workpiece carrier rotor 40 can be moved vertically and tilted relative to the carrier housing 10 where the spherical bearing 9 allows the workpiece carrier rotor 40 to be tilted and the spherical bearing 9 restrains the workpiece carrier rotor 40 radially. Because the carrier rotor 40 nominally rotates with the carrier housing 10, as controlled by the drive-pin device 30, the spherical bearing 9 nominally does not rotate about a vertical axis but does provide spherical-action rotation of the carrier housing 10.

The workpiece carrier rotor 40 can be tilted due to numerous causes including: flat-surfaced workpiece 42 that have non-parallel opposed surfaces; misalignment of components of the stationary workpiece carrier head 13; misalignment of other components of the abrading machine (not shown); and a platen 48 that has an abrading surface 46 that is not flat.

Pressurized air or other fluid such as water or vacuum 16 is supplied through a hollow tube 12 which is located within the carrier housing 10 where one end of the hollow tube 12 is fluid-coupled with a fluid rotary union (not shown). The pressurized air 16 in the hollow tube 12 is coupled with a sealed chamber 7 that is formed by the sealed annular flexible diaphragm device 8. This controlled pressure of the fluid 16 is present in the sealed chamber 7 to provide uniform abrading pressure 4 across the top surface of the carrier rotor 40 where the uniform abrading pressure 4 pressure is directly transmitted to the workpiece 42 abraded surface that is in abrading contact with the flat-surfaced abrasive 46 coating on the rotary platen 48.

When the sealed chamber 7 is pressurized by a fluid 16, the carrier rotor 40 can move vertically downward in a direction 22 to bring the workpiece 42 into abrading contact with the flat-surfaced abrasive 46 coating on the rotary platen 48. Likewise, when vacuum is applied to the sealed chamber 7, the carrier rotor 40 can be moved vertically upward in a direction 22 by the vacuum to move the workpiece 42 from abrading contact with the flat-surfaced abrasive 46 coating on the rotary platen 48.

Workpieces such as wafers 42 are attached with vacuum 2 that is applied to the workpiece surfaces through vacuum port holes 44 that have a common vacuum passageway 38 in the carrier rotor 40 which is fluid-connected with a vacuum source 18 that is routed to the vacuum passageway 38 by a flexible hollow tube 20. The flexible hollow tube 20 flexes near the attachment point to the carrier rotor 40 as the carrier rotor 40 is tilted. The workpiece 42 is firmly attached to the carrier rotor 40 by the large attachment pressure created by the vacuum 2. The flexible hollow tube 20 is fluid-coupled with the fluid rotary union. Air pressure can also be supplied through the rotary union in the same passageways 44 to provide pressurized separation of the adhesion-attached workpiece 42 from the workpiece carrier rotor 40 upon completion of the abrading action on the workpiece 42.

When the flat-surfaced workpieces 42 and the workpiece carrier rotor 40 are subjected to horizontal abrading friction forces that are parallel to the abraded surface of the workpieces 42, the workpieces remain firmly attached in-place on the workpiece carrier rotor 40. These abrading friction forces are resisted by the workpiece carrier rotor 40 as it is held radially in place by the spherical bearing 9 which is held radially by the hollow drive shaft 24 which is supported by the rotatable carrier housing 10.

An annular seal device 27 prevents leakage of pressurized air from the sealed chamber 7 along the linear bearing 26 in the annular area between the hollow drive shaft 24 and the carrier housing 10. Another annular seal device 5 prevents leakage of pressurized air from the sealed chamber 7 in the annular area between the inner diameter of the hollow drive shaft 24 and the flexible hollow tube 20.

The rigid rotation drive arm member 28 is attached to at least one individual drive-pin device 30 that is in sliding contact with the drive arm member 28 where the at least one individual drive-pin device 30 and the radial arm 28 are used to rotate the carrier rotor 40. The vertical and horizontal sliding action between the sliding-contact drive-pin device 30 and the radial arm 28 provide motion of the workpiece carrier rotor 40 in a vertical direction along the hollow drive shaft 24 rotation axis as changes in the air or fluid 16 pressure (or vacuum) 4 present in the sealed chamber 7 causes vertical motion of the workpiece rotor 40. An annular bracket 34 is used to limit the vertical excursion distances of the workpiece rotor 40.

The stationary workpiece carrier head 13 can be quickly switched between "floating" and "rigid" abrading modes by simply applying vacuum to the sealed chamber 7 that is located inside the body of the workpiece carrier head 13 instead of the pressure 16 that applies an abrading force 4. This vacuum forces the rotary workpiece carrier 40 into rigid contact with the rigid carrier housing 10 by the bearing race of the spherical bearing 6 contacting the rigid carrier housing 10.

Here, the workpiece-attachment surface of the workpiece carrier 40 is positioned to be precisely aligned perpendicular with the workpiece spindle (not shown) rotation axis. Because the workpiece is rigidly attached to the rigid workpiece carrier 40 attachment surface, the exposed abraded surface of the workpiece 42 can be abraded precisely parallel to the workpiece carrier 40 workpiece attachment surface by the rotating platen 48 moving abrasive 46 when the abrading head 13 is moved vertically downward.

Figure 2:
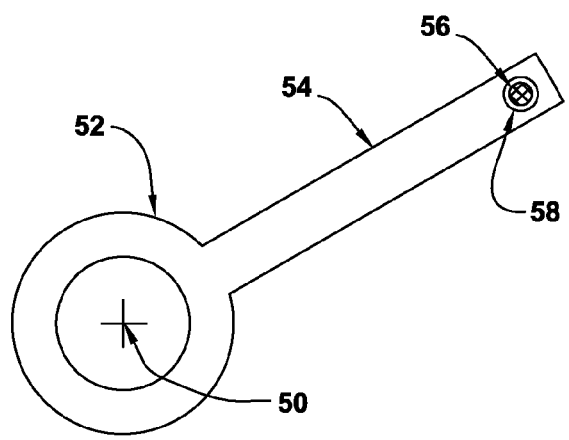
FIG. 2 is a top view of a sliding-pin drive arm for rotating a workpiece carrier head.

FIG. 2 is a top view of a sliding-pin drive arm for rotating a workpiece carrier head. A nominally-rigid rotational pin bracket 52 configuration shown here has an extended arm 54 that has a distal end that is in sliding contact with a drive pin 56 where the arm 54 has a pin access hole 58. The pin bracket 52 is rotated about the pin bracket 52 rotation axis 50 to transmit the drive torque force loads from the pin bracket 52 to the drive pins 56 that are required to rotate the workpiece carrier rotor (not shown) during abrading operations. Other configurations of the pin bracket 52 include brackets that have hub shapes rather than arms 54 where single or multiple pins 56 can be contacted by at least one pin bracket 52.

Figure 3:
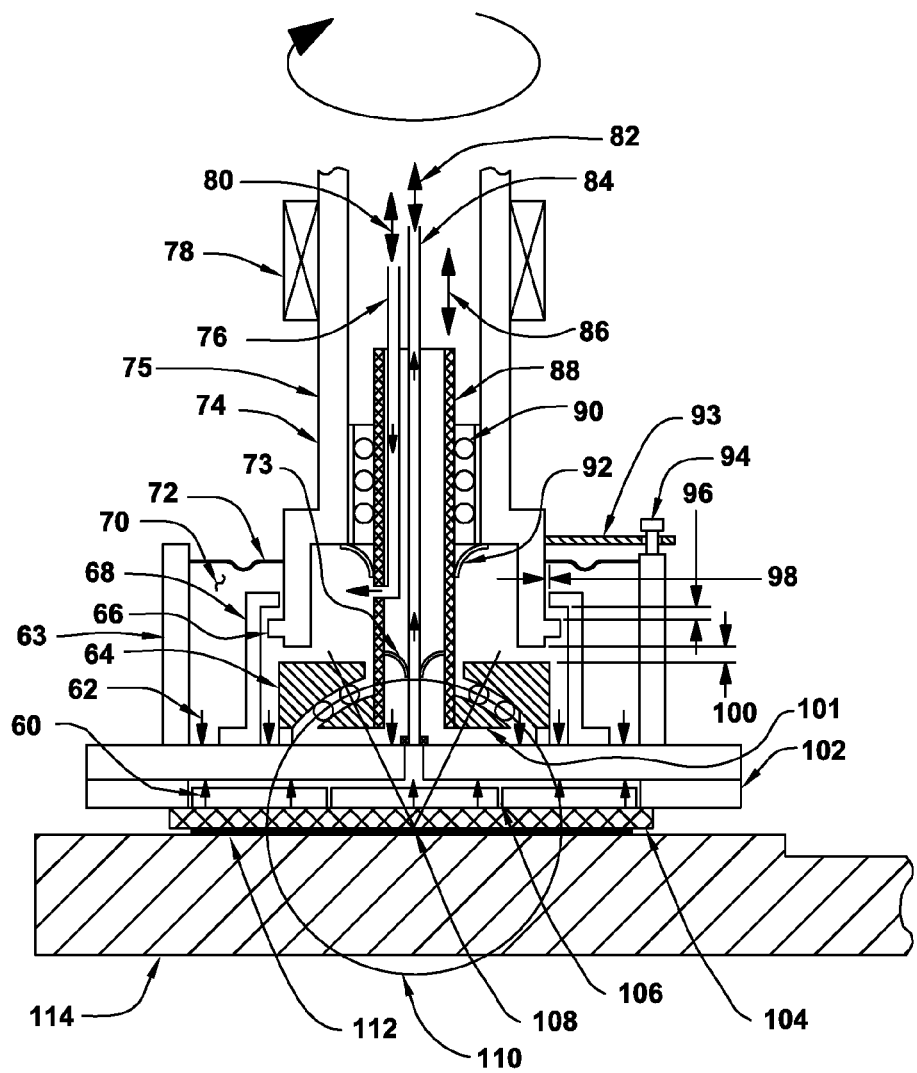
FIG. 3 is a cross section view of a spherical bearing floating carrier rotation device.

FIG. 3 is a cross section view of a spherical bearing floating carrier rotation device having a pin-driven flexible diaphragm workpiece carrier. A stationary workpiece carrier head has a flat-surfaced workpiece 104 that is attached by vacuum to a floating workpiece carrier rotor 102 that is rotationally driven by a drive-pin device 94. A vertical hollow drive shaft 88 is supported by liner-motion bearings 90 that are supported by a stationary-positioned rotatable carrier housing 74 where the rotatable carrier housing 74 is held stationary in a vertical position by bearings 78.

A nominally-rigid rotational drive arm 93 is attached to the hollow drive shaft 88 where rotation of the hollow drive shaft 88 rotates the rotational drive arm 93. The drive-pin device 94 is attached a rigid annular member that is attached to the workpiece carrier rotor 102 which allows the rotational drive arm 93 and the drive-pin device 94 to rotationally drive the workpiece carrier rotor 102. The workpiece carrier rotor 102 has an attached ball-type spherical bearing 101 which allows the workpiece carrier rotor 102 to be tilted while the stationary-positioned carrier housing 74 rotates.

An annular flexible diaphragm device 72 that is attached to the carrier housing 74 is also attached to the rigid annular member 63 where the flexible diaphragm device 72 flexes both horizontally and vertically. Here, the flexible diaphragm device 72 allows the workpiece carrier rotor 102 to be translated vertically by moving the hollow drive shaft 88 vertically relative to the rotatable carrier housing 74. The flexible diaphragm device 72 also allows the workpiece carrier rotor 102 to be tilted relative to the rotatable carrier housing 74. To provide more vertical and radial flexibility to the flexible diaphragm device 72, the flexible diaphragm device 72 can have an annular non-flat pleated-type surface. The annular flexible diaphragm device 72 and the rigid annular member 63 acts as a sealed envelope that prevents coolant water and abrasive debris from entering the internal portions of the workpiece carrier head 75 during an abrading operation.

The workpiece carrier rotor 102 can be moved vertically and tilted relative to the carrier housing 74 where the spherical bearing 101 allows the workpiece carrier rotor 102 to be tilted and the spherical bearing 101 restrains the workpiece carrier rotor 102 radially. Because the carrier rotor 102 nominally rotates with the carrier housing 74, as controlled by the drive-pin device 94, the spherical bearing 101 nominally does not rotate about a vertical axis but does provide spherical-action rotation of the carrier housing 74. The center of rotation 108 of the spherical bearing 101 having a spherical diameter 110 is located or near the surface of the abrasive surface 112 which tends to prevent tilting of the workpiece carrier rotor 102 due to abrading forces that are applied to the abraded surface of the workpiece 104.

The workpiece carrier rotor 102 can be tilted due to numerous causes including: flat-surfaced workpiece 104 that have non-parallel opposed surfaces; misalignment of components of the stationary workpiece carrier head 75; misalignment of other components of the abrading machine (not shown); and a platen 114 that has an abrading surface 112 that is not flat.

Pressurized air or other fluid such as water or vacuum 80 is supplied through a hollow tube 76 which is located within the carrier housing 74 where one end of the hollow tube 76 is fluid-coupled with a fluid rotary union (not shown). The pressurized air 80 in the hollow tube 76 is coupled with a sealed chamber 70 that is formed by the sealed annular flexible diaphragm device 72. This controlled pressure of the fluid 80 is present in the sealed chamber 70 to provide uniform abrading pressure 62 across the top surface of the carrier rotor 102 where the uniform abrading pressure 62 pressure is directly transmitted to the workpiece 104 abraded surface that is in abrading contact with the flat-surfaced abrasive 112 coating on the rotary platen 114.

When the sealed chamber 70 is pressurized by a fluid 80, the carrier rotor 102 can move vertically downward in a direction 86 to bring the workpiece 104 into abrading contact with the flat-surfaced abrasive 112 coating on the rotary platen 114. Likewise, when vacuum is applied to the sealed chamber 70, the carrier rotor 102 can be moved vertically upward in a direction 86 by the vacuum to move the workpiece 104 from abrading contact with the flat-surfaced abrasive 112 coating on the rotary platen 114.

Workpieces such as wafers 104 are attached with vacuum 60 that is applied to the workpiece surfaces through vacuum port holes 106 that have a common vacuum passageway in the carrier rotor 102 which is fluid-connected with a vacuum source 82 that is routed to the vacuum passageway by a flexible hollow tube 84. The flexible hollow tube 84 flexes near the attachment point to the carrier rotor 102 as the carrier rotor 102 is tilted. The workpiece 104 is firmly attached to the carrier rotor 102 by the large attachment pressure created by the vacuum 60. The flexible hollow tube 84 is fluid-coupled with the fluid rotary union. Air pressure can also be supplied through the rotary union in the same passageways 106 to provide pressurized separation of the adhesion-attached workpiece 104 from the workpiece carrier rotor 102 upon completion of the abrading action on the workpiece 104.

When the flat-surfaced workpieces 104 and the workpiece carrier rotor 102 are subjected to horizontal abrading friction forces that are parallel to the abraded surface of the workpieces 104, the workpieces remain firmly attached in-place on the workpiece carrier rotor 102. These abrading friction forces are resisted by the workpiece carrier rotor 102 as it is held radially in place by the spherical bearing 101 which is held radially by the hollow drive shaft 88 which is supported by the rotatable carrier housing 74.

An annular seal device 92 prevents leakage of pressurized air from the sealed chamber 70 along the linear ball-type bearing 90 in the annular area between the hollow drive shaft 88 and the carrier housing 74. Another annular seal device 73 prevents leakage of pressurized air from the sealed chamber 70 in the annular area between the inner diameter of the hollow drive shaft 88 and the flexible hollow tube 84.

The rigid rotation drive arm member 93 is attached to at least one individual drive-pin device 94 that is in sliding contact with the drive arm member 93 where the at least one individual drive-pin device 94 and the radial arm 93 are used to rotate the carrier rotor 102. The vertical and horizontal sliding action between the sliding-contact drive-pin device 94 and the radial arm 93 provide motion of the workpiece carrier rotor 102 in a vertical direction along the hollow drive shaft 88 rotation axis as changes in the air or fluid 80 pressure (or vacuum) 62 present in the sealed chamber 70 causes vertical motion of the workpiece rotor 102. An annular bracket 68 is used with the annular bracket 66, the spherical bearing 64 and the rigid carrier housing 74 to limit the upward vertical excursion distance 96 and downward vertical excursion distance 100 and the tilting arc distance 98 of the workpiece rotor 102.

The stationary workpiece carrier head 75 can be quickly switched between "floating" and "rigid" abrading modes by simply applying vacuum to the sealed chamber 70 that is located inside the body of the workpiece carrier head 75 instead of the pressure 80 that applies an abrading pressure force 62. This vacuum forces the rotary workpiece carrier 102 into rigid contact with the rigid carrier housing 74 by the bearing race of the spherical bearing 64 contacting the rigid carrier housing 74. Here, the workpiece-attachment surface of the workpiece carrier 102 is positioned to be precisely aligned perpendicular with the workpiece spindle (not shown) rotation axis. Because the workpiece is rigidly attached to the rigid workpiece carrier 102 attachment surface, the exposed abraded surface of the workpiece 104 can be abraded precisely parallel to the workpiece carrier 102 workpiece attachment surface by the rotating platen 114 moving abrasive 112 when the abrading head 75 is moved vertically downward.

Figure 4:
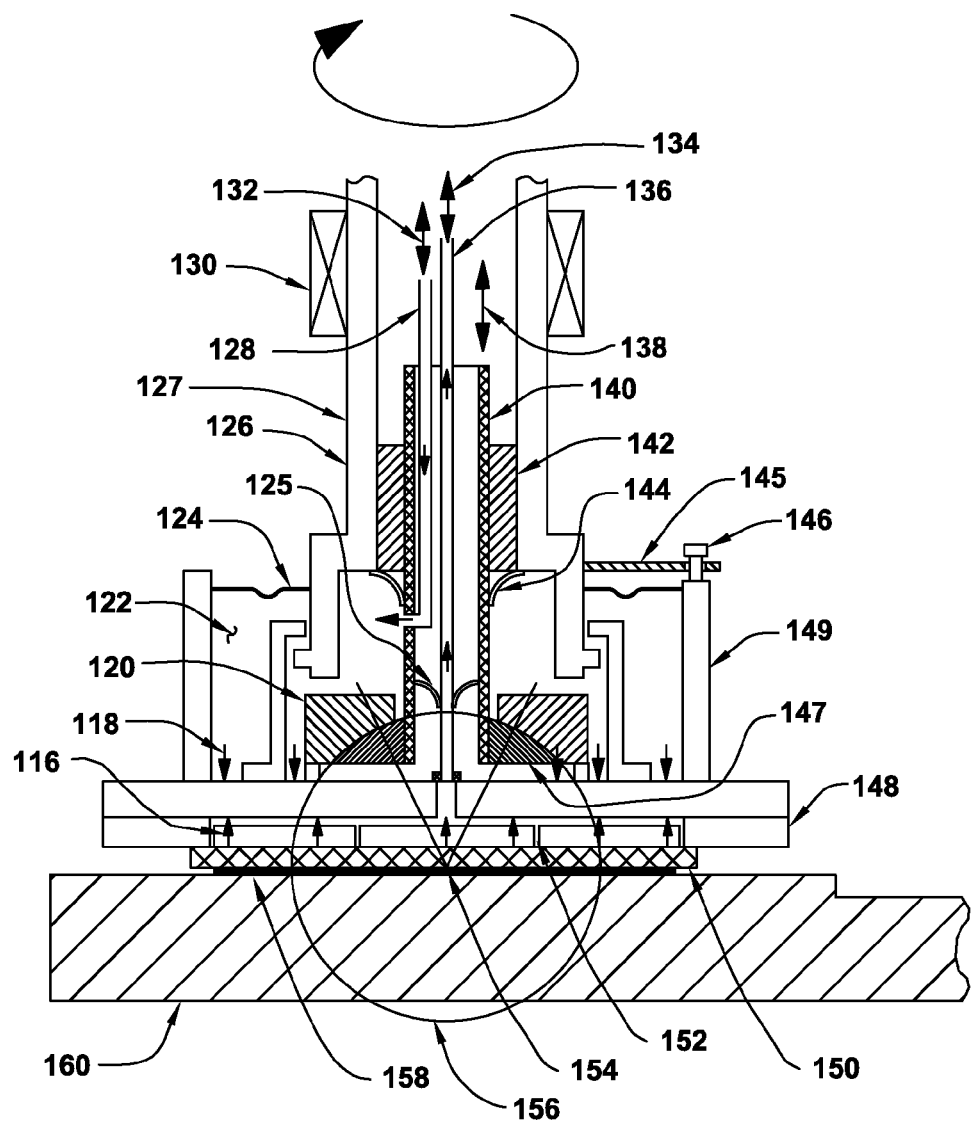
FIG. 4 is a cross section view of a sliding spherical bearing floating carrier rotation device.

FIG. 4 is a cross section view of a sliding spherical bearing floating carrier rotation device having a pin-driven flexible diaphragm workpiece carrier. A stationary workpiece carrier head has a flat-surfaced workpiece 150 that is attached by vacuum to a floating workpiece carrier rotor 148 that is rotationally driven by a drive-pin device 146. A vertical hollow drive shaft 140 is supported by liner-motion sleeve or slide-type bearings 142 that are supported by a stationary-positioned rotatable carrier housing 126 where the rotatable carrier housing 126 is held stationary in a vertical position by bearings 130.

A nominally-rigid rotational drive arm 145 is attached to the hollow drive shaft 140 where rotation of the hollow drive shaft 140 rotates the rotational drive arm 145. The drive-pin device 146 is attached a rigid annular member that is attached to the workpiece carrier rotor 148 which allows the rotational drive arm 145 and the drive-pin device 146 to rotationally drive the workpiece carrier rotor 148. The workpiece carrier rotor 148 has an attached slide-type spherical bearing 147 which allows the workpiece carrier rotor 148 to be tilted while the stationary-positioned carrier housing 126 rotates.

An annular flexible diaphragm device 124 that is attached to the carrier housing 126 is also attached to the rigid annular member 149 where the flexible diaphragm device 124 flexes both horizontally and vertically. Here, the flexible diaphragm device 124 allows the workpiece carrier rotor 148 to be translated vertically by moving the hollow drive shaft 140 vertically relative to the rotatable carrier housing 126. The flexible diaphragm device 124 also allows the workpiece carrier rotor 148 to be tilted relative to the rotatable carrier housing 126. To provide more vertical and radial flexibility to the flexible diaphragm device 124, the flexible diaphragm device 124 can have an annular non-flat pleated-type surface. The annular flexible diaphragm device 124 and the rigid annular member 149 acts as a sealed envelope that prevents coolant water and abrasive debris from entering the internal portions of the workpiece carrier head 127 during an abrading operation.

The workpiece carrier rotor 148 can be moved vertically and tilted relative to the carrier housing 126 where the spherical bearing 147 allows the workpiece carrier rotor 148 to be tilted and the spherical bearing 147 restrains the workpiece carrier rotor 148 radially. Because the carrier rotor 148 nominally rotates with the carrier housing 126, as controlled by the drive-pin device 146, the spherical bearing 147 nominally does not rotate about a vertical axis but does provide spherical-action rotation of the carrier housing 126. The center of rotation 154 of the spherical bearing 147 having a spherical diameter 156 is located or near the surface of the abrasive surface 158 which tends to prevent tilting of the workpiece carrier rotor 148 due to abrading forces that are applied to the abraded surface of the workpiece 150.

The workpiece carrier rotor 148 can be tilted due to numerous causes including: flat-surfaced workpiece 150 that have non-parallel opposed surfaces; misalignment of components of the stationary workpiece carrier head 127; misalignment of other components of the abrading machine (not shown); and a platen 160 that has an abrading surface 158 that is not flat.

Pressurized air or other fluid such as water or vacuum 132 is supplied through a hollow tube 128 which is located within the carrier housing 126 where one end of the hollow tube 128 is fluid-coupled with a fluid rotary union (not shown). The pressurized air 132 in the hollow tube 128 is coupled with a sealed chamber 122 that is formed by the sealed annular flexible diaphragm device 124. This controlled pressure of the fluid 132 is present in the sealed chamber 122 to provide uniform abrading pressure 118 across the top surface of the carrier rotor 148 where the uniform abrading pressure 118 pressure is directly transmitted to the workpiece 150 abraded surface that is in abrading contact with the flat-surfaced abrasive 158 coating on the rotary platen 160.

When the sealed chamber 122 is pressurized by a fluid 132, the carrier rotor 148 can move vertically downward in a direction 138 to bring the workpiece 150 into abrading contact with the flat-surfaced abrasive 158 coating on the rotary platen 160. Likewise, when vacuum is applied to the sealed chamber 122, the carrier rotor 148 can be moved vertically upward in a direction 138 by the vacuum to move the workpiece 150 from abrading contact with the flat-surfaced abrasive 158 coating on the rotary platen 160.

Workpieces such as wafers 150 are attached with vacuum 116 that is applied to the workpiece surfaces through vacuum port holes 152 that have a common vacuum passageway in the carrier rotor 148 which is fluid-connected with a vacuum source 134 that is routed to the vacuum passageway by a flexible hollow tube 136. The flexible hollow tube 136 flexes near the attachment point to the carrier rotor 148 as the carrier rotor 148 is tilted. The workpiece 150 is firmly attached to the carrier rotor 148 by the large attachment pressure created by the vacuum 116. The flexible hollow tube 136 is fluid-coupled with the fluid rotary union. Air pressure can also be supplied through the rotary union in the same passageways 152 to provide pressurized separation of the adhesion-attached workpiece 150 from the workpiece carrier rotor 148 upon completion of the abrading action on the workpiece 150.

When the flat-surfaced workpieces 150 and the workpiece carrier rotor 148 are subjected to horizontal abrading friction forces that are parallel to the abraded surface of the workpieces 150, the workpieces remain firmly attached in-place on the workpiece carrier rotor 148. These abrading friction forces are resisted by the workpiece carrier rotor 148 as it is held radially in place by the spherical bearing 147 which is held radially by the hollow drive shaft 140 which is supported by the rotatable carrier housing 126.

An annular seal device 144 prevents leakage of pressurized air from the sealed chamber 122 along the linear bearing 142 in the annular area between the hollow drive shaft 140 and the carrier housing 126. Another annular seal device 125 prevents leakage of pressurized air from the sealed chamber 122 in the annular area between the inner diameter of the hollow drive shaft 140 and the flexible hollow tube 136.

The rigid rotation drive arm member 145 is attached to at least one individual drive-pin device 146 that is in sliding contact with the drive arm member 145 where the at least one individual drive-pin device 146 and the radial arm 145 are used to rotate the carrier rotor 148. The vertical and horizontal sliding action between the sliding-contact drive-pin device 146 and the radial arm 145 provide motion of the workpiece carrier rotor 148 in a vertical direction along the hollow drive shaft 140 rotation axis as changes in the air or fluid 132 pressure (or vacuum) 118 present in the sealed chamber 122 causes vertical motion of the workpiece rotor 148. An annular bracket is used with the annular bracket, the spherical bearing 120 and the rigid carrier housing 126 to limit the upward vertical excursion distance and downward vertical excursion distance and the tilting arc distance of the workpiece rotor 148.

The stationary workpiece carrier head 127 can be quickly switched between "floating" and "rigid" abrading modes by simply applying vacuum to the sealed chamber 122 that is located inside the body of the workpiece carrier head 127 instead of the pressure 132 that applies an abrading pressure force 118. This vacuum forces the rotary workpiece carrier 148 into rigid contact with the rigid carrier housing 126 by the bearing race of the spherical bearing 120 contacting the rigid carrier housing 126. Here, the workpiece-attachment surface of the workpiece carrier 148 is positioned to be precisely aligned perpendicular with the workpiece spindle (not shown) rotation axis. Because the workpiece is rigidly attached to the rigid workpiece carrier 148 attachment surface, the exposed abraded surface of the workpiece 150 can be abraded precisely parallel to the workpiece carrier 148 workpiece attachment surface by the rotating platen 160 moving abrasive 158 when the abrading head 127 is moved vertically downward.

Figure 5:
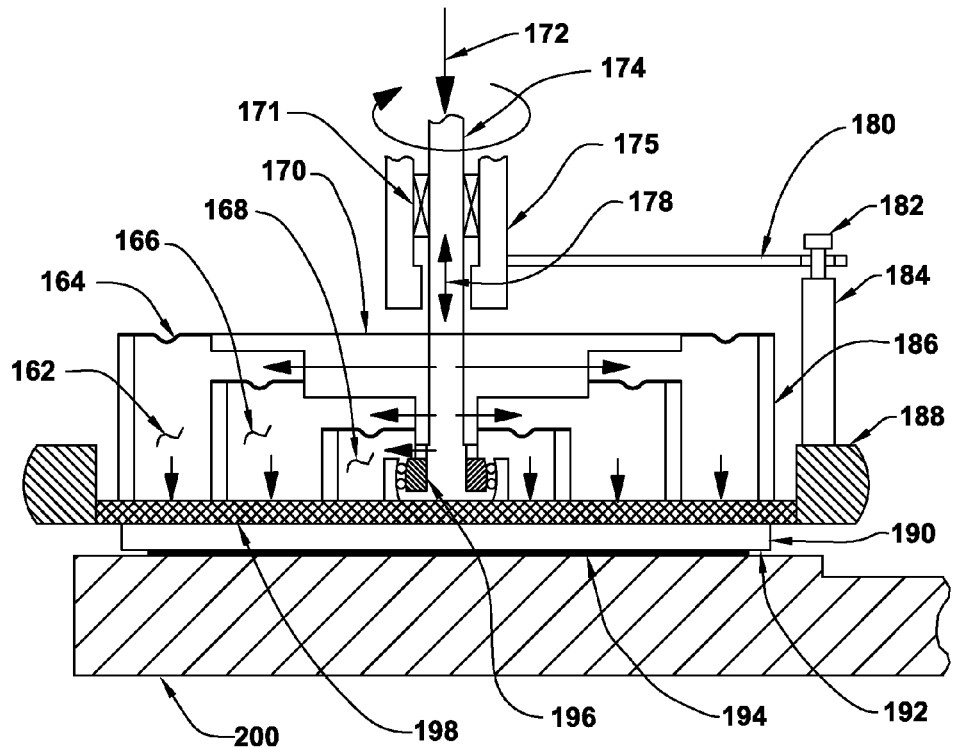
FIG. 5 is a cross section view of a spherical-action carrier with multiple pressure chambers.

FIG. 5 is a cross section view of a spherical-action carrier with multiple pressure chambers. A flat-surfaced workpiece 190 is attached to a nominally-horizontal floating workpiece carrier rotor 188 that is rotationally driven by a sliding pin arm device 180 that is attached to a drive hub 175 that is attached to a hollow drive shaft 174. The ends of the pin arm 180 are in sliding contact with a sliding pin 182 that is attached to a bracket 184 that is attached to the workpiece carrier rotor 188. In one embodiment, sealed annular flexible elastomer disks 164 are attached on an outer radial surface to sealed annular walls 186 that are attached to the central flexible bottom portion 198 of the workpiece carrier rotor 188 and are attached at the inner radial surface to the drive plate 188.

In another embodiment, the sealed annular walls 186 that are attached to the central flexible bottom portion 198 can be flexible where the sealed annular walls 186 and the central flexible bottom portion 198 can be integral with each other and constructed from materials including elastomers, polyurethane, silicone rubber, polymer impregnated cloth, metals. The hollow drive shaft 174 is supported by a bearing 171 that is supported by the drive hub 175 which allows the hollow drive shaft 174 to move vertically 178 relative to the drive hub 175. A spherical bearing 196 is attached to both the hollow drive shaft 174 and the central flexible bottom portion 198 of the workpiece carrier rotor 188 which allows the workpiece carrier rotor 188 to be tilted relative to the drive hub 175.

The workpiece 190 is attached to the central flexible bottom portion 198 of the workpiece carrier rotor 188 by vacuum, low-tack adhesives or adhesive-bonding provided by water films that mutually wet the surfaces of both the workpiece 190 and the central flexible bottom portion 198 of the workpiece carrier rotor 188. Single or multiple workpieces 190 can be attached to the flexible bottom portion 198 of the workpiece carrier rotor 188.

Pressurized air or another fluid such as water 190 or vacuum is supplied through the hollow drive shaft 174 that has fluid passages which allows multiple pressurized air or another fluid such as water 190 to fill the independent sealed pressure chambers 162, 166 and 168 that are formed by the sealed annular flexible elastomer disks 164. Different controlled fluid 190 pressures are present in each of the independent annular or circular sealed chambers 162, 166 and 168 to provide uniform abrading action across the full flat abraded surface 192 of the workpiece 190 that is in abrading contact with the abrasive 194 coating on the rotary platen 200. When the sealed pressure chambers 162, 166 and 168 are pressurized by a fluid, the sealed annular flexible elastomer disks 164 are flexed vertically and the sliding pin 182 also moves upward or downward in a vertical direction but stays in sliding contact with the sliding pin arm device 180.

Vacuum or pressure can be supplied independently to the annular or circular sealed chambers 162, 166 and 168 to provide attachment of workpieces 190 to the central flexible bottom portion 198 of the workpiece carrier rotor 188 or a combination of vacuum or pressures may be used to optimize the uniform abrading of the abraded surface of the workpieces 190.

In another embodiment, the pin arm 180 and the sliding pin 182 that is attached to the bracket 184 can be replaced with a spider-arm rotation device (not shown) that is attached to the workpiece carrier rotor 188 to rotate the workpiece carrier rotor 188 where the sealed annular flexible elastomer disks 164 are used to provide the independent annular or circular sealed chambers 162, 166 and 168.

Figure 6:
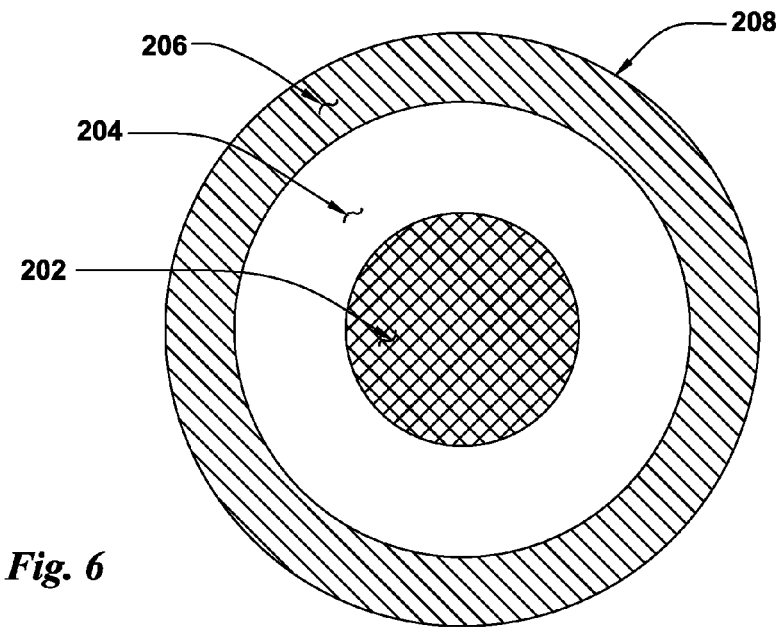
FIG. 6 is a top view of a spherical-action carrier with multiple pressure chambers.

FIG. 6 is a top view of a driven workpiece carrier with multiple pressure chambers. A flexible-bottom workpiece holder 208 of the has an annular outer abrading pressure zone 206, an annular inner abrading pressure zone 204 and a circular inner abrading pressure zone 202. The abrading pressure is independently controlled in each of the three zones 206, 204 and 202. The device shown here has three independent pressure zones but other device embodiments can have five or more independent pressure zones.

Figure 7:
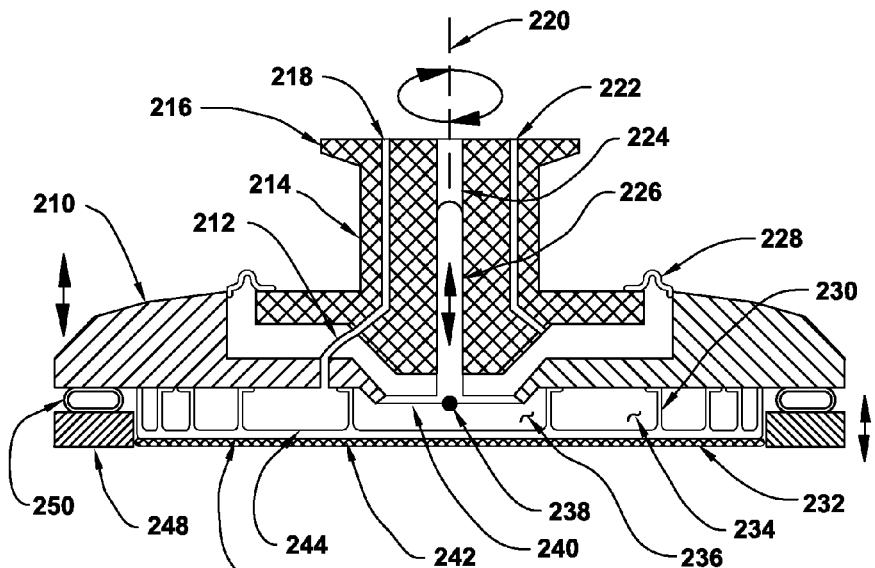
FIG. 7 is a cross section view of a prior art pneumatic bladder type of wafer carrier.

FIG. 7 is a cross section view of a conventional prior art pneumatic bladder type of wafer carrier. A rotatable wafer carrier head 214 having a wafer carrier hub 216 is attached to the rotatable head (not shown) of a polishing machine tool (not shown) where the carrier hub 216 is loosely attached with flexible joint device 228 and a rigid slide-pin 226 to a rigid carrier plate 210. The cylindrical rigid slide-pin 226 can move along a cylindrical hole 224 in the carrier hub 216 which allows the rigid carrier plate 210 to move axially along the hole 224 where the movement of the carrier plate 210 is relative to the carrier hub 216. The rigid slide-pin 226 is attached to a flexible diaphragm 240 that is attached to carrier plate 210 which allows the carrier plate 210 to be spherically rotated about a rotation point 238 relative to the rotatable carrier hub 216 that is remains aligned with its rotational axis 220.

A sealed flexible elastomeric diaphragm device 244 has a number of individual annular sealed pressure chambers 234 having flexible elastomeric chamber walls 230 and a circular center chamber 236 where the air pressure can be independently adjusted for each of the individual chambers 234, 236 to provide different abrading pressures to a wafer workpiece 232 that is attached to the wafer mounting surface 246 of the elastomeric diaphragm 244. A wafer 232 carrier annular back-up ring 248 provides containment of the wafer 232 within the rotating but stationary-positioned wafer carrier head 214 as the wafer 232 abraded surface 242 is subjected to abrasion-friction forces by the moving abrasive coated platen (not shown). An air-pressure annular bladder 250 applies controlled contact pressure of the wafer 232 carrier annular back-up ring 248 with the platen abrasive coating surface. Controlled-pressure air is supplied from air inlet passageways 218 and 222 in the carrier hub 216 to each of the multiple flexible pressure chambers 234, 236 by flexible tubes 212.

When CMP polishing of wafers takes place, a resilient porous CMP pad is saturated with a liquid loose-abrasive slurry mixture and is held in moving contact with the flat-surfaced semiconductor wafers to remove a small amount of excess deposited material from the top surface of the wafers. The wafers are held by a wafer carrier head that rotates as the wafer is held in abrading contact with the CMP pad that is attached to a rotating rigid platen. Both the carrier head and the pad are rotated at the same slow speeds.

The pneumatic-chamber wafer carrier heads typically are constructed with a flexible elastomer membrane that supports a wafer where five individual annular chambers allow the abrading pressure to be varied across the radial surface of the wafer. The rotating carrier head has a rigid hub and a floating wafer carrier plate that has a "spherical" center of rotation where the wafer is held in flat-surfaced abrading contact with a moving resilient CMP pad. A rigid wafer retaining ring that contacts the edge of the wafer is used to resist the abrading forces applied to the wafer by the moving pad.

Figure 8:
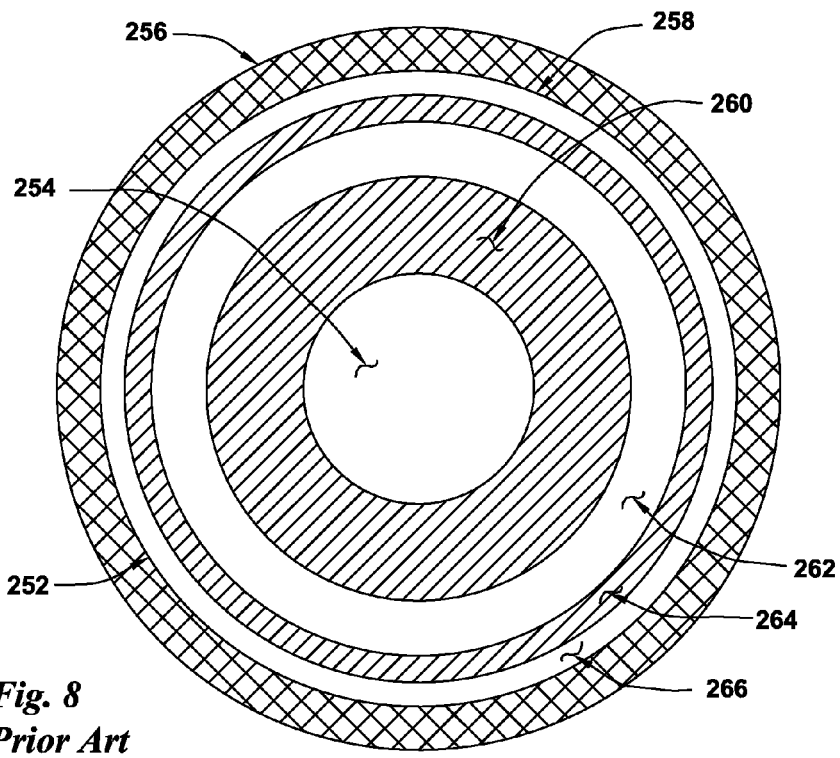
FIG. 8 is a bottom view of a prior art pneumatic bladder type of wafer carrier.

FIG. 8 is a bottom view of a conventional prior art pneumatic bladder type of wafer carrier. A wafer carrier head 256 having an continuous nominally-flat surface elastomeric diaphragm 258 is shown having multiple annular pneumatic pressure chamber areas 260, 262, 264, 266 and one circular center pressure chamber area 254. The wafer carrier head 374 can have more or less than five individual pressure chambers. A wafer carrier head 256 annular back-up ring 252 provides containment of the wafer (not shown) within the wafer carrier head 256 as the wafer (not shown) that is attached to the continuous nominally-flat surface of the elastomeric diaphragm device 258 is subjected to abrasive friction forces. Here, the semiconductor wafer substrate is loosely attached to a flexible continuous-surface of a membrane that is attached to the rigid portion of the substrate carrier. Multiple pneumatic air-pressure chambers that exist between the substrate mounting surface of the membrane and the rigid portion of the substrate carrier are an integral part of the carrier membrane.

Each of the five annular pneumatic chambers shown here can be individually pressurized to provide different abrading pressures to different annular portions of the wafer substrate. These different localized abrading pressures are provided to compensate for the non-uniform abrading action that occurs with this wafer polishing system.

The flexible semiconductor wafer is extremely flat on both opposed surfaces. Attachment of the wafer to the carrier membrane is accomplished by pushing the very flexible membrane against the flat backside surface of a water-wetted wafer to drive out all of the air and excess water that exists between the wafer and the membrane. The absence of an air film in this wafer-surface contact are provides an effective suction-attachment of the wafer to the carrier membrane surface. Sometimes localized "vacuum pockets" are used to enhance the attachment of the wafer to the flexible flat-surfaced membrane.

Each of the five annular pressure chambers expand vertically when pressurized. The bottom surfaces of each of these chambers move independently from their adjacent annular chambers. By having different pressures in each annular ring-chamber, the individual chamber bottom surfaces are not in a common plane if the wafer is not held in flat-surfaced abrading contact with a rigid abrasive surface. If the abrasive surface is rigid, then the bottom surfaces of all of the five annular rings will be in a common plane. However, when the abrasive surface is supported by a resilient pad, each individual pressure chamber will distort the abraded wafer where the full wafer surface is not in a common plane. Resilient support pads are used both for CMP pad polishing and for fixed-abrasive web polishing.

Because of the basic design of the flexible membrane wafer carrier head that has five annular zones, each annular abrading pressure-controlled zone provides an "average" pressure for that annular segment. This constant or average pressure that exist across the radial width of that annular pressure chamber does not accurately compensate for the non-linear wear rate that actually occurs across the radial width of that annular band area of the wafer surface.

Overall, this flexible membrane wafer substrate carrier head is relatively effective for CMP pad polishing of wafers. Use of it with resilient CMP pads require that the whole system be operated at very low speeds, typically at 30 rpm. However, the use of this carrier head also causes many problems results in non-uniform material removal across the full surface of a wafer.

Figure 9:
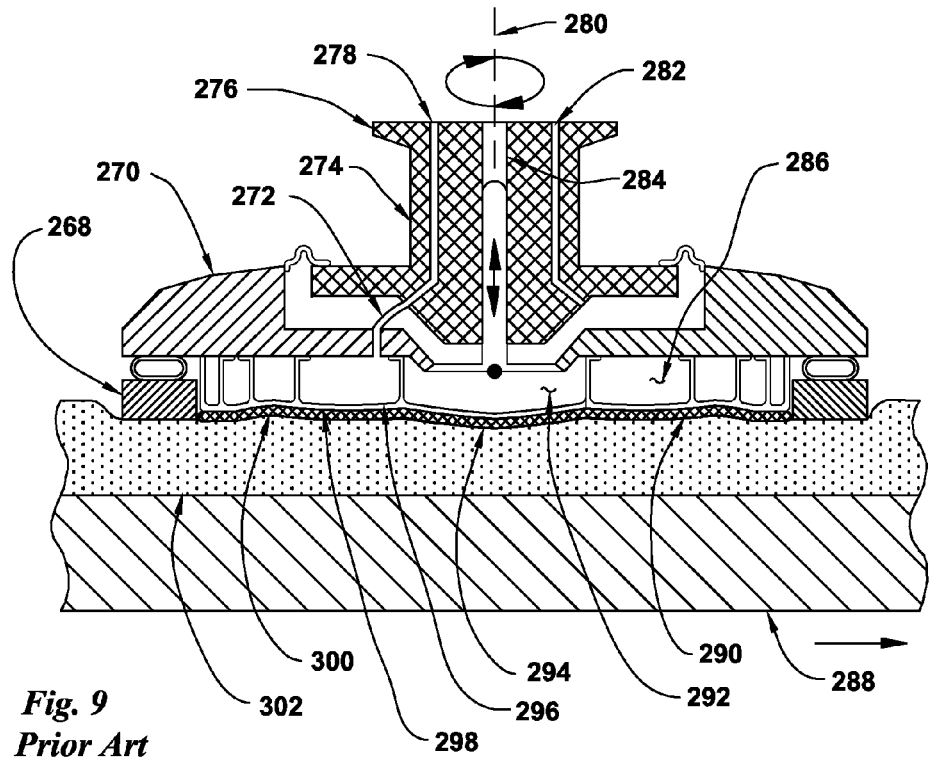
FIG. 9 is a cross section view of a prior art bladder type of wafer carrier distorted bottom.

FIG. 9 is a cross section view of a prior art pneumatic bladder type of wafer carrier with a distorted bottom surface. A rotatable wafer carrier head 274 having a wafer carrier hub 276 is attached to the rotatable head (not shown) of a wafer polishing machine tool (not shown) where the carrier hub 276 is loosely attached with flexible joint devices and a rigid slide-pin to a rigid carrier plate 270. The cylindrical rigid slide-pin can move along a cylindrical hole 284 in the carrier hub 276 which allows the rigid carrier plate 270 to move axially along the hole 284 where the movement of the carrier plate 270 is relative to the carrier hub 276. The rigid slide-pin is attached to a flexible diaphragm that is attached to carrier plate 270 which allows the carrier plate 270 to be spherically rotated about a rotation point relative to the rotatable carrier hub 276 that is remains aligned with its rotational axis 280.

A sealed flexible elastomeric diaphragm device 296 having a nominally-flat but flexible wafer 290 mounting surface 298 has a number of individual annular sealed pressure chambers 286 and a circular center chamber 292 where the air pressure can be independently adjusted for each of the individual chambers 286, 292 to provide different abrading pressures to a wafer workpiece 290 that is attached to the wafer mounting surface 298 of the elastomeric diaphragm 296. A wafer 290 carrier annular back-up ring 268 provides containment of the wafer 290 within the rotating but stationary-positioned wafer carrier head 274 as the wafer 290 abraded surface 300 is subjected to abrasion-friction forces by the moving abrasive coated platen (not shown). An air-pressure annular bladder applies controlled contact pressure of the wafer 290 carrier annular back-up ring 268 with the platen abrasive coating surface. Controlled-pressure air is supplied from air inlet passageways 278 and 282 in the carrier hub 276 to each of the multiple flexible pressure chambers 286, 292 by flexible tubes 272.

When air, or other fluids such as water, pressures are applied to the individual sealed pressure chambers 286, 292, the flexible bottom wafer mounting surface 298 of the elastomeric diaphragm 296 is deflected different amounts in the individual annular or circular bottom areas of the sealed pressure chambers 286, 292 where the nominally-flat but flexible wafer 290 is distorted into a non-flat condition as shown by 294 as the wafer 290 is pushed downward into the flexible and resilient CMP pad 302 which is supported by a rigid rotatable platen 288.

When the multi-zone wafer carrier is used to polish wafer surfaces with a resilient CMP abrasive slurry saturated polishing pad, the individual annular rings push different annular portions of the wafer into the resilient pad. Each of the wafer carrier air-pressure chambers exerts a different pressure on the wafer to provide uniform material removal across the full surface of the wafer. Typically the circular center of the wafer carrier flexible diaphragm has the highest pressure. This high-pressure center-area distorts the whole thickness of the wafer as it is forced deeper into the resilient CMP wafer pad. Adjacent annular pressure zones independently distort other portions of the wafer.

Here, the wafer body is substantially distorted out-of-plane by the independent annual pressure chambers. However, the elastomer membrane that is used to attach the wafer to the rotating wafer carrier is flexible enough to allow the individual pressure chambers to flex the wafer while still maintaining the attachment of the wafer to the membrane. As the wafer body is distorted, the distorted and moving resilient CMP pad is thick enough to allow this out-of-plane distortion to take place while providing polishing action on the wafer surface.

When a wafer carrier pressure chamber is expanded downward, the chamber flexible wall pushes a portion of the wafer down into the depths of the resilient CMP pad. The resilient CMP pad is compressible and acts as an equivalent series of compression springs. The more that a spring is compressed, the higher the resultant force is. The compression of a spring is defined as $F=KX$ where F is the spring force, K is the spring constant and X is the distance that the end of the spring is deflected.

The CMP resilient pads have a stiffness that resists wafers being forced into the depths of the pads. Each pad has a spring constant that is typically linear. In order to develop a higher abrading pressure at a localized region of the flat surface of a wafer, it is necessary to move that portion of the wafer down into the depth of the compressible CMP pad. The more that the wafer is moved downward to compresses the pad, the higher the resultant abrading force in that localized area of the wafer. If the spring-like pad is not compressed, the required wafer abrading forces are not developed.

Due to non-uniform localized abrading speeds on the wafer surface, and other causes such as distorted resilient pads, it is necessary to compress the CMP pad different amounts at different radial areas of the wafer. However, the multi-zone pressure chamber wafer carrier head has abrupt chamber-bottom membrane deflection discontinuities at the annular joints that exist between adjacent chambers having different chamber pressures. Undesirable wafer abrading pressure discontinuities exist at these membrane deflection discontinuity annular ring-like areas.

Often, wafers that are polished using the pneumatic wafer carrier heads are bowed. These bowed wafers can be attached to the flexible elastomeric membranes of the carrier heads. However, in a free-state, these bowed wafers will be first attached to the center-portion of the carrier head. Here, the outer periphery of the bowed wafer contacts the CMP pad surface before the wafer center does. Pressing the wafer into forced contact with the CMP pad allows more of the wafer surface to be in abrading contact with the pad. Using higher fluid pressures in the circular center of the carrier head chamber forces this center portion of the bowed wafer into the pad to allow uniform abrading and material removal across this center portion of the surface of the wafer. There is no defined planar reference surface for abrading the surface of the wafer.

Figure 10:
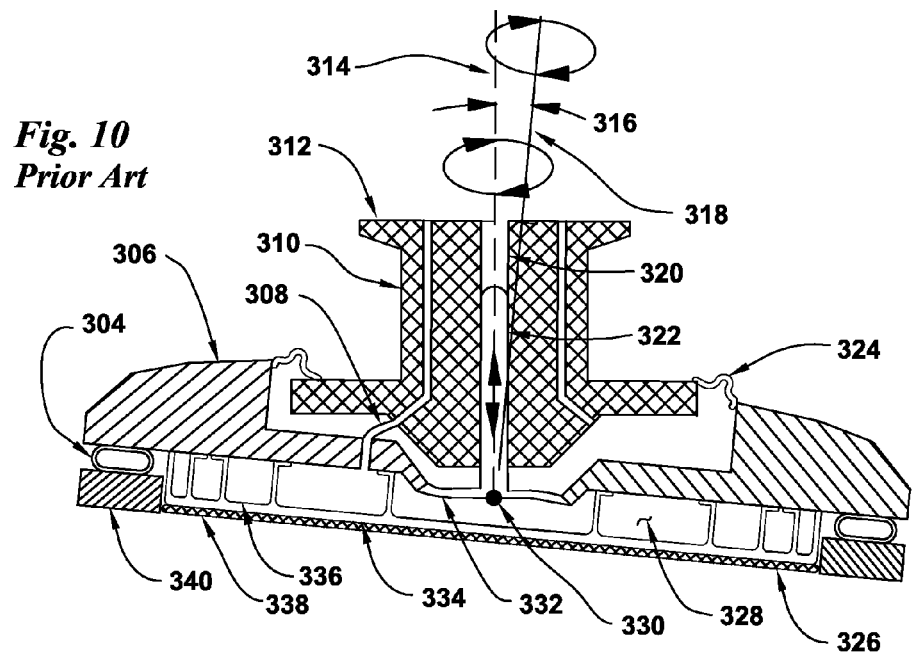
FIG. 10 is a cross section view of a prior art bladder type of wafer carrier tilted wafer carrier.

FIG. 10 is a cross section view of a prior art pneumatic bladder type of wafer carrier head with a tilted wafer carrier. The pneumatic-chamber carrier head is made up of two internal parts to allow "spherical-action" motion of the floating annular plate type of substrate carrier that is supported by a rotating carrier hub. The floating substrate carrier plate is attached to the rotating drive hub by a flexible elastomeric or a flexible metal diaphragm at the top portion of the hub. This upper elastomeric diaphragm allows approximate-spherical motion of the substrate carrier to provide flat-surfaced contact of the wafer substrate with the "flat" but indented resilient CMP pad. The CM pad is saturated with a liquid abrasive slurry mixture.

To keep the substrate nominally centered with the rotating carrier drive hub, a stiff (or flexible) post is attached to a flexible annular portion of the rigid substrate carrier structure. This circular centering-post fits in a cylindrical sliding-bearing receptacle-tube that is attached to the rotatable hub along the hub rotation axis. When misalignment of the polishing tool (machine) components occurs or large lateral friction abrading forces tilt the carrier head, the flexible centering post tends to slide vertically along the length of the carrier head rotation axis. This post-sliding action and out-of-plane distortion of the annular diaphragm that is attached to the base of the centering posts together provide the required "spherical-action" motion of the rigid carrier plate. In this way, the surface of the wafer substrate is held in flat-surfaced contact with the nominal-flatness of the CMP pad as the carrier head rotates.

Here, the "spherical action" motion of the substrate carrier depends upon the localized distortion of the structural member of the carrier head. This includes diaphragm-bending of the flexible annular base portion of the rigid substrate carrier which the center-post shaft is attached to. All of these carrier head components are continuously flexed upon each rotation of the carrier head which often requires that the wafer substrate carrier head is typically operated at very slow operating speeds of only 30 rpm.

A rotatable wafer carrier head 310 having a wafer carrier hub 312 is attached to the rotatable head (not shown) of a polishing machine tool (not shown) where the carrier hub 312 is loosely attached with flexible joint device 324 and a rigid slide-pin 322 to a rigid carrier plate 306. The cylindrical rigid slide-pin 322 can move along a cylindrical hole 320 in the carrier hub 312 which allows the rigid carrier plate 306 to move axially along the hole 320 where the movement of the carrier plate 306 is relative to the carrier hub 312. The rigid slide-pin 322 is attached to a flexible diaphragm 332 that is attached to the carrier plate 306 which allows the carrier plate 306 to be spherically rotated about a rotation point 330 relative to the rotatable carrier hub 312 that is remains aligned with its rotational axis 346.

The carrier plate 306 is shown spherically rotated about a rotation point 330 relative to the rotatable carrier hub 312 where the slide-pin axis 314 is at a tilt-angle 316 with an axis 318 that is perpendicular with the wafer 326 abraded surface 334 and where the carrier plate 306 and the wafer 326 are shown here to rotate about the axis 318. The flexible diaphragm 332 that is attached to the carrier plate 306 is distorted when the carrier plate 306 is spherically rotated about a rotation point 330 relative to the rotatable carrier hub 312.

A sealed flexible elastomeric diaphragm device 336 has a number of individual annular sealed pressure chambers 328 and a circular center chamber where the air pressure can be independently adjusted for each of the individual chambers 328 to provide different abrading pressures to a wafer workpiece 326 that is attached to the wafer mounting surface 338 of the elastomeric diaphragm 336. A wafer 326 carrier annular back-up ring 340 provides containment of the wafer 326 within the rotating but stationary-positioned wafer carrier head 310 as the wafer 326 abraded surface 334 is subjected to abrasion-friction forces by the moving abrasive coated platen (not shown). An air-pressure annular bladder 304 applies controlled contact pressure of the wafer 326 carrier annular back-up ring 340 with the platen abrasive coating surface. Controlled-pressure air is supplied from air inlet passageways in the carrier hub 312 to each of the multiple flexible pressure chambers 328 by flexible tubes 308.

The pneumatic abrading pressures that are applied during CMP polishing procedures range from 1 to 8 psi. The downward pressures that are applied by the wafer retaining ring to push-down the resilient CMP pad prior to it contacting the leading edge of the wafer are often much higher than the nominal abrading forces applied to the wafer. For a 300 mm (12 inch) diameter semiconductor wafer substrate, that has a surface area of 113 sq. inches, an abrading force of 4 psi is often applied for polishing with a resilient CMP pad. The resultant downward abrading force on the wafer substrate is 4×113=452 lbs. An abrading force of 2 psi results in a downward force of 226 lbs.

The coefficient of friction between a resilient pad and a wafer substrate can vary between 0.5 and 2.0. Here, the wafer is plunged into the depths of the resilient CMP pad. A lateral force is applied to the wafer substrate along the wafer flat surface that is a multiple of the coefficient of friction and the applied downward abrading force. If the downward force is 452 lbs and the coefficient of friction is 0.5, then the lateral force is 226 lbs. If the downward force is 452 lbs and the coefficient of friction is 2.0, then the lateral force is 904 lbs. If a 2 psi downward force is 226 lbs and the coefficient of friction is 2.0, then the lateral force is 452 lbs.

When this lateral force of 226 to 904 lbs is applied to the wafer, it tends to drive the wafer against the rigid outer wafer retaining ring of the wafer carrier head. Great care is taken not to damage or chip the fragile, very thin and expensive semiconductor wafer due to this wafer-edge contact. This wafer edge-contact position changes continually along the periphery of the wafer during every revolution of the carrier head. Also, the overall structure of the carrier head is subjected to this same lateral force that can range from 226 to 904 lbs.

All the head internal components tend to tilt and distort when the head is subjected to the very large friction forces caused by forced-contact with the moving abrasive surface. The plastic components that the pneumatic head is constructed from have a stiffness that is a very small fraction of the stiffness of same-sized metal components. This is especially the case for the very flexible elastomeric diaphragm materials that are used to attach the wafers to the carrier head. These plastic and elastomeric components tend to bend and distort substantial amounts when they are subjected to these large lateral abrading friction forces.

The equivalent-vacuum attachment of a water-wetted wafer, plus the coefficient-of-friction surface characteristics of the elastomer membrane, are sufficient to successfully maintain the attachment of the wafer to the membrane even when the wafer is subjected to the large lateral friction-caused abrading forces. However, to maintain the attachment of the wafer to the membrane, it is necessary that the flexible elastomer membrane is distorted laterally by the friction forces to where the outer periphery edge of the wafer is shifted laterally to contact the wall of the rigid wafer substrate retainer ring. Because the thin wafer is constructed form a very rigid silicon material, it is very stiff in a direction along the flat surface of the wafer.

The rigid wafer outer periphery edge is continually pushed against the substrate retainer ring to resist the very large lateral abrading forces. This allows the wafer to remain attached to the flexible elastomer diaphragm flat surface because the very weak diaphragm flat surface is also pushed laterally by the abrading friction forces. Most of the lateral abrading friction forces are resisted by the body of the wafer and a small amount is resisted by the elastomer bladder-type diaphragm. Contact of the wafer edge with the retainer ring continually moves along the wafer periphery upon each revolution of the wafer carrier head.

Figure 11:
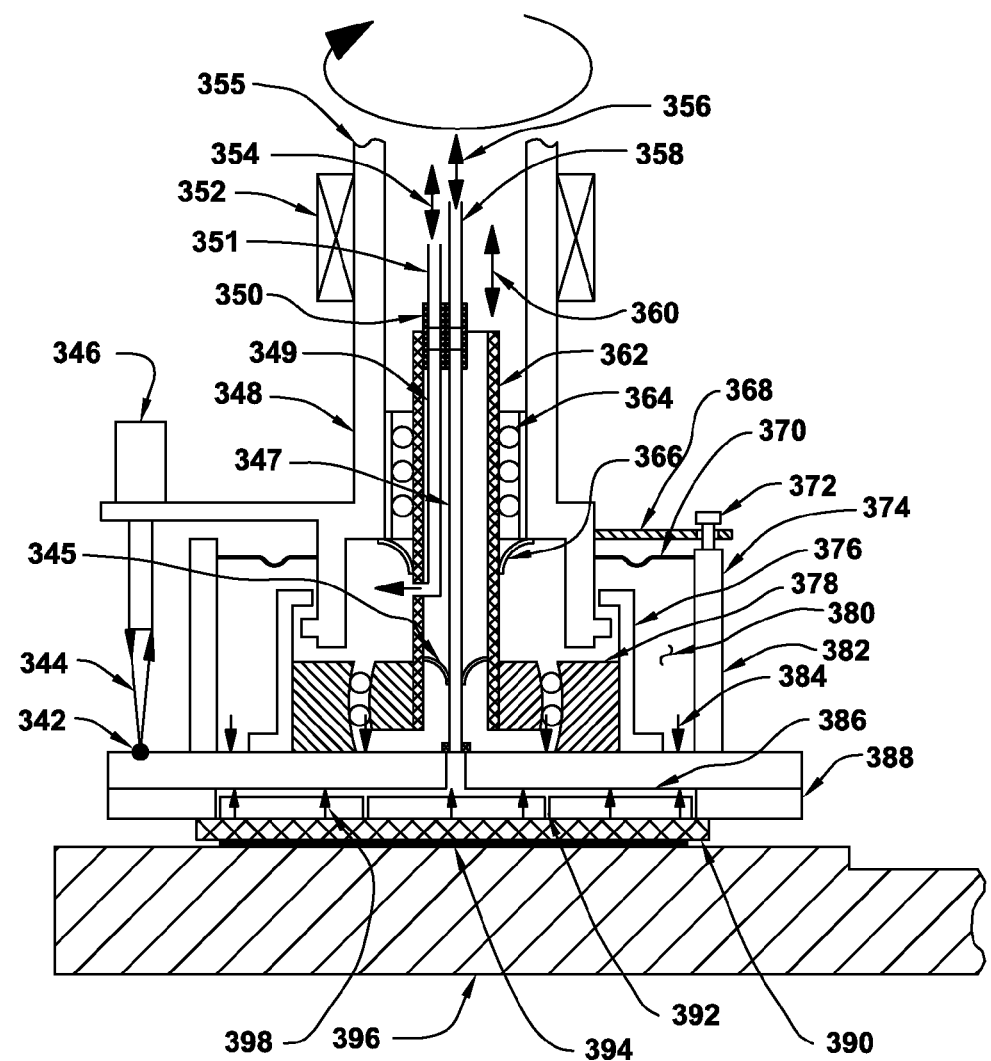
FIG. 11 is a cross section view of a floating workpiece carrier with position measurement.

FIG. 11 is a cross section view of a floating workpiece carrier with position measurement devices. A stationary workpiece carrier head 355 has a flat-surfaced workpiece 390 that is attached by vacuum to a floating workpiece carrier rotor 388 that is rotationally driven by a drive-pin device 372. A vertical hollow drive shaft 362 is supported by liner-motion bearings 364 that are supported by a rotatable stationary-positioned rotatable carrier housing 348 where the rotatable carrier housing 348 is held stationary in a vertical position by bearings 352.

A nominally-rigid rotational drive arm 368 is attached to the hollow drive shaft 362 where rotation of the hollow drive shaft 362 rotates the rotational drive arm 368. The drive-pin device 372 is attached a rigid annular member 374 that is attached to the workpiece carrier rotor 388 which allows the rotational drive arm 368 and the drive-pin device 372 to rotationally drive the workpiece carrier rotor 388. The rigid annular member 374 also can be used as a sealed annular wall 382 that is used to form a sealed pressure or vacuum chamber 380. The workpiece carrier rotor 388 has an attached spherical bearing 378 which allows the workpiece carrier rotor 388 to be tilted while the stationary-positioned carrier housing 348 rotates.

An annular flexible diaphragm device 370 that is attached to the carrier housing 348 is also attached to the rigid annular member 374 where the flexible diaphragm device 370 flexes both horizontally and vertically. Here, the flexible diaphragm device 370 allows the workpiece carrier rotor 388 to be translated vertically by moving the hollow drive shaft 362 vertically relative to the rotatable carrier housing 348. The flexible diaphragm device 370 also allows the workpiece carrier rotor 388 to be tilted relative to the rotatable carrier housing 348. To provide more vertical and radial flexibility to the flexible diaphragm device 370, the flexible diaphragm device 370 can have an annular non-flat pleated-type surface.

The workpiece carrier rotor 388 can be moved vertically and tilted relative to the carrier housing 348 where the spherical bearing 378 allows the workpiece carrier rotor 388 to be tilted and the spherical bearing 378 restrains the workpiece carrier rotor 388 radially. Because the carrier rotor 388 nominally rotates with the carrier housing 348, as controlled by the drive-pin device 372, the spherical bearing 378 nominally does not rotate about a vertical axis but does provide spherical-action rotation of the carrier housing 348.

The workpiece carrier rotor 388 can be tilted due to numerous causes including: flat-surfaced workpiece 390 that have non-parallel opposed surfaces; misalignment of components of the stationary workpiece carrier head 355; misalignment of other components of the abrading machine (not shown); and a platen 396 that has an abrading surface 394 that is not flat.

Pressurized air or other fluid such as water or vacuum 354 is supplied through a hollow tube 351 which is located within the carrier housing 348 where one end of the hollow tube 351 is fluid-coupled with a fluid rotary union (not shown). A hollow tube 347 that provides vacuum 356 through the flexible hollow tube 358 is coupled with a multi-port slidable fluid coupling 350 to a tube 347 that supplies the vacuum 356 to the carrier rotor 388 workpiece 390 attachment vacuum port holes 392. The multi-port slidable fluid coupling 350 also connects and transmits the pressure or vacuum 354 to the hollow tubing 351 to supply the pressure 354 to the pressure chamber 380 or multiple independent pressures and vacuums to multiple pressure chambers (not shown). The multi-port slidable fluid coupling 350 allows the carrier rotor 388 to move vertically relative to the rotatable carrier housing 348.

The pressurized air 354 in the hollow tube 351 is coupled with a sealed chamber 380 that is formed by the sealed annular flexible diaphragm device 370. This controlled pressure of the fluid 354 is present in the sealed chamber 380 to provide uniform abrading pressure 384 across the top surface of the carrier rotor 388 where the uniform abrading pressure 384 pressure is directly transmitted to the workpiece 390 abraded surface that is in abrading contact with the flat-surfaced abrasive 394 coating on the rotary platen 396.

When the sealed chamber 380 is pressurized by a fluid 354, the carrier rotor 388 can move vertically downward in a direction 360 to bring the workpiece 390 into abrading contact with the flat-surfaced abrasive 394 coating on the rotary platen 396. Likewise, when vacuum is applied to the sealed chamber 380, the carrier rotor 388 can be moved vertically upward in a direction 360 by the vacuum to move the workpiece 390 from abrading contact with the flat-surfaced abrasive 394 coating on the rotary platen 396.

Workpieces such as wafers 390 are attached with vacuum 398 that is applied to the workpiece surfaces through vacuum port holes 392 that have a common vacuum passageway 386 in the carrier rotor 388 which is fluid-connected with a vacuum source 356 that is routed to the vacuum passageway 386 by a flexible hollow tube 358. The flexible hollow tube 358 flexes near the attachment point to the carrier rotor 388 as the carrier rotor 388 is tilted. The workpiece 390 is firmly attached to the carrier rotor 388 by the large attachment pressure created by the vacuum 398. The flexible hollow tube 358 is fluid-coupled with the fluid rotary union. Air pressure can also be supplied through the rotary union in the same passageways 392 to provide pressurized separation of the adhesion-attached workpiece 390 from the workpiece carrier rotor 388 upon completion of the abrading action on the workpiece 390.

When the flat-surfaced workpieces 390 and the workpiece carrier rotor 388 are subjected to horizontal abrading friction forces that are parallel to the abraded surface of the workpieces 390, the workpieces remain firmly attached in-place on the workpiece carrier rotor 388. These abrading friction forces are resisted by the workpiece carrier rotor 388 as it is held radially in place by the spherical bearing 378 which is held radially by the hollow drive shaft 362 which is supported by the rotatable carrier housing 348.

An annular seal device 366 prevents leakage of pressurized air from the sealed chamber 380 along the linear bearing 364 in the annular area between the hollow drive shaft 362 and the carrier housing 348. Another annular seal device 345 prevents leakage of pressurized air from the sealed chamber 380 in the annular area between the inner diameter of the hollow drive shaft 362 and the flexible hollow tube 358.

The rigid rotation drive arm member 368 is attached to at least one individual drive-pin device 372 that is in sliding contact with the drive arm member 368 where the at least one individual drive-pin device 372 and the radial arm 368 are used to rotate the carrier rotor 388. The vertical and horizontal sliding action between the sliding-contact drive-pin device 372 and the radial arm 368 provide motion of the workpiece carrier rotor 388 in a vertical direction along the hollow drive shaft 362 rotation axis as changes in the air or fluid 354 pressure (or vacuum) 384 present in the sealed chamber 380 causes vertical motion of the workpiece rotor 388. An annular bracket 376 is used to limit the vertical excursion distances of the workpiece rotor 388.

Multiple distance measurement devices 346 can be positioned around the outer periphery of the stationary-positioned rotatable carrier housing 348 and can be used to provide independent measurements of the distances between the measurement devices 346 and the workpiece rotor 388. The measurement distances 346 are equivalently measured from the stationary carrier housing 348 to selected area spots 342 located on a surface of the floating workpiece carrier rotor 388 which the workpiece 390 is attached to. Non-contacting ultrasonic or laser distance measuring sensors devices 346 or contact-type mechanical or electronic measuring devices including calipers, vernier calipers, micrometers and linear variable differential transformers (LVDT) can be used to measure the distances. A non-contacting measuring device 346 emits and receives rays or signals 344 that indicate the distances.

The measurement devices 346 can be used to position the floating workpiece carrier rotor 388 at the start of an abrading operation at a center-position half way between the vertical excursion-stop devices (not shown) which limit the vertical distances that the floating workpiece carrier rotor 388 can travel vertically during an abrading operation. Measurement devices 346 can also be used to actively determine the amount of material removal and the rate at which it is removed from workpieces 390 during an abrading process. Further, measurement devices 346 can be used sense the existence of vibrations, oscillations or other dynamic events during an abrading operation and data from these measurement devices 346 can be used to stop the abrading action, stop the rotation of either the workpiece carrier rotor 388 or the rotary platen 396 or activate a system that quickly raises the workpieces 390 from contact with the platen 396 abrasive coating 394 as the platen 396 is rotating.

Figure 12:
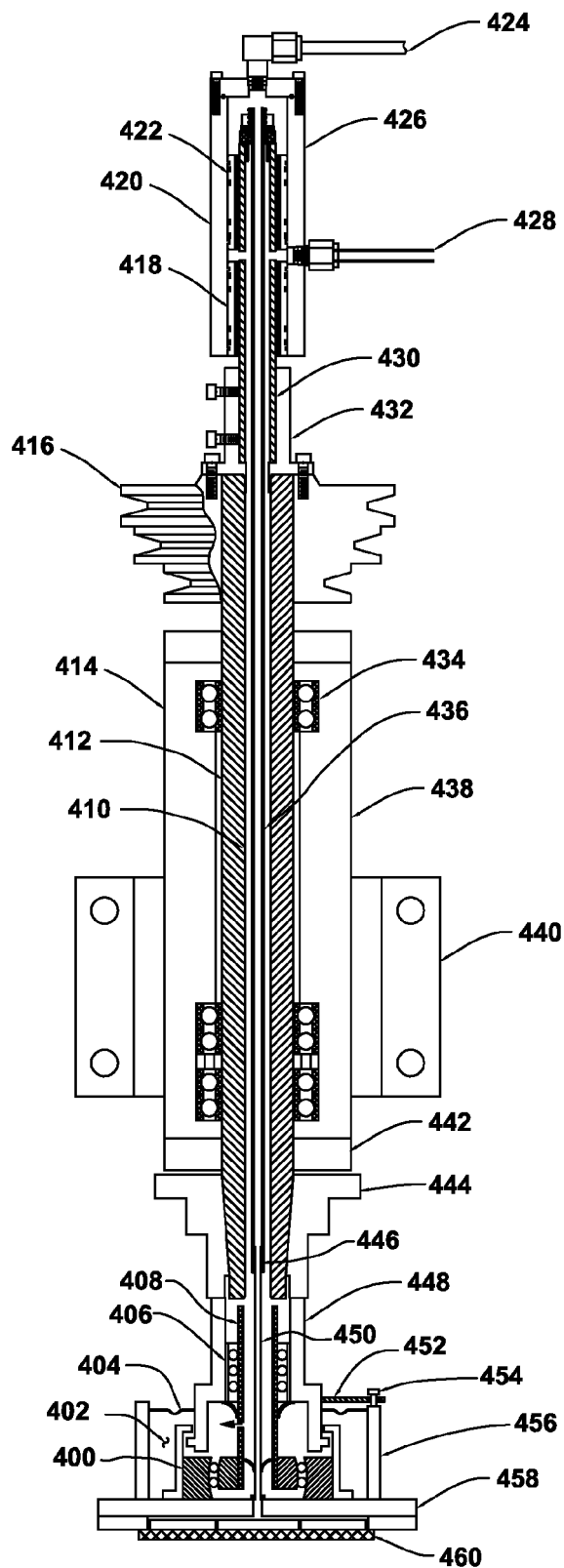
FIG. 12 is a cross section view of a diaphragm floating workpiece carrier and driven spindle.

FIG. 12 is a cross section view of a sliding pin flexible annular diaphragm floating workpiece carrier that is supported by a driven spindle. The workpiece rotor 458 has an outer diameter having a spherical-shaped surface that is supported laterally (horizontally) by idlers (not shown). The workpiece carrier plate 458 has a vacuum-attached workpiece 460 and the carrier plate 458 is attached to a rotary workpiece carrier housing 448 by a sliding pin drive arm 452 that is in sliding contact with a sliding pin 454 that is attached to a sliding pin bracket 456 that is attached to the workpiece rotor 458. Here, the sliding pin 454 moves in a vertical direction along the axis of the rotary spindle 414 rotary spindle shaft 412. The sliding pin drive device 452 is stiff in a tangential direction relative to the axis of the rotary spindle 414 rotary spindle shaft 412 where the sliding pin drive device 452 provides rotation of the workpiece rotor 458.

The cylindrical cartridge-type spindle 414 that is supported by a clamp-type device 440 has a V-belt pulley 416 attached to the spindle shaft 412 where the spindle shaft 412 rotates the rotary carrier housing 448 and a flexible annular diaphragm 404 is attached to the spindle drive shaft 412 and to an annular wall 456 that is attached to the workpiece rotor 458 The flexible annular diaphragm 404 flexes in a vertical direction along the axis of the rotary spindle 414 rotary spindle shaft 412. The spindle 414 v-belt pulley 416 is driven by a drive motor (not shown) and rotary drive torque is transmitted to the floating workpiece carrier rotor 458 by the sliding pin drive device 452.

Vacuum is supplied to the spindle 414 at the stationary hollow tube 424 that is supported by the air bearing housing 426 where the vacuum applied at the vacuum tube 424 is routed through a hollow tube 436 to a pneumatic tube sliding coupling 446 which supplies vacuum to a flexible tube 450. The free end of the hollow flexible tube 450 is inserted some distance into the hollow tube 436 where the flexible tube 450 can slide vertically a selected distance in the hollow tube 436. Also a fluid seal (not shown) is use to seal the vacuum or pressure 424 from leakage in the sliding-joint coupling 446. Other fluid passageways (not shown) that transmit fluids or vacuum from the multi-port fluid rotary union 426 to the carrier head 444 can use the same types of individual sliding fluid couplers 446 or independent multi-joint slide-action coupler devices 446 can be used to accommodate multiple fluid passageways.

Here, the tube 450 sliding action of the pneumatic tube sealed sliding coupling 446 allows the floating workpiece carrier rotor 458 to move vertically relative to the rotary workpiece carrier housing 448. Also the hollow tube 436 supplies vacuum to the flexible tube 450 which supplies vacuum to the floating workpiece carrier rotor 458 to attach the workpiece 460 to the carrier rotor 458. The flexible tube 450 also allows the floating workpiece carrier rotor 458 to tilt relative to the rotary workpiece carrier housing 448 which is attached to the carrier head 444 which is attached to the rotary spindle 414 rotary spindle shaft 412.

Air bearings 418, 422 are supported by an air bearing housing 420 which surround a precision-diameter hollow shaft 430 that is supported by a shaft mounting device 432 that is attached to the drive pulley 416. A gap space is present between the two axially mounted air bearings 418 and 422 to allow pressurized air supplied by the tubing 428 to enter radial port holes in the hollow air bearing shaft 430 to transmit the controlled-pressure air through the annular passage between the vacuum tube 436 and the spindle shaft 412 internal through-hole 410. The hollow shaft 430, the air bearings 418 and 422 and the air bearing housing 420 act together as a friction-free non-contacting high speed multi-port fluid rotary union 426.

The pressurized air supplied by the tubing 428 enters the sealed annular diaphragm chamber 402 to provide abrading pressure which forces the workpiece 460 against an abrasive surface (not shown) on a rotary platen (not shown). When air pressure is applied to the annular diaphragm chamber 402, the flexible annular diaphragm 404 is flexed downward to move the workpiece 460 downward in a vertical direction along the rotation axis of the rotary spindle 414 rotary spindle shaft 412 that is supported by bearings 434 attached to the spindle housing 438. Vacuum can also be applied at the tubing 428 to develop a negative pressure in the sealed annular diaphragm chamber 402 which distorts the annular diaphragm 404 in a vertical direction and raises the carrier head 444 and the workpiece 460 away from abrading contact with the platen abrasive surface.

The spindle 414 is shown as a cartridge-type spindle which is a standard commercially available unit that can be provided by a number of vendors including GMN USA of Farmington, Conn. A rectangular block-type spindle 414 having the same spindle moving components can also be provided by a number of vendors including Gilman USA of Grafton, Wis. The spindles 414 can be belt driven units or they can have integral drive motors. Spindles 414 can have a flat-surfaced moving spindle end plate 442 or the spindle 414 can have drive shafts 412 with internal or external tapered shaft ends that can be used to attach the carrier head 444.

The vertical support shaft 408 that is supported by at least one shaft bearing 406 that is attached to the rotary workpiece carrier housing 448 that is attached to the carrier head rotatable drive housing 444 where the shaft bearing 406 allows the vertical support shaft 408 to move vertically relative to the workpiece carrier housing 448 and the shaft bearing 406 restrains the vertical support shaft 408 in a radial direction that is perpendicular to the rotatable drive housing 444 rotation axis.

A spherical-action bearing 400 has an inner race and an outer race where the inner race of the spherical-action bearing is attached to the vertical support shaft 408 and the outer race of the spherical-action bearing 400 is attached to the workpiece carrier plate 458 where the spherical-action bearing 400 allows the workpiece carrier plate 458 to be tilted relative to the rotatable drive housing 448. The spherical-action bearing 400 also restrains the workpiece carrier plate 458 in radial direction that is nominally-perpendicular to the workpiece carrier plate 458. And the spherical-action bearing 400 maintains the floating circular workpiece carrier plate 458 rotation axis to be nominally concentric with the carrier drive shaft 412 axis of rotation.

Figure 13:
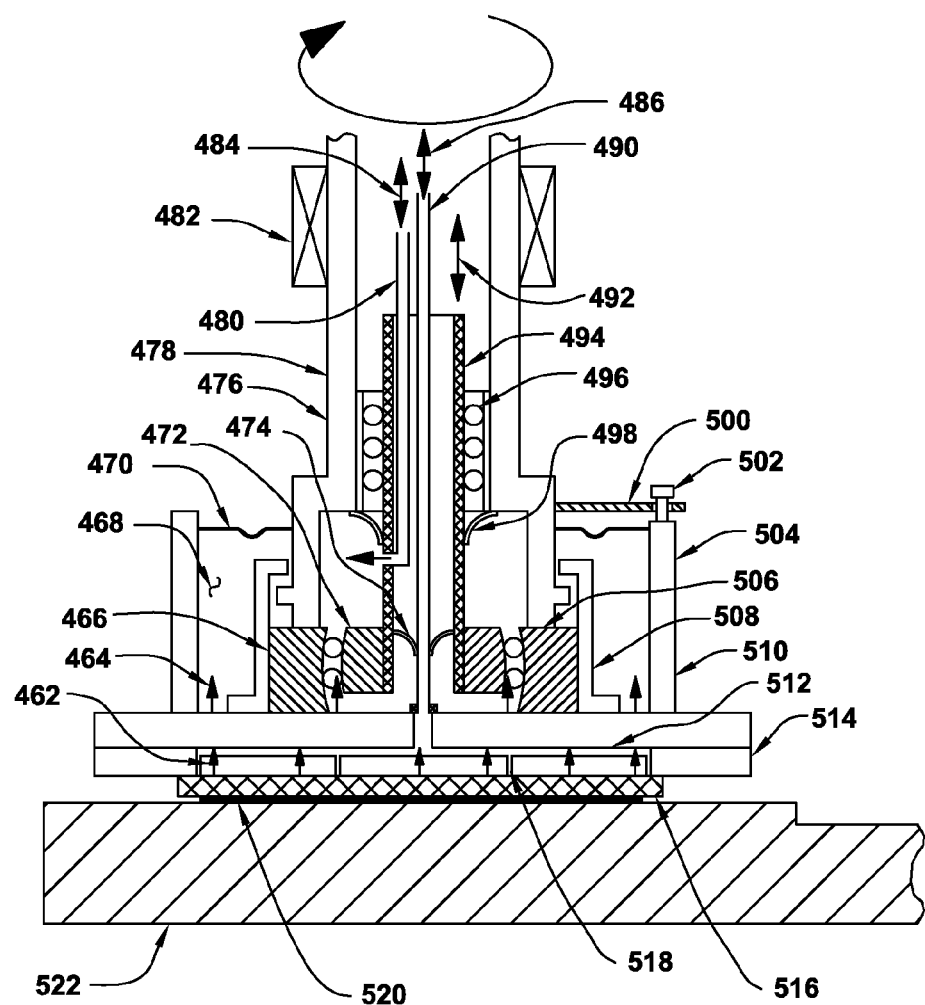
FIG. 13 is a cross section view of a diaphragm floating carrier in a rigid abrading mode.

FIG. 13 is a cross section view of a diaphragm floating carrier in a rigid abrading mode. A stationary workpiece carrier head 478 has a flat-surfaced workpiece 516 that is attached by vacuum to a floating workpiece carrier rotor 514 that is rotationally driven by a drive-pin device 502. A vertical hollow drive shaft 494 is supported by liner-motion bearings 496 that are supported by a stationary-positioned rotatable carrier housing 476 where the rotatable carrier housing 476 is held stationary in a vertical position by bearings 482.

A nominally-rigid rotational drive arm 500 is attached to the hollow drive shaft 494 where rotation of the hollow drive shaft 494 rotates the rotational drive arm 500. The drive-pin device 502 is attached a rigid annular member 504 that is attached to the workpiece carrier rotor 514 which allows the rotational drive arm 500 and the drive-pin device 502 to rotationally drive the workpiece carrier rotor 514. The rigid annular member 504 also can be used as a sealed annular wall 510 that is used to form a sealed pressure or vacuum chamber 468. The workpiece carrier rotor 514 has an attached spherical bearing 472 which allows the workpiece carrier rotor 514 to be tilted while the stationary-positioned carrier housing 476 rotates.

An annular flexible diaphragm device 470 that is attached to the carrier housing 476 is also attached to the rigid annular member 504 where the flexible diaphragm device 470 flexes both horizontally and vertically. Here, the flexible diaphragm device 470 allows the workpiece carrier rotor 514 to be translated vertically by moving the hollow drive shaft 494 vertically relative to the rotatable carrier housing 476. The flexible diaphragm device 470 also allows the workpiece carrier rotor 514 to be tilted relative to the rotatable carrier housing 476. To provide more vertical and radial flexibility to the flexible diaphragm device 470, the flexible diaphragm device 470 can have an annular non-flat pleated-type surface.

The workpiece carrier rotor 514 can be moved vertically and tilted relative to the carrier housing 476 where the spherical bearing 472 allows the workpiece carrier rotor 514 to be tilted and the spherical bearing 472 restrains the workpiece carrier rotor 514 radially. Because the carrier rotor 514 nominally rotates with the carrier housing 476, as controlled by the drive-pin device 502, the spherical bearing 472 nominally does not rotate about a vertical axis but does provide spherical-action rotation of the carrier housing 476.

The workpiece carrier rotor 514 can be tilted due to numerous causes including: flat-surfaced workpiece 516 that have non-parallel opposed surfaces; misalignment of components of the stationary workpiece carrier head 478; misalignment of other components of the abrading machine (not shown); and a platen 522 that has an abrading surface 520 that is not flat.

Pressurized air or other fluid such as water or vacuum 484 is supplied through a hollow tube 480 which is located within the carrier housing 476 where one end of the hollow tube 480 is fluid-coupled with a fluid rotary union (not shown). The pressurized air 484 in the hollow tube 480 is coupled with a sealed chamber 468 that is formed by the sealed annular flexible diaphragm device 470. In the rigid mode of abrading, the controlled vacuum 484 is present in the sealed chamber 468 to provide uniform lifting force across the top surface of the carrier rotor 514 which raises the carrier rotor 514 until the top surface of the bearing race of the spherical bearing 466 contacts the rigid carrier housing 476 at a contact point 506.

When the sealed chamber 468 is pressurized by a fluid 484, the carrier rotor 514 can move vertically downward in a direction 492 to bring the workpiece 516 into abrading contact with the flat-surfaced abrasive 520 coating on the rotary platen 522. Likewise, when vacuum is applied to the sealed chamber 468, the carrier rotor 514 can be moved vertically upward in a direction 492 by the vacuum to move the workpiece 516 from abrading contact with the flat-surfaced abrasive 520 coating on the rotary platen 522.

Workpieces such as wafers 516 are attached with vacuum 462 that is applied to the workpiece surfaces through vacuum port holes 518 that have a common vacuum passageway 512 in the carrier rotor 514 which is fluid-connected with a vacuum source 486 that is routed to the vacuum passageway 512 by a flexible hollow tube 490. The flexible hollow tube 490 flexes near the attachment point to the carrier rotor 514 as the carrier rotor 514 is tilted. The workpiece 516 is firmly attached to the carrier rotor 514 by the large attachment pressure created by the vacuum 462. The flexible hollow tube 490 is fluid-coupled with the fluid rotary union. Air pressure can also be supplied through the rotary union in the same passageways 518 to provide pressurized separation of the adhesion-attached workpiece 516 from the workpiece carrier rotor 514 upon completion of the abrading action on the workpiece 516.

When the flat-surfaced workpieces 516 and the workpiece carrier rotor 514 are subjected to horizontal abrading friction forces that are parallel to the abraded surface of the workpieces 516, the workpieces remain firmly attached in-place on the workpiece carrier rotor 514. These abrading friction forces are resisted by the workpiece carrier rotor 514 as it is held radially in place by the spherical bearing 472 which is held radially by the hollow drive shaft 494 which is supported by the rotatable carrier housing 476.

An annular seal device 498 prevents leakage of pressurized air from the sealed chamber 468 along the linear bearing 496 in the annular area between the hollow drive shaft 494 and the carrier housing 476. Another annular seal device 474 prevents leakage of pressurized air from the sealed chamber 468 in the annular area between the inner diameter of the hollow drive shaft 494 and the flexible hollow tube 490.

The rigid rotation drive arm member 500 is attached to at least one individual drive-pin device 502 that is in sliding contact with the drive arm member 500 where the at least one individual drive-pin device 502 and the radial arm 500 are used to rotate the carrier rotor 514. The vertical and horizontal sliding action between the sliding-contact drive-pin device 502 and the radial arm 500 provide motion of the workpiece carrier rotor 514 in a vertical direction along the hollow drive shaft 494 rotation axis as changes in the air or fluid 484 pressure (or vacuum) 464 present in the sealed chamber 468 causes vertical motion of the workpiece rotor 514. An annular bracket 508 is used to limit the vertical excursion distances of the workpiece rotor 514.

The stationary workpiece carrier head 478 can be quickly switched between "floating" and "rigid" abrading modes by simply applying vacuum to the sealed chamber 468 that is located inside the body of the workpiece carrier head 478 instead of the pressure 484 that applies an abrading force 464. This vacuum forces the rotary workpiece carrier 514 into rigid contact with the rigid carrier housing 476 by the bearing race of the spherical bearing 466 contacting the rigid carrier housing 476 at a contact point 506. The surfaces of both the bearing race of the spherical bearing 466 and the contacting annular end of the rigid carrier housing 476 at the contact point 506 are configured where both of these surfaces are configured to be precisely perpendicular to the workpiece carrier head 478 rotating workpiece spindle (not shown) spindle shaft (not shown) rotation axis.

Here, the workpiece-attachment surface of the workpiece carrier 514 is also configured to be precisely aligned perpendicular with the workpiece spindle rotation axis. Because the workpiece is rigidly attached to the rigid workpiece carrier 514 attachment surface, the exposed abraded surface of the workpiece 516 can be abraded precisely parallel to the workpiece carrier 514 workpiece attachment surface by the rotating platen 522 moving abrasive 520 when the abrading head 478 is moved vertically downward and the workpiece 516 is in abrading contact with the flat-surfaced abrasive 520 coating on the rotary platen 522. As a result of the rigid-mode of abrading, the abraded surface of the workpiece 516 is precisely parallel with the opposed surface of the workpiece that is vacuum-attached to the workpiece carrier 514.

Figure 14:
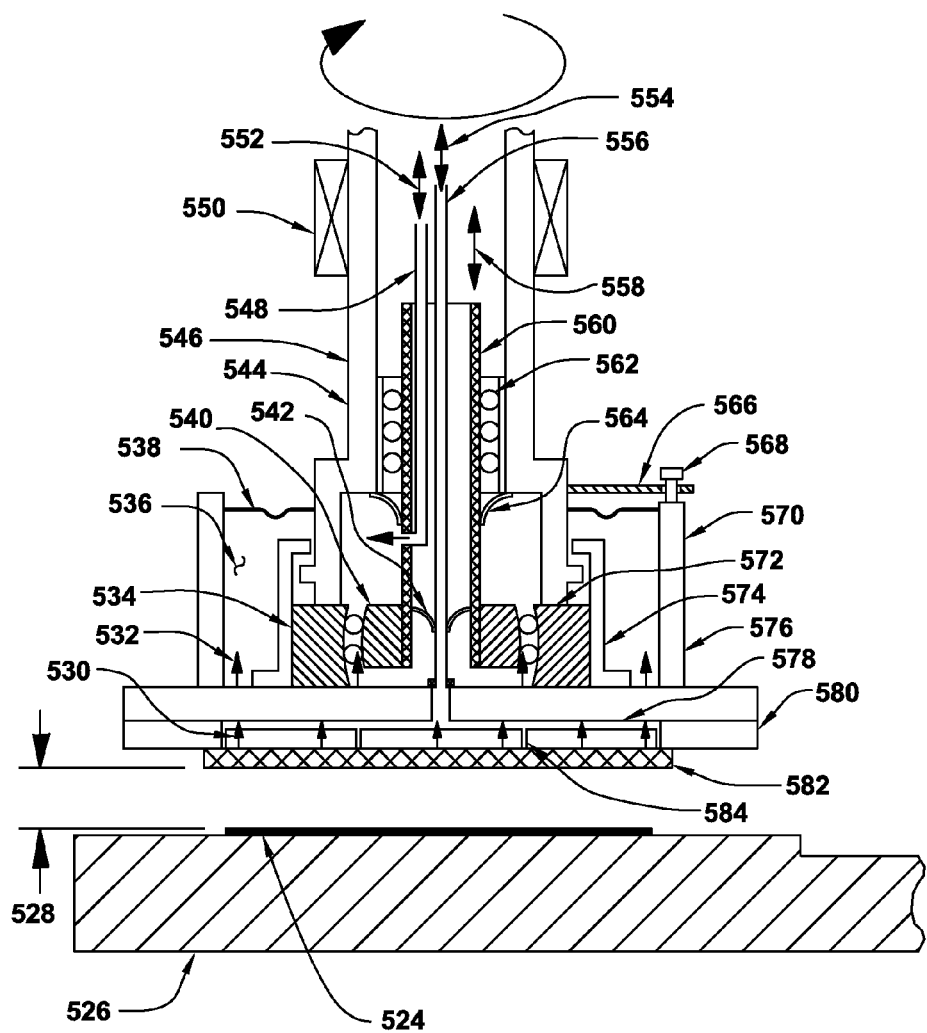
FIG. 14 is a cross section view of a diaphragm workpiece carrier with a raised workpiece.

FIG. 14 is a cross section view of a sliding drive pin flexible diaphragm workpiece carrier with a raised workpiece. A stationary workpiece carrier head 546 has a flat-surfaced workpiece 582 that is attached by vacuum to a floating workpiece carrier rotor 580 that is rotationally driven by a drive-pin device 568. A vertical hollow drive shaft 560 is supported by liner-motion bearings 562 that are supported by a stationary-positioned rotatable carrier housing 544 where the rotatable carrier housing 544 is held stationary in a vertical position by bearings 550.

A nominally-rigid rotational drive arm 566 is attached to the hollow drive shaft 560 where rotation of the hollow drive shaft 560 rotates the rotational drive arm 566. The drive-pin device 568 is attached a rigid annular member 570 that is attached to the workpiece carrier rotor 580 which allows the rotational drive arm 566 and the drive-pin device 568 to rotationally drive the workpiece carrier rotor 580. The rigid annular member 570 also can be used as a sealed annular wall 576 that is used to form a sealed pressure or vacuum chamber 536. The workpiece carrier rotor 580 has an attached spherical bearing 540 which allows the workpiece carrier rotor 580 to be tilted while the stationary-positioned carrier housing 544 rotates.

An annular flexible diaphragm device 538 that is attached to the carrier housing 544 is also attached to the rigid annular member 570 where the flexible diaphragm device 538 flexes both horizontally and vertically. Here, the flexible diaphragm device 538 allows the workpiece carrier rotor 580 to be translated vertically by moving the hollow drive shaft 560 vertically relative to the rotatable carrier housing 544. The flexible diaphragm device 538 also allows the workpiece carrier rotor 580 to be tilted relative to the rotatable carrier housing 544. To provide more vertical and radial flexibility to the flexible diaphragm device 538, the flexible diaphragm device 538 can have an annular non-flat pleated-type surface.

The workpiece carrier rotor 580 can be moved vertically and tilted relative to the carrier housing 544 where the spherical bearing 540 allows the workpiece carrier rotor 580 to be tilted and the spherical bearing 540 restrains the workpiece carrier rotor 580 radially. Because the carrier rotor 580 nominally rotates with the carrier housing 544, as controlled by the drive-pin device 568, the spherical bearing 540 nominally does not rotate about a vertical axis but does provide spherical-action rotation of the carrier housing 544.

Pressurized air or other fluid such as water or vacuum 552 is supplied through a hollow tube 548 which is located within the carrier housing 544 where one end of the hollow tube 548 is fluid-coupled with a fluid rotary union (not shown). The pressurized air 552 in the hollow tube 548 is coupled with a sealed chamber 536 that is formed by the sealed annular flexible diaphragm device 538. In the rigid mode of abrading, the controlled vacuum 552 is present in the sealed chamber 536 to provide uniform lifting force across the top surface of the carrier rotor 580 which raises the carrier rotor 580 until the top surface of the bearing race of the spherical bearing 534 contacts the rigid carrier housing 544 at a contact point 572.

Workpieces such as wafers 582 are attached with vacuum 530 that is applied to the workpiece surfaces through vacuum port holes 518 that have a common vacuum passageway 578 in the carrier rotor 580 which is fluid-connected with a vacuum source 554 that is routed to the vacuum passageway 578 by a flexible hollow tube 556. The flexible hollow tube 556 flexes near the attachment point to the carrier rotor 580 as the carrier rotor 580 is tilted. The workpiece 582 is firmly attached to the carrier rotor 580 by the large attachment pressure created by the vacuum 530.

An annular seal device 564 prevents leakage of vacuum from the sealed chamber 536 along the linear bearing 562 in the annular area between the hollow drive shaft 560 and the carrier housing 544. Another annular seal device 542 prevents leakage of vacuum from the sealed chamber 536 in the annular area between the inner diameter of the hollow drive shaft 560 and the flexible hollow tube 556.

The rigid rotation drive arm member 566 is attached to at least one individual drive-pin device 568 that is in sliding contact with the drive arm member 566 where the at least one individual drive-pin device 568 and the radial arm 566 are used to rotate the carrier rotor 580. The vertical and horizontal sliding action between the sliding-contact drive-pin device 568 and the radial arm 566 provide motion of the workpiece carrier rotor 580 in a vertical direction along the hollow drive shaft 560 rotation axis as changes in the air or fluid 552 pressure (or vacuum) 532 present in the sealed chamber 536 causes vertical motion of the workpiece rotor 580. An annular bracket 574 is used to limit the vertical excursion distances of the workpiece rotor 580.

When vacuum is applied to the sealed chamber 536, the carrier rotor 580 can be moved vertically upward in a direction 558 by the vacuum to move the workpiece 582 from abrading contact with the flat-surfaced abrasive 524 coating on the rotary platen 526. This vacuum forces the rotary workpiece carrier 580 into rigid contact with the rigid carrier housing 544 by the bearing race of the spherical bearing 534 contacting the rigid carrier housing 544 at a contact point 572. The surfaces of both the bearing race of the spherical bearing 534 and the contacting annular end of the rigid carrier housing 544 at the contact point 572 are configured where both of these surfaces are configured to be precisely perpendicular to the workpiece carrier head 546 rotating workpiece spindle (not shown) spindle shaft (not shown) rotation axis.

Use of the vacuum 552 in the sealed pressure chamber 536 provides a controlled distance 528 between the abraded surface of the workpiece 582 and the abrading surface of the abrasive coating 524 on the rotating platen 526. The workpiece 582 can be raised very quickly, especially with the use of a vacuum surge tank (not shown) that is located directly adjacent to the fluid rotary union (not shown) which can provide a substantial amount of vacuum 552 very quickly to the pressure chamber 536. Raising of the workpiece 582 from abrading contact with the abrasive coating 524 can be activated by an abrading process controller device (not shown) at selected times in the abrading process or an expensive workpiece 582 such as a semiconductor wafer can be raised in response to vibration or other dynamic event sensors (not shown) that are used to monitor the abrading operation.

This fast-action rising of the workpieces 582 is desirable to quickly interrupt an abrading process even when the workpiece 582 and the workpiece carrier rotor 580 are rotating at high speeds which occur in high speed abrading operations. Here, the abrading platens 526 and rotary workpiece carriers 580 can remain at the high speeds, or they can be slowed down, when the rotary workpiece carriers 580 and the workpieces 582. are raised. The vacuum 530 keeps the workpieces 582 strongly-clamped to the workpiece carriers 580 during this workpiece 582 raising event.

Figure 15:
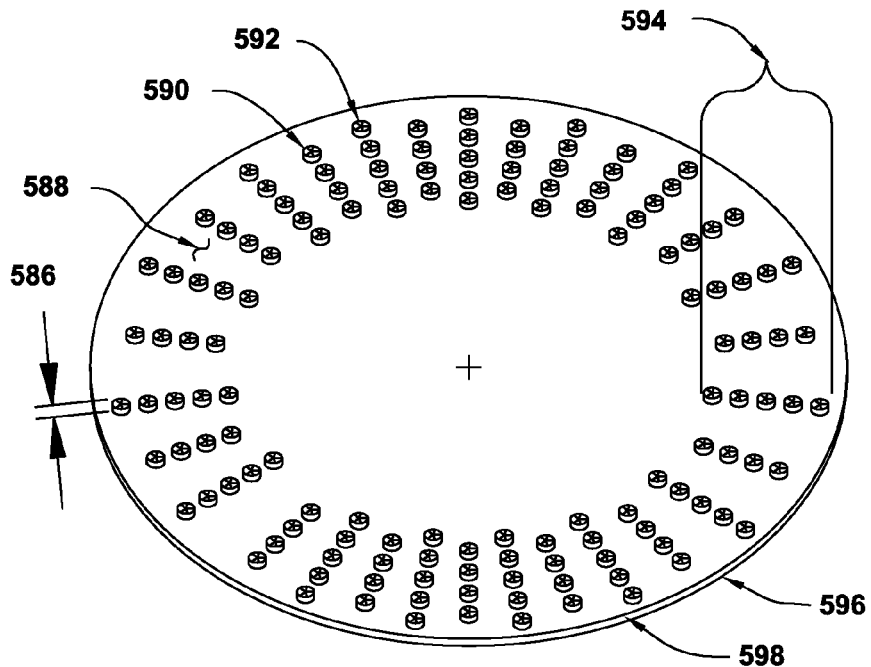
FIG. 15 is an isometric view of an abrasive disk with an annual band of raised islands.

FIG. 15 is an isometric view of an abrasive disk with an annual band of raised islands. A flexible abrasive disk 596 has attached raised island structures 590 that are top-coated with abrasive particles 592 where the island structures 590 are attached to a disk 596 transparent or non-transparent backing 598. The raised-island disk 596 has annular bands of abrasive-coated 592 raised islands 590 where the annular bands have a radial width of 594. Each island 590 has a typical width 586. The islands 590 can be circular as shown here or can have a variety of shapes comprising radial bars (not shown) where the abrasive-coated 592 raised islands 590 allow the abrasive disks 596 to be used successfully at very high abrading speeds in the presence of coolant water without hydroplaning of the workpieces (not shown). There are channel gap openings 588 that exist on the abrasive disk 596 between the raised island structures 590.

For high speed flat lapping or polishing, the abrasive disk 596 has an overall thickness variation, as measured from the top of the abrasive-coated 592 raised islands 590 to the bottom surface of the abrasive disk backing 598, that is typically less than 0.0001 inches 0.254 micron). This abrasive disk 596 precision surface flatness is necessary to provide an abrasive coating that is uniformly flat across the full annular band abrading surface of the abrasive disk 596 which allows the abrasive disk 596 to be used at very high abrading speeds of 10,000 surface feet (3,048 m) per minute or more. These high abrading speeds are desirable as the workpiece material removal rate is directly proportional to the abrading speeds.

Figure 16:
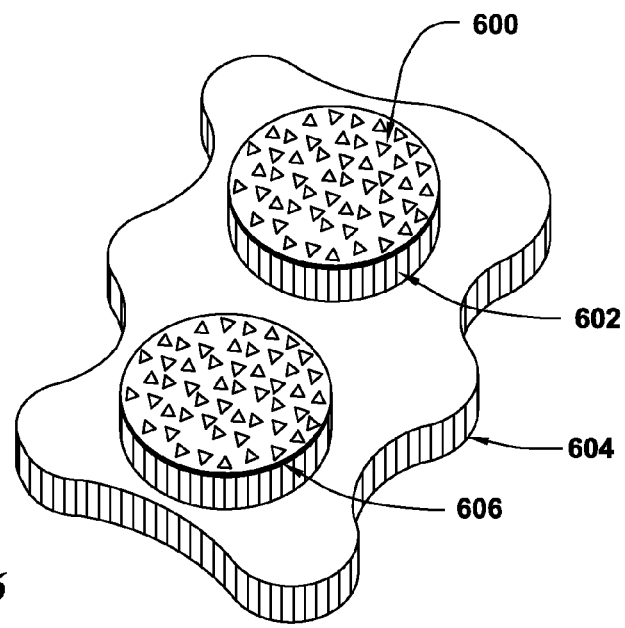
FIG. 16 is an isometric view of a portion of an abrasive disk with individual raised islands.

FIG. 16 is an isometric view of a portion of an abrasive disk with individual raised islands. A transparent or non-transparent backing sheet 604 has raised island structures 602 that are top-coated with a solidified abrasive-slurry layer mixture 606 which is filled with abrasive particles 600. The fixed-abrasive coating 606 on the raised islands 602 includes individual abrasive particles 600 or ceramic spherical beads (not shown) that are filled with very small diamond, cubic boron nitride (CBN) or aluminum oxide abrasive particles. The sizes of the abrasive particles 600 contained in the beads ranges from 60 microns to submicron sizes where the smaller sizes are typically used to polish semiconductor wafers.

The abrading machine floating workpiece substrate carrier apparatus and processes to use it are described here. A rotating platen abrasive lapping and polishing apparatus having a floating workpiece substrate carrier apparatus is described comprising:
a) a workpiece substrate carrier frame moveable in a vertical direction that supports an attached rotatable workpiece carrier spindle having a rotatable carrier drive shaft with a vertical rotatable carrier drive shaft axis of rotation;
b) a rotatable drive housing having a rotatable drive housing rotation axis wherein the rotatable drive housing is attached to the rotatable carrier drive shaft and the rotatable drive housing rotation axis is coincident with the rotatable carrier drive shaft axis of rotation;
c) a rotatable flexible annular diaphragm device with an annular diaphragm device annular surface, an annular diaphragm device outer periphery portion, an annular diaphragm device inner periphery portion and an axis of rotation that is nominally located at the radial center of the annular diaphragm device annular surface and that is nominally perpendicular to the annular diaphragm device annular surface, wherein the annular diaphragm device outer annular periphery portion is moveable relative to the annular diaphragm device inner annular periphery portion;
d) a floating circular rotatable workpiece carrier plate having a workpiece carrier plate top surface, an opposed nominally-horizontal workpiece carrier plate flat bottom surface, a workpiece carrier plate rotation axis that is nominally located at the radial center of the workpiece carrier plate bottom surface and is nominally-perpendicular to the workpiece carrier plate flat bottom surface wherein the floating circular rotatable workpiece carrier plate is movable relative to the rotatable drive housing in a nominally-vertical direction along the floating circular workpiece carrier plate rotation axis and can be tilted relative to the rotatable drive housing;
e) wherein the rotatable flexible annular diaphragm device inner annular periphery portion is attached to the rotatable drive housing and the rotatable flexible annular diaphragm device outer annular periphery portion is attached to the workpiece carrier plate and the rotatable flexible annular diaphragm device axis of rotation is nominally-coincident with the vertical rotatable carrier drive shaft axis of rotation and the rotatable flexible annular diaphragm device together with the rotatable drive housing and the workpiece carrier plate forms a sealed enclosed rotatable flexible annular diaphragm device abrading pressure chamber having an internal volume contained by the rotatable flexible annular diaphragm, the rotatable drive housing and the workpiece carrier plate;
f) a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and is configured to cause the workpiece carrier plate to be rotated by the rotatable drive housing;
g) a vertical support shaft that is supported by at least one shaft bearing that is attached to the rotatable drive housing wherein the at least one shaft bearing allows the vertical support shaft to move vertically relative to the rotatable drive housing and the at least one shaft bearing restrains the vertical support shaft in a radial direction that is perpendicular to the rotatable drive housing rotation axis;
h) a spherical-action bearing having a spherical-action bearing inner race and a spherical-action bearing outer race wherein the inner race of the spherical-action bearing is attached to the vertical support shaft and the outer race of the spherical-action bearing is attached to the workpiece carrier plate wherein the spherical-action bearing allows the workpiece carrier plate to be tilted relative to the rotatable drive housing and wherein the spherical-action bearing restrains the workpiece carrier plate in radial direction that is nominally-perpendicular to the workpiece carrier plate rotation axis and wherein the spherical-action bearing maintains the floating circular workpiece carrier plate rotation axis as nominally concentric with the carrier drive shaft axis of rotation;
i) a vacuum and fluid rotatable rotary union device that is attached to the rotatable workpiece carrier spindle wherein the vacuum and fluid rotatable rotary union device supplies vacuum or pressurized fluid through fluid passageways to vacuum port holes in the workpiece carrier plate that are open on the workpiece carrier plate flat bottom surface and wherein the vacuum and fluid rotatable rotary union supplies vacuum or pressurized fluid through fluid passageways to the sealed flexible-diaphragm pressure chamber;
j) wherein the floating circular rotatable workpiece carrier plate is movable relative to the workpiece substrate carrier frame in a nominally-vertical direction along the floating circular workpiece carrier plate rotation axis and can be tilted relative to the workpiece substrate carrier frame;
k) a flat-surfaced rotatable abrading platen where the flat surface of the rotatable abrading platen is nominally horizontal and has an abrasive coating;
l) wherein at least one workpiece having opposed workpiece nominally-flat top and bottom surfaces wherein the workpiece nominally-flat top surface is vacuum-attached to the workpiece carrier plate flat bottom surface and wherein the nominally-flat bottom surface of the at least one attached workpiece can be held in flat-surfaced abrading contact with the abrasive coating on the rotatable abrading platen.

In one embodiment, the rotary workpiece drive device comprises a rotatable drive housing bracket attached to the rotatable drive housing, and a workpiece carrier plate bracket attached to the workpiece carrier plate, wherein the rotatable drive housing bracket and the workpiece carrier plate bracket are in vertical and horizontal sliding contact with each other at a bracket sliding joint and wherein the rotary drive housing bracket can be rotated by the rotatable drive housing to transmit torque, measured about the rotatable drive housing rotation axis, through the bracket sliding joint to the workpiece carrier plate bracket to provide rotation of the workpiece carrier plate about the workpiece carrier plate rotation axis, and wherein the workpiece carrier plate is movable vertically in a direction along the workpiece carrier plate rotation axis and wherein the workpiece carrier plate can be tilted relative to the rotatable drive housing.

In another embodiment, the rotary workpiece drive device comprises:
a) at least one nominally-horizontal rotatable nominally-circular flexible support element having at least one individual flexible arm wherein each arm has a first proximal end secured to a central support ring, and a second distal end connected to the respective first proximal end by a flexing joint;

b) wherein the second distal end is flexible in a vertical direction but is stiff in a direction that is tangential to the nominally-circular flexible support element and wherein the flexible support element has a nominally-vertical rotatable flexible support element rotation axis located at a center of the nominally-circular flexible support element;

c) wherein the at least one rotatable nominally-circular flexible support element central support ring is attached to the rotatable drive housing and the at least one flexible support element second distal end is attached to the floating circular rotatable workpiece carrier plate and the at least one rotatable flexible support element rotation axis is coincident with the rotatable drive housing rotation axis; and d) the at least one rotatable nominally-circular flexible support element can be rotated by the rotatable drive housing to provide rotation of the workpiece carrier plate, and the workpiece carrier plate is movable vertically in a direction along the workpiece carrier plate rotation axis by flexing the at least one individual flexible radial arm in a vertical direction.

Also, the apparatus is described where the rotatable flexible annular diaphragm device comprises flexible materials selected from the group consisting of: elastomers, silicone rubber, room temperature vulcanizing silicone rubber, natural rubber, synthetic rubber, thermoset polyurethane, thermoplastic polyurethane, flexible polymers, composite materials, polymer-impregnated woven cloths, sealed fiber materials, laminated sheets of combinations thereof, sheets of impervious flexible materials, and metals.

In addition, the apparatus has pressure-controlled air, fluid or vacuum is accessible into the sealed flexible-diaphragm pressure chamber through a passageway connecting an air, fluid or vacuum passageway in the rotatable carrier drive shaft to the sealed flexible-diaphragm pressure chamber and wherein the pressure or vacuum present in the sealed flexible-diaphragm pressure chamber is sufficient to move the workpiece carrier plate vertically and wherein controlled pressure present in the sealed flexible-diaphragm pressure chamber applies a controlled abrading pressure to workpieces that are attached to the workpiece carrier plate that are in abrading contact with the rotatable abrading platen abrasive coated abrading surface.

Further, the workpiece carrier plate top surface is configured so that controlled vacuum applied to the sealed flexible-diaphragm pressure chamber generates a lifting force on the workpiece carrier plate capable of moving the workpiece carrier plate toward the rotatable drive housing thereby distorting the rotatable flexible annular diaphragm device in a direction along the flexible annular diaphragm device axis of rotation wherein the workpiece carrier plate and the at least one workpiece that is attached with vacuum to the workpiece carrier plate are moved vertically away from the rotatable abrading platen abrasive coated abrading surface.

In another embodiment, the rotatable drive housing bracket and the workpiece carrier plate bracket act together with mutual sliding contact to rotate the workpiece carrier plate in either clockwise and counterclockwise directions and to rotationally accelerate and decelerate the workpiece carrier and wherein the rotatable drive housing bracket and the workpiece carrier plate bracket act together to prevent substantial rotation of the workpiece carrier plate relative to the rotatable drive housing.

In a further embodiment, the rotatable drive housing and the floating circular rotatable workpiece carrier plate have mutually-acting floating circular rotatable workpiece carrier plate vertical excursion-stop devices wherein the vertical movement distance of the floating circular rotatable workpiece carrier plate relative to the rotatable drive housing is controlled and limited by contact of the rotatable drive housing vertical excursion-stop device with the floating circular rotatable workpiece carrier plate vertical excursion-stop device and the angular tilting arc distance of the workpiece carrier plate relative to the rotatable drive housing is controlled and limited by a rotatable drive housing angular-arc excursion-stop device.

Also, a process is described for abrading or polishing a workpiece wherein the workpiece carrier plate and at least one workpiece that is attached by vacuum to the workpieces carrier plate are moved vertically wherein the at least one workpiece flat bottom surface is held with controlled abrading-pressure in flat-surfaced abrading contact with the rotatable abrading platen flat abrasive coating and both the rotatable abrading platen having the flat abrasive coated abrading surface and the workpiece carrier plate having the attached workpiece are rotated.

Another process is described for abrading or polishing a workpiece surface wherein pressurized air or a fluid is supplied to the sealed flexible-diaphragm pressure chamber wherein the air or a fluid pressure acts on the workpiece carrier plate top surface and wherein the air or a fluid pressure is transmitted through the workpiece carrier plate thickness wherein the air or a fluid pressure is applied to at least one workpiece that is attached to the workpiece carrier plate which forces the at least one workpiece into controlled abrading-pressure flat-surfaced abrading contact with the rotatable abrading platen abrasive surface.

A further process for abrading or polishing a workpiece surface is where vacuum is applied to the sealed flexible-diaphragm pressure chamber to generate a vacuum lifting force on the workpiece carrier plate wherein the vacuum lifting force forces the workpiece carrier plate top surface into rigid contact against a rotatable drive housing vertical excursion-stop device attached to the rotatable drive housing and wherein the workpiece substrate carrier frame and the attached workpiece carrier spindle are moved vertically to position the at least one workpiece that is attached to the workpiece carrier plate flat bottom surface into abrading contact with the rotatable abrading platen abrasive surface, and the at least one workpiece surface is abraded or polished by rotating the rotatable abrading platen and rotating the workpiece carrier plate while the at least one workpiece is in abrading contact with the platen abrasive surface.

An apparatus is described where central portions of the floating circular rotatable workpiece carrier plate are flexible in a vertical direction and wherein the workpiece carrier plate outer periphery annular surface is substantially rigid in a horizontal direction, wherein the flexible central portions of the workpiece carrier plate flat bottom surface can be distorted out-of-plane by the pressure-controlled air, fluid or vacuum present in the sealed flexible-diaphragm pressure chamber.

An apparatus is used where multiple rotatable flexible annular diaphragm devices are positioned concentric with respect to each other to form multiple independent annular or circular rotatable flexible annular diaphragm device's sealed flexible-diaphragm pressure chamber comprising:

a) independent annular or circular sealed flexible pressure chambers that are formed radially outward from the rotational center of the flexible rotatable workpiece carrier plate wherein the respective independent sealed flexible-diaphragm pressure chambers are adjacent to each other;
b) wherein each independent sealed flexible-diaphragm pressure chamber has an independent controlled-pressure air or controlled-pressure fluid or vacuum source supplied by a multi-port vacuum and fluid rotatable rotary union that is attached to the rotatable workpiece carrier spindle to provide independent pressure-controlled air or fluid pressures to respective rotatable flexible annular diaphragm device's sealed flexible-diaphragm pressure chambers;
c) wherein the flexible central portions of the workpiece carrier plate nominally-flat bottom surface can assume non-flat shapes at the location of each independent rotatable flexible annular diaphragm device's sealed flexible-diaphragm pressure chamber;
d) wherein each of the independent rotatable flexible annular diaphragm device's sealed flexible-diaphragm pressure chambers apply independently controlled abrading pressures to the respective portions of the abraded surface of a workpiece that is vacuum-attached to the workpiece carrier plate at the locations of the respective rotatable flexible annular diaphragm device's sealed flexible-diaphragm pressure chambers when the workpiece abraded surface is in abrading contact with the rotatable abrading platen abrading surface.

Further, the vacuum and fluid rotatable rotary union attached to the workpiece carrier spindle is a friction-free air-bearing rotary union. And, where the vacuum supplied to the sealed flexible-diaphragm pressure chamber which generates a lifting force on the workpiece carrier plate that is capable of quickly moving the workpiece carrier plate toward the rotatable drive housing is provided by a vacuum surge tank having a substantial tank volume wherein the at least one workpiece that is attached to the workpiece carrier plate is moved away from abrading contact with the rotatable abrading platen abrading surface.

In addition, the rotatable flexible annular diaphragm device has non-planar annular surface curvatures which increases its flexibility in a radial direction perpendicular to the flexible annular diaphragm device axis of rotation and increases its flexibility in a horizontal direction.

Also, at least one measurement device can be attached to the workpiece substrate carrier frame wherein the at least one measurement device measures the distance between the workpiece substrate carrier frame and the workpiece carrier plate when the at least one workpiece that is attached to the workpiece carrier plate is in flat-surfaced contact with the rotatable abrading platen abrading surface and wherein the at least one measurement device can be used to monitor the amount of material that is removed from the at least one workpiece and the rate of material removal from the at least one workpiece that is attached to the workpiece carrier plate when the at least one workpiece is in abrading contact with the rotating or stationary rotatable abrading platen abrading surface.

Further, where at least one measurement device is attached to the workpiece substrate carrier frame wherein the at least one measurement device measures the distance between the workpiece substrate carrier frame and the workpiece carrier plate when the at least one workpiece that is attached to the workpiece carrier plate is in flat-surfaced contact with the rotatable abrading platen abrading surface wherein the distance measurements between the workpiece substrate carrier frame and the workpiece carrier plate are used to move the workpiece carrier plate workpiece substrate carrier frame vertically wherein the workpiece carrier plate is positioned vertically where the vertical movement distance of the floating circular rotatable workpiece carrier plate relative to the rotatable drive housing that is attached to the workpiece substrate carrier frame is approximately at the midpoint of the controlled and limited vertical movement distance of the floating circular rotatable workpiece carrier plate relative to the rotatable drive housing that is controlled by the vertical excursion-stop devices In addition, the spherical-action bearing has a spherical-center of rotation wherein the spherical-center of rotation is located approximately where the attached workpiece nominally-flat bottom surface is in abrading contact with the abrasive coating on the rotatable abrading platen.

And, the abrasive coating on the rotatable abrading platen can be provided by flexible fixed-abrasive raised-island disks having annular bands of raised-island structures with recessed passageways between individual raised islands wherein the raised-island structures are top-coated with bonded abrasive particles and wherein the flexible fixed-abrasive raised-island disks are attached with vacuum to the flat surface of the rotatable abrading platen.

In another embodiment, a first fluid tube or fluid passageway is located in the carrier drive shaft and is supplied vacuum or pressurized fluid by the vacuum and fluid rotatable rotary union and is connected to a pressure or vacuum sealed slidable fluid joint device wherein a second fluid tube or fluid passageway is connected with the pressure or vacuum sealed slidable fluid joint device and the second fluid tube or fluid passageway is also connected with the vacuum port holes in the workpiece carrier plate to provide vacuum or fluid pressure to the vacuum port holes in the workpiece carrier plate and wherein either the first fluid tube or fluid passageway or the second fluid tube or fluid passageway can be moved within the confines of the pressure or vacuum sealed slidable fluid joint device and wherein the vacuum or pressurized fluid is maintained at the vacuum port holes in the workpiece carrier plate when the floating circular rotatable workpiece carrier plate is moved relative to the rotatable drive housing in a nominally-vertical direction.

In a further embodiment, a first fluid tube or fluid passageway located in the carrier drive shaft that is supplied vacuum or pressurized fluid by the vacuum and fluid rotatable rotary union is connected to a pressure or vacuum sealed slidable fluid joint device wherein a second fluid tube or fluid passageway is connected with the pressure or vacuum sealed slidable fluid joint device and the second fluid tube or fluid passageway is also connected with the sealed flexible-diaphragm pressure chamber and wherein either the first fluid tube or fluid passageway or the second fluid tube or fluid passageway can be moved within the confines of the pressure or vacuum sealed slidable fluid joint device and wherein the vacuum or fluid pressure is maintained at the sealed flexible-diaphragm pressure chamber when the floating circular rotatable workpiece carrier plate is moved relative to the rotatable drive housing in a nominally-vertical direction.

A process is described of providing abrading workpieces using an abrading machine floating workpiece substrate carrier apparatus comprising:
a) providing a workpiece substrate carrier frame moveable in a vertical direction that supports an attached rotatable workpiece carrier spindle having a rotatable carrier drive shaft with a vertical rotatable carrier drive shaft axis of rotation;

b) providing a rotatable drive housing having a rotatable drive housing rotation axis wherein the rotatable drive housing is attached to the rotatable carrier drive shaft and the rotatable drive housing rotation axis is coincident with the rotatable carrier drive shaft axis of rotation;
c) providing a rotatable flexible annular diaphragm device with an annular diaphragm device annular surface, an annular diaphragm device outer periphery portion, an annular diaphragm device inner periphery portion and an axis of rotation that is nominally located at the radial center of the annular diaphragm device annular surface and that is nominally perpendicular to the annular diaphragm device annular surface, wherein the annular diaphragm device outer annular periphery portion is moveable relative to the annular diaphragm device inner annular periphery portion;
d) providing a floating circular rotatable workpiece carrier plate having a workpiece carrier plate top surface, an opposed nominally-horizontal workpiece carrier plate flat bottom surface, a workpiece carrier plate rotation axis that is nominally located at the radial center of the workpiece carrier plate bottom surface and is nominally-perpendicular to the workpiece carrier plate flat bottom surface wherein the floating circular rotatable workpiece carrier plate is movable relative to the rotatable drive housing in a nominally-vertical direction along the floating circular workpiece carrier plate rotation axis and can be tilted relative to the rotatable drive housing;
e) attaching the rotatable flexible annular diaphragm device inner annular periphery portion to the rotatable drive housing and attaching the rotatable flexible annular diaphragm device outer annular periphery portion to the workpiece carrier plate and the rotatable flexible annular diaphragm device axis of rotation is nominally-coincident with the vertical rotatable carrier drive shaft axis of rotation and the rotatable flexible annular diaphragm device together with the rotatable drive housing and the workpiece carrier plate forms a sealed enclosed rotatable flexible annular diaphragm device abrading pressure chamber having an internal volume contained by the rotatable flexible annular diaphragm, the rotatable drive housing and the workpiece carrier plate;
f) providing a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and is configured to cause the workpiece carrier plate to be rotated by the rotatable drive housing;
g) providing a vertical support shaft that is supported by at least one shaft bearing that is attached to the rotatable drive housing wherein the at least one shaft bearing allows the vertical support shaft to move vertically relative to the rotatable drive housing and the at least one shaft bearing restrains the vertical support shaft in a radial direction that is perpendicular to the rotatable drive housing rotation axis;
h) providing a spherical-action bearing having a spherical-action bearing inner race and a spherical-action bearing outer race wherein the inner race of the spherical-action bearing is attached to the vertical support shaft and the outer race of the spherical-action bearing is attached to the workpiece carrier plate wherein the spherical-action bearing allows the workpiece carrier plate to be tilted relative to the rotatable drive housing and wherein the spherical-action bearing restrains the workpiece carrier plate in radial direction that is nominally-perpendicular to the workpiece carrier plate rotation axis and wherein the spherical-action bearing maintains the floating circular workpiece carrier plate rotation axis as nominally concentric with the carrier drive shaft axis of rotation;
i) providing a vacuum and fluid rotatable rotary union device that is attached to the rotatable workpiece carrier spindle wherein the vacuum and fluid rotatable rotary union device supplies vacuum or pressurized fluid through fluid passageways to vacuum port holes in the workpiece carrier plate that are open on the workpiece carrier plate flat bottom surface and wherein the vacuum and fluid rotatable rotary union supplies vacuum or pressurized fluid through fluid passageways to the sealed flexible-diaphragm pressure chamber;
j) providing that the floating circular rotatable workpiece carrier plate is movable relative to the workpiece substrate carrier frame in a nominally-vertical direction along the floating circular workpiece carrier plate rotation axis and can be tilted relative to the workpiece substrate carrier frame;
k) providing a flat-surfaced rotatable abrading platen where the flat surface of the rotatable abrading platen is nominally horizontal and has an abrasive coating;
l) providing at least one workpiece having opposed workpiece nominally-flat top and bottom surfaces and using vacuum to attach the workpiece nominally-flat top surface to the workpiece carrier plate flat bottom surface;
m) moving the workpiece substrate carrier frame and the attached workpiece carrier spindle vertically to position the flat workpiece bottom surface of at least one workpiece that is attached to the workpiece carrier plate flat bottom surface close to flat-surfaced abrading contact with the rotatable abrading platen abrading surface after which the movable workpiece substrate carrier frame and the workpiece carrier spindle are held stationary at that position and wherein the workpiece carrier plate is moved in a vertical direction relative to the stationary workpiece substrate carrier frame by adjusting the pressure in the sealed flexible-diaphragm pressure chamber wherein the at least one workpiece bottom surface is positioned in flat-surfaced abrading contact with the rotatable abrading platen abrading surface;
n) and rotating both the workpiece carrier plate having the attached at least one workpiece and the abrasive-coated flat-surfaced rotatable abrading platen wherein the sealed flexible-diaphragm pressure chamber provides controlled abrading pressure to the at least one workpiece to abrade the at least one workpiece.

In performing the present technology, sensing and measuring of distances, and controlled movement of platens, supports and workpieces, processing controls and analytical systems and components using processors, microprocessors, field programmable fated arrays, ASICs and other intelligent devices may be used. The sensors and measuring components provide electronic signals to the processor which then executes software display instructions or information on a visual display screen or actual provide commands to the apparatus with respect to relative movement between surface, adjust speeds or rotation, pressure and vacuum control, and other operational parameters in the performance of the abrading/polishing processes and apparatus described herein.

Although specific equipment, materials, speeds and pressures are described herein, variations may be practiced by those skilled in the art.

What is claimed:

1. A rotating platen abrasive lapping and polishing apparatus having a floating workpiece substrate carrier apparatus comprising:
   a) a workpiece substrate carrier frame moveable in a vertical direction supporting an attached rotatable workpiece carrier spindle having a rotatable carrier drive shaft with a vertical rotatable carrier drive shaft axis of rotation;
   b) a rotatable drive housing having a rotatable drive housing rotation axis wherein the rotatable drive housing is attached to the rotatable carrier drive shaft and the rotatable drive housing rotation axis is coincident with the rotatable carrier drive shaft axis of rotation;
   c) a rotatable flexible annular diaphragm device with an annular diaphragm device annular surface, an annular diaphragm device outer periphery portion, an annular diaphragm device inner periphery portion and an axis of rotation that is nominally located at the radial center of the annular diaphragm device annular surface and that is nominally perpendicular to the annular diaphragm device annular surface, wherein the annular diaphragm device outer annular periphery portion is moveable relative to the annular diaphragm device inner annular periphery portion;
   d) a floating circular rotatable workpiece carrier plate having a workpiece carrier plate top surface, an opposed nominally-horizontal workpiece carrier plate flat bottom surface, a workpiece carrier plate rotation axis nominally located at the radial center of the workpiece carrier plate bottom surface and is nominally-perpendicular to the workpiece carrier plate flat bottom surface wherein the floating circular rotatable workpiece carrier plate is movable relative to the rotatable drive housing in a nominally-vertical direction along the floating circular workpiece carrier plate rotation axis and can be tilted relative to the rotatable drive housing;
   e) wherein the rotatable flexible annular diaphragm device inner annular periphery portion is attached to the rotatable drive housing and the rotatable flexible annular diaphragm device outer annular periphery portion is attached to the workpiece carrier plate and the rotatable flexible annular diaphragm device axis of rotation is nominally-coincident with the vertical rotatable carrier drive shaft axis of rotation and the rotatable flexible annular diaphragm device together with the rotatable drive housing and the workpiece carrier plate forms a sealed enclosed rotatable flexible annular diaphragm device abrading pressure chamber having an internal volume contained on one side of the internal volume by the rotatable flexible annular diaphragm, the rotatable drive housing and the workpiece carrier plate;
   f) a rotary workpiece drive device connected with both the rotatable drive housing and the workpiece carrier plate wherein the rotary workpiece drive device allows movement of the workpiece carrier plate relative to the rotatable drive housing and the rotary workpiece drive device transmits torque, measured about the rotatable drive housing rotation axis, from the rotatable drive housing to the workpiece carrier plate and is configured to cause the workpiece carrier plate to be rotated by the rotatable drive housing;
   g) a vertical support shaft supported by at least one shaft bearing is attached to the rotatable drive housing wherein the at least one shaft bearing allows the vertical support shaft to move vertically relative to the rotatable drive housing and the at least one shaft bearing restrains the vertical support shaft in a radial direction perpendicular to the rotatable drive housing rotation axis;
   h) a spherical-action bearing having a spherical-action bearing inner race and a spherical-action bearing outer race, wherein the inner race of the spherical-action bearing is attached to the vertical support shaft and the outer race of the spherical-action bearing is attached to the workpiece carrier plate, wherein the spherical-action bearing allows the workpiece carrier plate to be tilted relative to the rotatable drive housing and wherein the spherical-action bearing restrains the workpiece carrier plate in a radial direction that is nominally-perpendicular to the workpiece carrier plate rotation axis and wherein the spherical-action bearing maintains the floating circular workpiece carrier plate rotation axis as nominally concentric with the carrier drive shaft axis of rotation;
   i) a vacuum and fluid rotatable rotary union device that is attached to the rotatable workpiece carrier spindle wherein the vacuum and fluid rotatable rotary union device supplies vacuum or pressurized fluid through fluid passageways to vacuum port holes in the workpiece carrier plate that are open on the workpiece carrier plate flat bottom surface and wherein the vacuum and fluid rotatable rotary union supplies vacuum or pressurized fluid through fluid passageways to the sealed flexible-diaphragm pressure chamber;
   j) wherein the floating circular rotatable workpiece carrier plate is movable relative to the workpiece substrate carrier frame in a nominally-vertical direction along the floating circular workpiece carrier plate rotation axis and can be tilted relative to the workpiece substrate carrier frame;
   k) a flat-surfaced rotatable abrading platen having the flat surface of the rotatable abrading platen is nominally horizontal and has an abrasive coating;
   l) wherein at least one workpiece having opposed workpiece nominally-flat top and bottom surfaces has the workpiece nominally-flat top surface vacuum-attached to the workpiece carrier plate flat bottom surface and wherein the nominally-flat bottom surface of the at least one attached workpiece can be held in flat-surfaced abrading contact with the abrasive coating on the rotatable abrading platen.

2. The apparatus of claim 1 wherein the rotary workpiece drive device comprises a rotatable drive housing bracket attached to the rotatable drive housing, and a workpiece carrier plate bracket attached to the workpiece carrier plate, wherein the rotatable drive housing bracket and the workpiece carrier plate bracket are in vertical and horizontal sliding contact with each other at a bracket sliding joint and wherein the rotary drive housing bracket can be rotated by the rotatable drive housing to transmit torque, measured about the rotatable drive housing rotation axis, through the bracket sliding joint to the workpiece carrier plate bracket to provide rotation of the workpiece carrier plate about the workpiece carrier plate rotation axis, and wherein the workpiece carrier plate is movable vertically in a direction along the workpiece carrier plate rotation axis and wherein the workpiece carrier plate is tiltable relative to the rotatable drive housing.

3. The apparatus of claim 1 wherein the rotary workpiece drive device comprises:
   a) at least one nominally-horizontal rotatable nominally-circular flexible support element having at least one individual flexible arm wherein the at least one flexible arm has a first proximal end secured to a central support ring, and a second distal end connected to a respective first proximal end by a flexing joint;

b) wherein the second distal end is flexible in a vertical direction but is stiff in a direction that is tangential to the nominally-circular flexible support element and wherein the flexible support element has a nominally-vertical rotatable flexible support element rotation axis located at a center of the nominally-circular flexible support element;

c) the at least one rotatable nominally-circular flexible support element central support ring is attached to the rotatable drive housing and the at least one flexible support element second distal end is attached to the floating circular rotatable workpiece carrier plate and the at least one rotatable flexible support element rotation axis is coincident with the rotatable drive housing rotation axis; and d) the at least one rotatable nominally-circular flexible support element is rotatable by the rotatable drive housing to provide rotation of the workpiece carrier plate, and the workpiece carrier plate is movable vertically in a direction along the workpiece carrier plate rotation axis by flexing the at least one individual flexible radial arm in a vertical direction.

4. The apparatus of claim 1 wherein the rotatable flexible annular diaphragm device comprises flexible materials selected from the group consisting of: elastomers, silicone rubber, room temperature vulcanizing silicone rubber, natural rubber, synthetic rubber, thermoset polyurethane, thermoplastic polyurethane, flexible polymers, composite materials, polymer-impregnated woven cloths, sealed fiber materials, laminated sheets of combinations thereof, sheets of impervious flexible materials, and metals.

5. The apparatus of claim 1 wherein pressure-controlled air, fluid or vacuum is accessible into the sealed flexible-diaphragm pressure chamber through a passageway connecting an air, fluid or vacuum passageway in the rotatable carrier drive shaft to the sealed flexible-diaphragm pressure chamber and wherein the pressure or vacuum present in the sealed flexible-diaphragm pressure chamber is sufficient to move the workpiece carrier plate vertically and wherein controlled pressure present in the sealed flexible-diaphragm pressure chamber applies a controlled abrading pressure to workpieces that are attached to the workpiece carrier plate that is in abrading contact with the rotatable abrading platen abrasive coated abrading surface.

6. The apparatus of claim 1 wherein the workpiece carrier plate top surface is configured so that controlled vacuum applied to the sealed flexible-diaphragm pressure chamber generates a lifting force on the workpiece carrier plate capable of moving the workpiece carrier plate toward the rotatable drive housing thereby distorting the rotatable flexible annular diaphragm device in a direction along the flexible annular diaphragm device axis of rotation wherein the workpiece carrier plate and the at least one workpiece that is attached with vacuum to the workpiece carrier plate are moved vertically away from the rotatable abrading platen abrasive coated abrading surface.

7. The apparatus of claim 2 wherein the rotatable drive housing bracket and the workpiece carrier plate bracket act together in mutual sliding contact to rotate the workpiece carrier plate in either clockwise or counterclockwise directions and to rotationally accelerate or decelerate the workpiece carrier and wherein the rotatable drive housing bracket and the workpiece carrier plate bracket act together to prevent substantial rotation of the workpiece carrier plate relative to the rotatable drive housing.

8. The apparatus of claim 1 wherein the rotatable drive housing and the floating circular rotatable workpiece carrier plate have mutually-acting floating circular rotatable workpiece carrier plate vertical excursion-stop devices wherein the vertical movement distance of the floating circular rotatable workpiece carrier plate relative to the rotatable drive housing is controlled and limited by contact of the rotatable drive housing vertical excursion-stop device with the floating circular rotatable workpiece carrier plate vertical excursion-stop device and the angular tilting arc distance of the workpiece carrier plate relative to the rotatable drive housing is controlled and limited by a rotatable drive housing angular-arc excursion-stop device.

9. A process for using the apparatus of claim 1 to abrade or polish a workpiece wherein the workpiece carrier plate and at least one workpiece that is attached by vacuum to the workpieces carrier plate are moved vertically wherein the at least one workpiece flat bottom surface is held with controlled abrading-pressure in flat-surfaced abrading contact with the rotatable abrading platen flat abrasive coating and both the rotatable abrading platen having the flat abrasive coated abrading surface and the workpiece carrier plate having the attached workpiece are rotated.

10. A process for the apparatus of claim 5 to abrade or polish a workpiece surface wherein pressurized air or a fluid is supplied to the sealed flexible-diaphragm pressure chamber wherein the air or a fluid pressure acts on the workpiece carrier plate top surface and wherein the air or a fluid pressure is transmitted through the workpiece carrier plate thickness wherein the air or a fluid pressure is applied to at least one workpiece that is attached to the workpiece carrier plate which forces the at least one workpiece into controlled abrading-pressure flat-surfaced abrading contact with the rotatable abrading platen abrasive surface.

11. A process for using the apparatus of claim 5 to abrade or polish a workpiece surface wherein vacuum is applied to the sealed flexible-diaphragm pressure chamber to generate a vacuum lifting force on the workpiece carrier plate wherein the vacuum lifting force forces the workpiece carrier plate top surface into rigid contact against a rotatable drive housing vertical excursion-stop device attached to the rotatable drive housing and wherein the workpiece substrate carrier frame and the attached workpiece carrier spindle are moved vertically to position the at least one workpiece that is attached to the workpiece carrier plate flat bottom surface into abrading contact with the rotatable abrading platen abrasive surface, and the at least one workpiece surface is abraded or polished by rotating the rotatable abrading platen and rotating the workpiece carrier plate while the at least one workpiece is in abrading contact with the platen abrasive surface.

12. The apparatus of claim 5 wherein central portions of the floating circular rotatable workpiece carrier plate are flexible in a vertical direction and wherein the workpiece carrier plate outer periphery annular surface is substantially rigid in a horizontal direction, wherein the flexible central portions of the workpiece carrier plate flat bottom surface can be distorted out-of-plane by the pressure-controlled air, fluid or vacuum present in the sealed flexible-diaphragm pressure chamber.

13. The apparatus of claim 12 wherein multiple rotatable flexible annular diaphragm devices are positioned concentric with respect to each other to form multiple independent annular or circular rotatable flexible annular diaphragm devices with sealed flexible-diaphragm pressure chambers comprising:

a) independent annular or circular sealed flexible pressure chambers formed radially outward from the rotational center of the flexible rotatable workpiece carrier plate wherein respective independent sealed flexible-diaphragm pressure chambers are adjacent to each other;
b) independent sealed flexible-diaphragm pressure chambers have an independent controlled-pressure air or controlled-pressure fluid or vacuum source supplied by a multi-port vacuum and fluid rotatable rotary union attached to the rotatable workpiece carrier spindle to provide independent pressure-controlled air or fluid pressures to respective rotatable flexible annular diaphragm device's sealed flexible-diaphragm pressure chambers;
c) the flexible central portions of the workpiece carrier plate nominally-flat bottom surface can assume non-flat shapes at the location of each independent rotatable flexible annular diaphragm device's sealed flexible-diaphragm pressure chamber;
d) each of the independent rotatable flexible annular diaphragm device's sealed flexible-diaphragm pressure chambers apply independently controlled abrading pressures to respective portions of an abraded surface of a workpiece vacuum-attached to the workpiece carrier plate at the locations of the respective rotatable flexible annular diaphragm device's sealed flexible-diaphragm pressure chambers when the workpiece abraded surface is in abrading contact with the rotatable abrading platen abrading surface.

14. The apparatus of claim 1 wherein the vacuum and fluid rotatable rotary union attached to the workpiece carrier spindle is a friction-free air-bearing rotary union.

15. The apparatus of claim 6 wherein vacuum supplied to the sealed flexible-diaphragm pressure chamber which generates a lifting force on the workpiece carrier plate that is configured to move the workpiece carrier plate toward the rotatable drive housing is provided by a vacuum surge tank having a substantial tank volume, wherein the at least one workpiece attached to the workpiece carrier plate is moved away from abrading contact with the rotatable abrading platen abrading surface.

16. The apparatus of claim 1 wherein the rotatable flexible annular diaphragm device has non-planar annular surface curvatures which is configured to increase its flexibility in a radial direction perpendicular to the flexible annular diaphragm device axis of rotation and increases its flexibility in a horizontal direction.

17. The apparatus of claim 1 wherein at least one measurement device is attached to the workpiece substrate carrier frame to measure the distance between the workpiece substrate carrier frame and the workpiece carrier plate when the at least one workpiece that is attached to the workpiece carrier plate is in flat-surfaced contact with the rotatable abrading platen abrading surface and wherein the at least one measurement device enables monitoring i) an amount of material removed from the at least one workpiece and ii) a rate of material removal from the at least one workpiece that is attached to the workpiece carrier plate when the at least one workpiece is in abrading contact with the rotating or stationary rotatable abrading platen abrading surface.

18. The apparatus of claim 8 wherein at least one measurement device is attached to the workpiece substrate carrier frame and is configured to measure a distance between the workpiece substrate carrier frame and the workpiece carrier plate when the at least one workpiece that is attached to the workpiece carrier plate is in flat-surfaced contact with the rotatable abrading platen abrading surface wherein the distance measurements between the workpiece substrate carrier frame and the workpiece carrier plate are used to move the workpiece carrier plate workpiece substrate carrier frame vertically wherein the workpiece carrier plate is positioned vertically and a vertical movement distance of the floating circular rotatable workpiece carrier plate relative to the rotatable drive housing that is attached to the workpiece substrate carrier frame is approximately at the midpoint of a controlled and limited vertical movement distance of the floating circular rotatable workpiece carrier plate relative to the rotatable drive housing controlled by the vertical excursion-stop devices.

19. The apparatus of claim 1 wherein the spherical-action bearing has a spherical-center of rotation located approximately where the attached workpiece nominally-flat bottom surface is in abrading contact with the abrasive coating on the rotatable abrading platen.

20. The apparatus of claim 1 wherein the abrasive coating on the rotatable abrading platen is provided by flexible fixed-abrasive raised-island disks having annular bands of raised-island structures with recessed passageways between individual raised islands wherein the raised-island structures are top-coated with bonded abrasive particles and wherein the flexible fixed-abrasive raised-island disks are attached with vacuum to the flat surface of the rotatable abrading platen.

21. The apparatus of claim 1 wherein a first fluid tube or fluid passageway located in the carrier drive shaft that is supplied vacuum or pressurized fluid by the vacuum and fluid rotatable rotary union is connected to a pressure or vacuum sealed slidable fluid joint device wherein a second fluid tube or fluid passageway is connected with the pressure or vacuum sealed slidable fluid joint device and the second fluid tube or fluid passageway is also connected with the vacuum port holes in the workpiece carrier plate to provide vacuum or fluid pressure to the vacuum port holes in the workpiece carrier plate and wherein either the first fluid tube or fluid passageway or the second fluid tube or fluid passageway is moveable within confines of the pressure or vacuum sealed slidable fluid joint device and wherein the vacuum or pressurized fluid is maintained at the vacuum port holes in the workpiece carrier plate when the floating circular rotatable workpiece carrier plate is moved relative to the rotatable drive housing in a nominally-vertical direction.

22. The apparatus of claim 1 wherein a first fluid tube or fluid passageway located in the carrier drive shaft that is supplied vacuum or pressurized fluid by the vacuum and fluid rotatable rotary union is connected to a pressure or vacuum sealed slidable fluid joint device wherein a second fluid tube or fluid passageway is connected with the pressure or vacuum sealed slidable fluid joint device and the second fluid tube or fluid passageway is also connected with the sealed flexible-diaphragm pressure chamber and wherein either the first fluid tube or fluid passageway or the second fluid tube or fluid passageway is moveable within the confines of the pressure or vacuum sealed slidable fluid joint device and wherein the vacuum or fluid pressure is maintained at the sealed flexible-diaphragm pressure chamber when the floating circular rotatable workpiece carrier plate is moved relative to the rotatable drive housing in a nominally-vertical direction.

23. A process of providing abrading workpieces using an abrading machine floating workpiece substrate carrier apparatus comprising:
a) providing a workpiece substrate carrier frame moveable in a vertical direction that supports an attached rotatable workpiece carrier spindle having a rotatable carrier drive shaft with a vertical rotatable carrier drive shaft axis of rotation;
b) providing a rotatable drive housing having a rotatable drive housing rotation axis wherein the rotatable drive housing is attached to the rotatable carrier drive shaft and the rotatable drive housing rotation axis is coincident with the rotatable carrier drive shaft axis of rotation;

c) providing a rotatable flexible annular diaphragm device with an annular diaphragm device annular surface, an annular diaphragm device outer periphery portion, an annular diaphragm device inner periphery portion and an axis of rotation that is nominally located at a radial center of the annular diaphragm device annular surface and that is nominally perpendicular to the annular diaphragm device annular surface, wherein the annular diaphragm device outer annular periphery portion is moveable relative to the annular diaphragm device inner annular periphery portion;

d) providing a floating circular rotatable workpiece carrier plate having a workpiece carrier plate top surface, an opposed nominally-horizontal workpiece carrier plate flat bottom surface, a workpiece carrier plate rotation axis nominally located at the radial center of the workpiece carrier plate bottom surface and is nominally-perpendicular to the workpiece carrier plate flat bottom surface wherein the floating circular rotatable workpiece carrier plate is movable relative to the rotatable drive housing in a nominally-vertical direction along the floating circular workpiece carrier plate rotation axis and can be tilted relative to the rotatable drive housing;

e) attaching the rotatable flexible annular diaphragm device inner annular periphery portion to the rotatable drive housing and attaching the rotatable flexible annular diaphragm device outer annular periphery portion to the workpiece carrier plate and the rotatable flexible annular diaphragm device axis of rotation is nominally-coincident with the vertical rotatable carrier drive shaft axis of rotation and the rotatable flexible annular diaphragm device together with the rotatable drive housing and the workpiece carrier plate forms a sealed enclosed rotatable flexible annular diaphragm device abrading pressure chamber having an internal volume contained by the rotatable flexible annular diaphragm, the rotatable drive housing and the workpiece carrier plate;

f) providing a rotary workpiece drive device that is connected with both the rotatable drive housing and the workpiece carrier plate wherein the rotary workpiece drive device allows movement of the workpiece carrier plate relative to the rotatable drive housing and wherein the rotary workpiece drive device transmits torque, measured about the rotatable drive housing rotation axis, from the rotatable drive housing to the workpiece carrier plate and is configured to cause the workpiece carrier plate to be rotated by the rotatable drive housing;

g) providing a vertical support shaft supported by at least one shaft bearing that is attached to the rotatable drive housing wherein the at least one shaft bearing allows the vertical support shaft to move vertically relative to the rotatable drive housing and the at least one shaft bearing restrains the vertical support shaft in a radial direction that is perpendicular to the rotatable drive housing rotation axis;

h) providing a spherical-action bearing having a spherical-action bearing inner race and a spherical-action bearing outer race wherein the inner race of the spherical-action bearing is attached to the vertical support shaft and the outer race of the spherical-action bearing is attached to the workpiece carrier plate wherein the spherical-action bearing allows the workpiece carrier plate to be tilted relative to the rotatable drive housing and wherein the spherical-action bearing restrains the workpiece carrier plate in radial direction that is nominally-perpendicular to the workpiece carrier plate rotation axis and wherein the spherical-action bearing maintains the floating circular workpiece carrier plate rotation axis as nominally concentric with the carrier drive shaft axis of rotation;

i) providing a vacuum and fluid rotatable rotary union device that is attached to the rotatable workpiece carrier spindle wherein the vacuum and fluid rotatable rotary union device applies vacuum or pressurized fluid through fluid passageways to vacuum port holes in the workpiece carrier plate that are open on the workpiece carrier plate flat bottom surface and wherein the vacuum and fluid rotatable rotary union applies vacuum or pressurized fluid through fluid passageways to the sealed flexible-diaphragm pressure chamber;

j) the floating circular rotatable workpiece carrier plate is movable relative to the workpiece substrate carrier frame in a nominally-vertical direction along the floating circular workpiece carrier plate rotation axis and can be tilted relative to the workpiece substrate carrier frame;

k) providing a flat-surfaced rotatable abrading platen where the flat surface of the rotatable abrading platen is nominally horizontal and has an abrasive coating;

l) providing at least one workpiece having opposed workpiece nominally-flat top and bottom surfaces and using vacuum to attach the workpiece nominally-flat top surface to the workpiece carrier plate flat bottom surface;

m) moving the workpiece substrate carrier frame and the attached workpiece carrier spindle vertically to position the flat workpiece bottom surface of at least one workpiece attached to the workpiece carrier plate flat bottom surface close to flat-surfaced abrading contact with the rotatable abrading platen abrading surface after which the movable workpiece substrate carrier frame and the workpiece carrier spindle are held stationary at that position and wherein the workpiece carrier plate is moved in a vertical direction relative to the stationary workpiece substrate carrier frame by adjusting the pressure in the sealed flexible-diaphragm pressure chamber wherein the at least one workpiece bottom surface is positioned in flat-surfaced abrading contact with the rotatable abrading platen abrading surface; and n) rotating both the workpiece carrier plate having the attached at least one workpiece and the abrasive-coated flat-surfaced rotatable abrading platen, wherein the sealed flexible-diaphragm pressure chamber provides controlled abrading pressure to the at least one workpiece to abrade the at least one workpiece.

* * * * *